(12) United States Patent
Yamaguchi et al.

(10) Patent No.: US 12,325,716 B2
(45) Date of Patent: Jun. 10, 2025

(54) ORGANOMETALLIC COMPLEX, LIGHT-EMITTING MATERIAL FOR TOP EMISSION, LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Tomoya Yamaguchi, Kanagawa (JP); Hideko Yoshizumi, Kanagawa (JP); Yuta Kawano, Kanagawa (JP); Takeyoshi Watabe, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 846 days.

(21) Appl. No.: 17/137,941

(22) Filed: Dec. 30, 2020

(65) Prior Publication Data
US 2021/0214381 A1    Jul. 15, 2021

(30) Foreign Application Priority Data

Jan. 10, 2020   (JP) .................................. 2020-003063
Jan. 31, 2020   (JP) .................................. 2020-014352
Apr. 27, 2020   (JP) .................................. 2020-078045

(51) Int. Cl.
*C07F 15/00* (2006.01)
*H01L 51/00* (2006.01)
(Continued)

(52) U.S. Cl.
CPC ...... *C07F 15/0033* (2013.01); *C07F 15/0006* (2013.01); *H10K 85/342* (2023.02);
(Continued)

(58) Field of Classification Search
None
See application file for complete search history.

(56) References Cited

U.S. PATENT DOCUMENTS 8,101,755 B2   1/2012   Inoue et al.
8,329,903 B2   12/2012  Inoue et al.
(Continued)

FOREIGN PATENT DOCUMENTS

CN   104974166 A   10/2015
CN   106957338 A   7/2017
(Continued)

OTHER PUBLICATIONS

Machine English translation of Yamaguchi et al. (JP 2017-114853 A). Oct. 24, 2023.*

(Continued)

*Primary Examiner* — Jay Yang
(74) *Attorney, Agent, or Firm* — Fish & Richardson P.C.

(57) ABSTRACT

Providing a novel organometallic complex represented by Structure Formula (G1). $A^1$ to $A^4$ independently represent an alkyl group having 1 to 6 carbon atoms or a cycloalkyl group having 3 to 6 carbon atoms. $R^1$ to $R^5$ independently represent any one of hydrogen, an alkyl group having 1 to 6 carbon atoms, a cycloalkyl group having 3 to 6 carbon atoms, and a cyano group, wherein at least one of $R^1$ to $R^5$ represents a cyano group. $R^{11}$ to $R^{14}$ independently represent an alkyl group having 2 to 6 carbon atoms or a cycloalkyl group having 3 to 6 carbon atoms. $R^{15}$ and $R^{16}$ independently represent any one of hydrogen, a methyl group, and an ethyl group. Note that $R^{11}$ and $R^{12}$ may be bonded to each other to form a ring, and $R^{13}$ and $R^{14}$ may be bonded to each other to form a ring.

(Continued)

(56) References Cited

U.S. PATENT DOCUMENTS

| | | | |
|---|---|---|---|
| 9,127,032 | B2 | 9/2015 | Inoue et al. |
| 9,929,353 | B2 | 3/2018 | Kottas et al. |
| 9,960,371 | B2 | 5/2018 | Yamaguchi. et al. |
| 10,103,341 | B2 | 10/2018 | Inoue et al. |
| 10,199,581 | B2 | 2/2019 | Boudreault et al. |
| 10,283,722 | B2 | 5/2019 | Yamaguchi. et al. |
| 10,693,085 | B2 | 6/2020 | Inoue et al. |
| 2014/0246656 | A1 | 9/2014 | Inoue et al. |
| 2015/0287933 | A1 | 10/2015 | Kottas et al. |
| 2017/0092881 | A1 | 3/2017 | Yamaguchi et al. |
| 2017/0179409 | A1 | 6/2017 | Yamaguchi et al. |
| 2018/0287070 | A1 | 10/2018 | Ji et al. |

FOREIGN PATENT DOCUMENTS

| | | |
|---|---|---|
| EP | 2927234 A | 10/2015 |
| JP | 2007-284432 A | 11/2007 |
| JP | 2010-120931 A | 6/2010 |
| JP | 2013-147496 A | 8/2013 |
| JP | 2015-010093 A | 1/2015 |
| JP | 2017-066135 A | 4/2017 |
| JP | 2017-114853 A | 6/2017 |
| JP | 6584073 | 10/2019 |
| KR | 2015-0114905 A | 10/2015 |
| WO | WO-2017/055964 | 4/2017 |

OTHER PUBLICATIONS

Taiwanese Office Action (Application No. 109145872) Dated Aug. 6, 2024.

\* cited by examiner

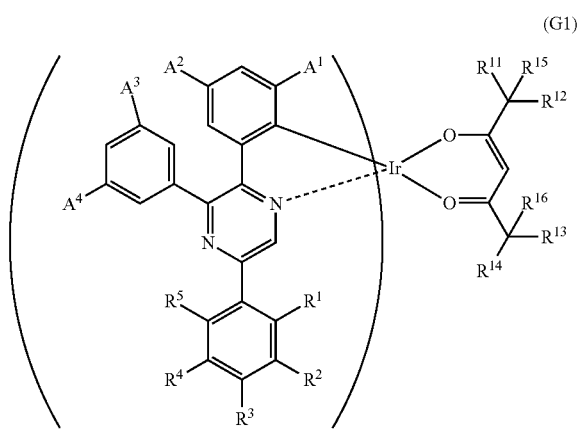

(G1)

16 Claims, 50 Drawing Sheets

(51) Int. Cl.
  *H10K 85/30* (2023.01)
  *H10K 50/15* (2023.01)
  *H10K 50/16* (2023.01)
  *H10K 50/17* (2023.01)
(52) U.S. Cl.
  CPC ............ *H10K 50/15* (2023.02); *H10K 50/16* (2023.02); *H10K 50/171* (2023.02)

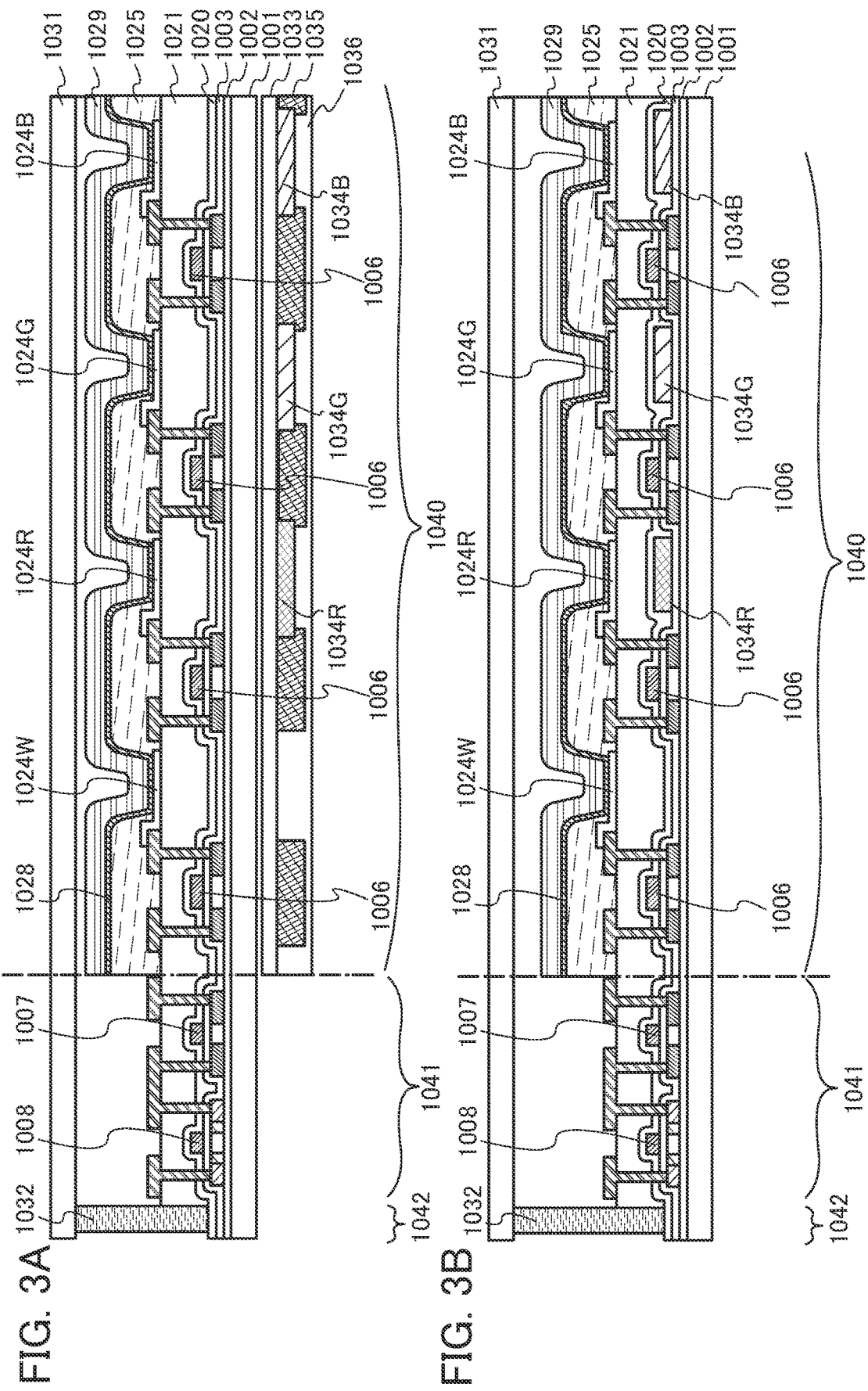

FIG. 7A
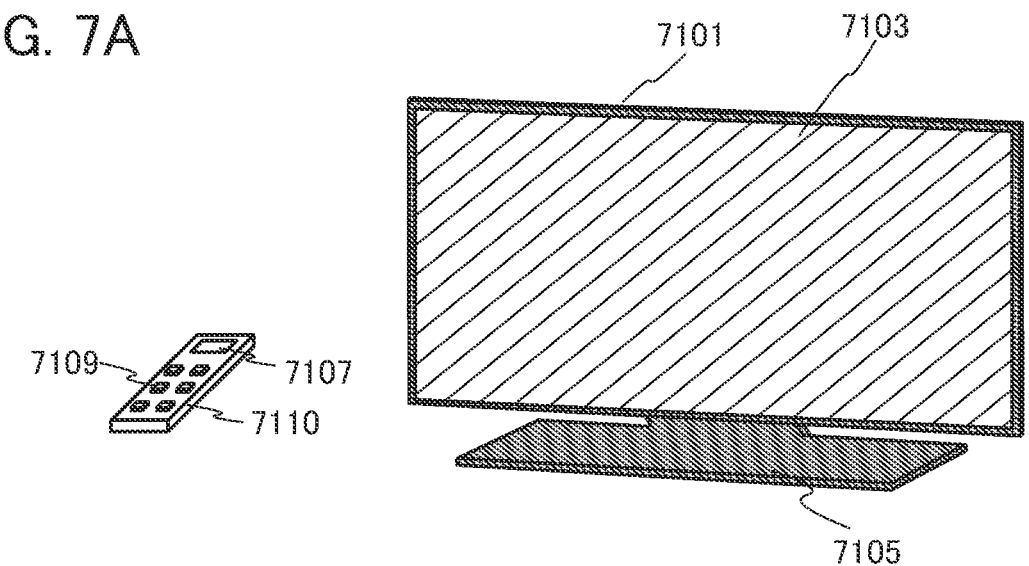
FIG. 7B1
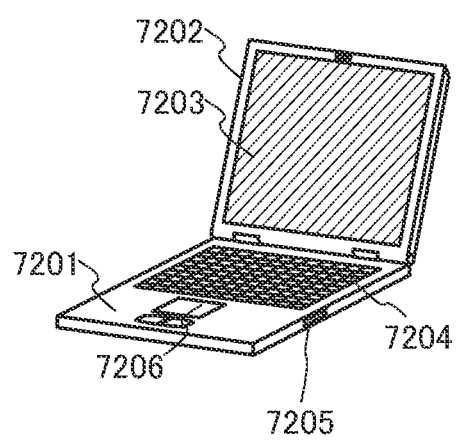
FIG. 7B2
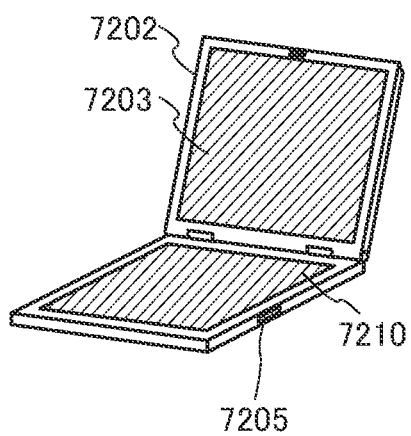
FIG. 7C
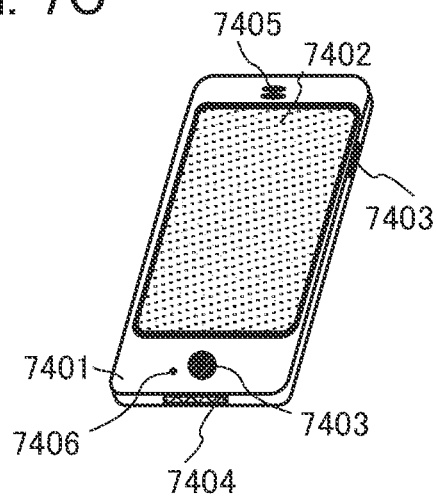

Distribution of photon intensity (ref.)

Angular dependence of chromaticity (Δu'v')

ORGANOMETALLIC COMPLEX, LIGHT-EMITTING MATERIAL FOR TOP EMISSION, LIGHT-EMITTING DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to an organic compound, a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting devices (organic EL devices) utilizing electroluminescence (EL) of organic compounds have been put to more practical use. In the basic structure of such light-emitting devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal displays, such as high visibility and no need for backlight when used as pixels of a display, and are suitable as flat panel display devices. Displays including such light-emitting devices are also highly advantageous in that they can be thin and lightweight. Moreover, such light-emitting devices also have a feature of extremely fast response speed.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting devices and the like.

Displays or lighting devices including light-emitting devices are suitable for a variety of electronic devices as described above (see Patent Document 1). However, research on and development of light-emitting devices having more favorable characteristics is required.

REFERENCES

Patent Documents

[Patent Document 1] Japanese Published Patent Application No. 2017-114853
[Patent Document 2] Japanese Published Patent Application No. 2013-147496
[Patent Document 3] Japanese Published Patent Application No. 2007-284432
[Patent Document 4] Japanese Published Patent Application No. 2015-010093

SUMMARY OF THE INVENTION

An object of one embodiment of the present invention is to provide a novel organometallic complex. Alternatively, an object of one embodiment of the present invention is to provide a novel organometallic complex that shows excellent red light emission. Alternatively, an object of one embodiment of the present invention is to provide an organometallic complex capable of providing a light-emitting device having a long lifetime. Alternatively, an object of one embodiment of the present invention is to provide an organometallic complex capable of providing a light-emitting device having a long lifetime especially at high temperatures. Alternatively, an object of one embodiment of the present invention is to provide an organometallic complex capable of providing a light-emitting device having high emission efficiency. Alternatively, an object of one embodiment of the present invention is to provide an organometallic complex having an emission spectrum with a narrow half width. Alternatively, an object of one embodiment of the present invention is to provide an organometallic complex that is favorably used in a top-emission light-emitting apparatus. Alternatively, an object of one embodiment of the present invention is to provide an organometallic complex that has excellent color purity, emits red light at high quantum efficiency, and provides a light-emitting device having a long lifetime, high current efficiency, and high power efficiency when used as a light-emitting material.

Alternatively, an object of one embodiment of the present invention is to provide a light-emitting device having a long lifetime. Alternatively, an object of one embodiment of the present invention is to provide a light-emitting device having high emission efficiency. Alternatively, an object of one embodiment of the present invention is to provide a light-emitting device emitting red light having high color purity. Alternatively, an object of one embodiment of the present invention is to provide a light-emitting device that is favorably used in a top-emission light-emitting apparatus.

Alternatively, an object of one embodiment of the present invention is to provide a light-emitting apparatus, an electronic device, and a display device each having a long lifetime. Alternatively, an object of one embodiment of the present invention is to provide a light-emitting apparatus, an electronic device, and a display device each having small power consumption. Alternatively, an object of one embodiment of the present invention is to provide a light-emitting apparatus, an electronic device, and a display device each having high display quality.

Note that the descriptions of these objects do not preclude the existence of other objects. One embodiment of the present invention does not necessarily achieve all these objects. Other objects will be apparent from and can be derived from the descriptions of the specification, the drawings, the claims, and the like.

It is only necessary that at least one of the above-described objects be achieved in one embodiment of the present invention.

One embodiment of the present invention is an organometallic complex represented by General Formula (G1) shown below.

[Chemical Formula 1]

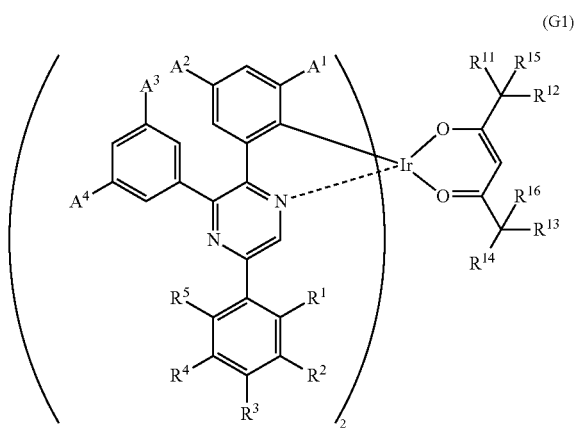

(G1)

In the organometallic complex represented by General Formula (G1), each of $A^1$ to $A^4$ independently represents an alkyl group having 1 to 6 carbon atoms or a cycloalkyl group having 3 to 6 carbon atoms. In addition, each of $R^1$ to $R^5$ independently represents any one of hydrogen, an alkyl group having 1 to 6 carbon atoms, a cycloalkyl group having 3 to 6 carbon atoms, and a cyano group, and at least one of $R^1$ to $R^5$ represents a cyano group. Furthermore, each of $R^{11}$ to $R^{14}$ independently represents an alkyl group having 2 to 6 carbon atoms or a cycloalkyl group having 3 to 6 carbon atoms. Moreover, each of $R^{15}$ and $R^{16}$ independently represents any one of hydrogen, a methyl group, and an ethyl group. Note that $R^{11}$ and $R^{12}$ may be bonded to each other to form a ring. In addition, $R^{13}$ and $R^{14}$ may be bonded to each other to form a ring.

Another embodiment of the present invention is the organometallic complex having the above structure in which each of $R^{15}$ and $R^{16}$ is hydrogen.

Another embodiment of the present invention is the organometallic complex having the above structure in which $R^{11}$ and $R^{12}$ are the same group.

Another embodiment of the present invention is the organometallic complex having the above structure in which $R^{11}$ and $R^{12}$ are the same group and $R^{13}$ and $R^{14}$ are the same group.

Another embodiment of the present invention is the organometallic complex having the above structure in which $R^{11}$ to $R^{14}$ are the same group.

Another embodiment of the present invention is an organometallic complex represented by General Formula (G1-1) shown below.

[Chemical Formula 2]

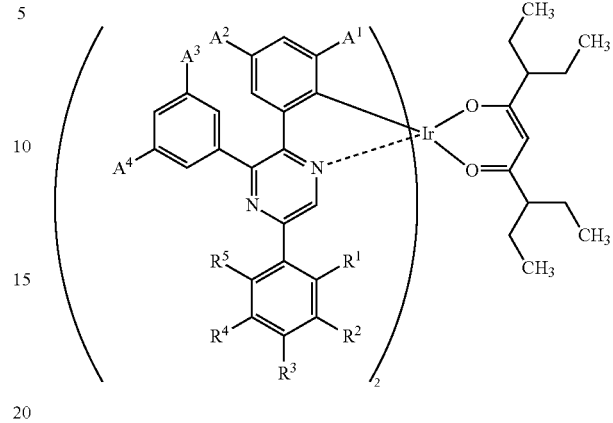

(G1-1)

In the organometallic complex represented by General Formula (G1-1), each of $A^1$ to $A^4$ independently represents an alkyl group having 1 to 6 carbon atoms or a cycloalkyl group having 3 to 6 carbon atoms. In addition, each of $R^1$ to $R^5$ independently represents any one of hydrogen, an alkyl group having 1 to 6 carbon atoms, a cycloalkyl group having 3 to 6 carbon atoms, and a cyano group, and at least one of $R^1$ to $R^5$ represents a cyano group.

Another embodiment of the present invention is an organometallic complex represented by General Formula (G2) shown below.

[Chemical Formula 3]

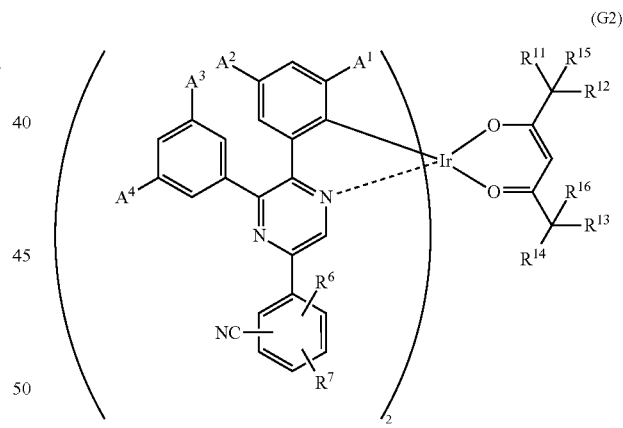

(G2)

In the organometallic complex represented by General Formula (G2), each of $A^1$ to $A^4$ independently represents an alkyl group having 1 to 6 carbon atoms or a cycloalkyl group having 3 to 6 carbon atoms. In addition, each of $R^6$ and $R^7$ independently represents any one of hydrogen, an alkyl group having 1 to 6 carbon atoms, and a cycloalkyl group having 3 to 6 carbon atoms. Furthermore, each of $R^{11}$ to $R^{14}$ independently represents an alkyl group having 2 to 6 carbon atoms or a cycloalkyl group having 3 to 6 carbon atoms. Moreover, each of $R^{15}$ and $R^{16}$ independently represents any one of hydrogen, a methyl group, and an ethyl group. Note that $R^{11}$ and $R^{12}$ may be bonded to each other to form a ring. In addition, $R^{13}$ and $R^{14}$ may be bonded to each other to form a ring.

Another embodiment of the present invention is the organometallic complex having the above structure in which each of $R^{15}$ and $R^{16}$ is hydrogen.

Another embodiment of the present invention is the organometallic complex having the above structure in which $R^{11}$ and $R^{12}$ are the same group.

Another embodiment of the present invention is the organometallic complex having the above structure in which $R^{11}$ and $R^{12}$ are the same group and $R^{13}$ and $R^{14}$ are the same group.

Another embodiment of the present invention is the organometallic complex having the above structure in which $R^{11}$ to $R^{14}$ are the same group.

Another embodiment of the present invention is an organometallic complex represented by General Formula (G2-1) shown below.

[Chemical Formula 4]

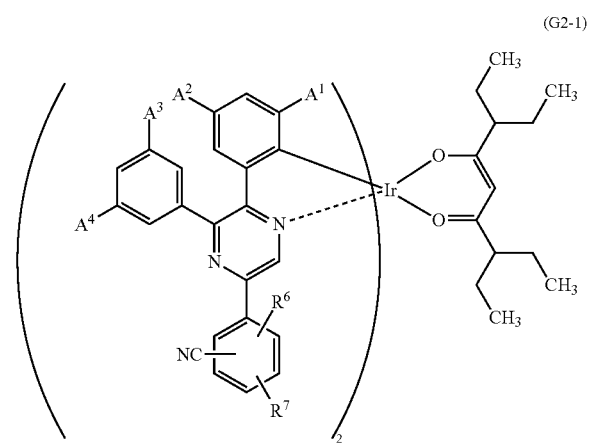

In the organometallic complex represented by General Formula (G2-1), each of $A^1$ to $A^4$ independently represents an alkyl group having 1 to 6 carbon atoms or a cycloalkyl group having 3 to 6 carbon atoms. In addition, each of $R^6$ and $R^7$ independently represents an alkyl group having 1 to 6 carbon atoms or a cycloalkyl group having 3 to 6 carbon atoms.

Another embodiment of the present invention is the organometallic complex having the above structure in which each of $A^1$ to $A^4$ independently represents a methyl group or a t-butyl group.

Another embodiment of the present invention is an organometallic complex represented by General Formula (G3) shown below.

[Chemical Formula 5]

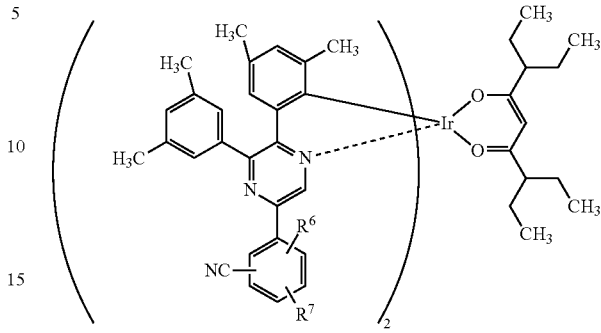

In the organometallic complex represented by General Formula (G3), each of $R^6$ and $R^7$ independently represents an alkyl group having 1 to 6 carbon atoms or a cycloalkyl group having 3 to 6 carbon atoms.

Another embodiment of the present invention is the organometallic complex represented by General Formula (G3) in which each of $R^6$ and $R^7$ independently represents hydrogen or a methyl group and at least one of $R^6$ and $R^7$ represents a methyl group.

Another embodiment of the present invention is the organometallic complex having the above structure, which has a peak wavelength of 600 nm or longer in an emission spectrum.

Another embodiment of the present invention is a light-emitting material for top emission structures, which includes any of the above organometallic complexes.

Another embodiment of the present invention is a light-emitting device including any of the above organometallic complexes.

Another embodiment of the present invention is an optical device including any of the above organometallic complexes.

Another embodiment of the present invention is an electronic device including the above light-emitting device, and a sensor, an operation button, a speaker, or a microphone.

Another embodiment of the present invention is a light-emitting apparatus including the above light-emitting device, and a transistor or a substrate.

Another embodiment of the present invention is a lighting device including the above light-emitting device and a housing.

Note that the light-emitting apparatus in this specification includes, in its category, an image display device that uses a light-emitting device. The light-emitting apparatus may include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting apparatus or the like may include the light-emitting apparatus.

According to one embodiment of the present invention, a novel organometallic complex can be provided. Alternatively, according to one embodiment of the present invention, a novel organometallic complex that shows excellent red light emission can be provided. Alternatively, according to one embodiment of the present invention, an organometallic complex capable of providing a light-emitting device having a long lifetime can be provided. Alternatively, according to one embodiment of the present invention, an organometallic complex capable of providing a light-emitting device having along lifetime especially at high temperatures can be provided. Alternatively, according to one embodiment of the present invention, an organometallic complex capable of providing a light-emitting device having high emission efficiency can be provided. Alternatively, according to one embodiment of the present invention, an organometallic complex having an emission spectrum with a narrow half width can be provided. Alternatively, according to one embodiment of the present invention, an organometallic complex that is favorably used in a top-emission light-emitting apparatus can be provided. Alternatively, according to one embodiment of the present invention, an organometallic complex that has excellent color purity, emits red light at high quantum efficiency, and provides a light-emitting device having a long lifetime, high current efficiency, and high power efficiency when used as a light-emitting material can be provided.

Alternatively, according to one embodiment of the present invention, a light-emitting device having a long lifetime can be provided. Alternatively, according to one embodiment of the present invention, a light-emitting device having high emission efficiency can be provided. Alternatively, according to one embodiment of the present invention, a light-emitting device emitting red light having high color purity can be provided. Alternatively, according to one embodiment of the present invention, a light-emitting device that is favorably used in a top-emission light-emitting apparatus can be provided.

Alternatively, according to one embodiment of the present invention, a light-emitting apparatus, an electronic device, and a display device each having a long lifetime can be provided. Alternatively, according to one embodiment of the present invention, a light-emitting apparatus, an electronic device, and a display device each having small power consumption can be provided. Alternatively, according to one embodiment of the present invention, a light-emitting apparatus, an electronic device, and a display device each having high display quality can be provided.

Note that the descriptions of these effects do not preclude the existence of other effects. One embodiment of the present invention does not need to have all the effects. Other effects will be apparent from and can be derived from the descriptions of the specification, the drawings, the claims, and the like.

BRIEF DESCRIPTION OF THE DRAWINGS

In the accompanying drawings:

FIGS. 3A and 3B are conceptual views of active matrix light-emitting apparatuses;

FIGS. 7A, 7B1, 7B2, and 7C illustrate electronic devices;

DETAILED DESCRIPTION OF THE INVENTION

Figure 1A:
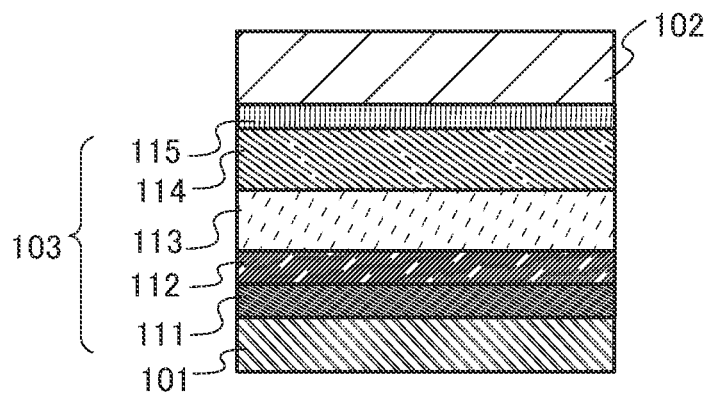
FIGS. 1A, 1B, and 1C are schematic views of light-emitting devices.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

Among organometallic complexes emitting phosphorescence, an organometallic complex using an organic compound having a 2,3-diphenylpyrazine skeleton as a ligand is known to efficiently emit red light (Japanese Published Patent Application No. 2007-284432). In addition, it is also reported that when methyl groups are bonded to the 3-position and the 5-position of a phenyl group included in the 2,3-diphenylpyrazine skeleton in an organic compound, an organometallic complex using the organic compound as a ligand has a narrower emission spectrum and red light emission with high color purity can be obtained (Japanese Published Patent Application No. 2013-147496). Furthermore, an organometallic complex using, as a ligand, an organic compound in which a cyano group is bonded to a phenyl group at the 5-position of 2,3,5-triphenylpyrazine is inhibited from being decomposed, and thus can provide a light-emitting device having a long lifetime (Japanese Published Patent Application No. 2017-114853).

The organometallic complex using a pyrazine ligand efficiently emits red light with high color purity, and thus is an excellent red phosphorescent material that enables a light-emitting device having a long lifetime. However, an emission spectrum of the organometallic complex in which a cyano group is bonded to a phenyl group at the 5-position of 2,3,5-triphenylpyrazine is shifted to a long wavelength side, and the organometallic complex emits extremely deep red light.

Deep red light is preferable in terms of color expression because a wide color range of red can be easily expressed; however, its luminosity factor is low due to an emission spectrum on a long wavelength side, and the current efficiency, the power efficiency, and the like are reduced even when the external quantum efficiency is kept high. When the emission spectrum is shifted to a short wavelength side excessively in order to avoid such reduction, the color expression is poor; therefore, a red light-emitting material having as high a luminosity factor as possible while keeping a high color purity needs to be designed. However, such a precise control is extremely difficult to achieve, and there is no guarantee that a newly designed organometallic complex has as favorable characteristics as the conventional organometallic complexes described above.

Note that a cyano group bonded to a phenyl group at the 5-position of 2,3,5-triphenylpyrazine is indispensable for achieving a long lifetime of a light-emitting device.

In view of the above, one embodiment of the present invention provides an organometallic complex that has excellent color purity, emits red light at high quantum efficiency, and provides a light-emitting device having a long lifetime, high current efficiency, and high power efficiency when used as a light-emitting material. Furthermore, the conventional organometallic complexes described above has a poor yield in synthesis; thus, one embodiment of the present invention provides an organometallic complex with an improved yield in synthesis. One embodiment of the present invention is an organometallic complex represented by General Formula (G1) shown below.

[Chemical Formula 6]

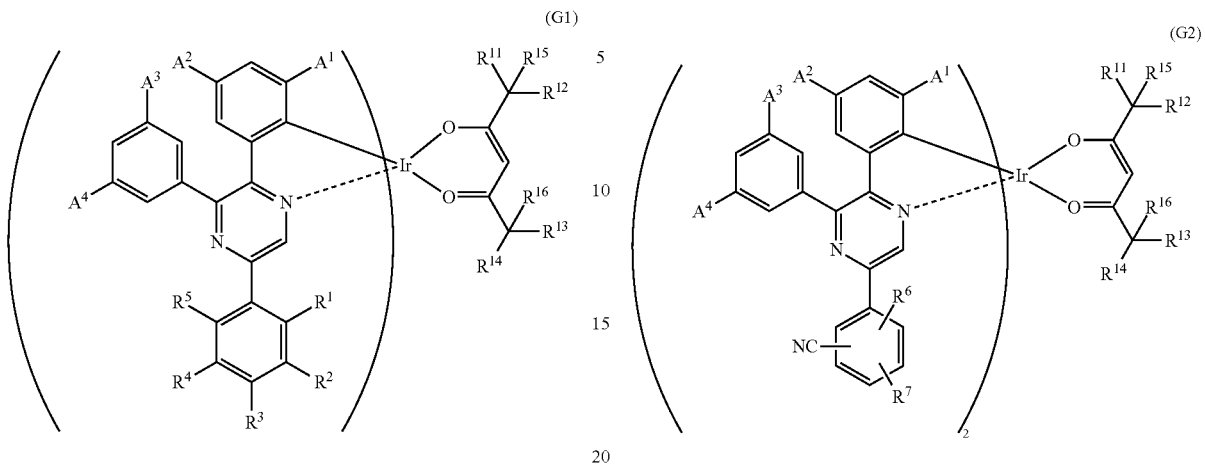

(G1)

[Chemical Formula 7]

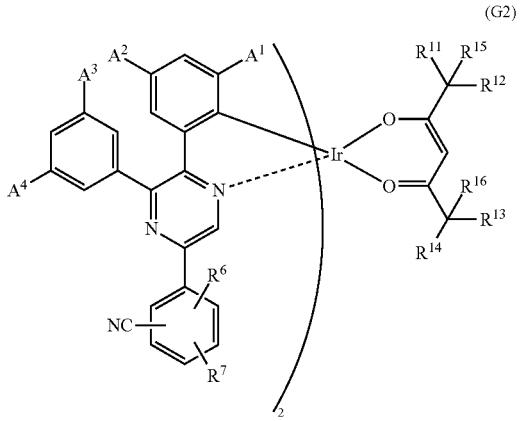

(G2)

In the organometallic complex represented by General Formula (G1), each of $A^1$ to $A^4$ independently represents an alkyl group having 1 to 6 carbon atoms or a cycloalkyl group having 3 to 6 carbon atoms. Owing to such a structure, the organometallic complex represented by General Formula (G1) emits red light having a narrow half width of its emission spectrum and high color purity. Each of $A^1$ to $A^4$ is preferably an alkyl group having 1 to 6 carbon atoms, further preferably a methyl group or a t-butyl group, still further preferably a methyl group.

Each of $R^1$ to $R^5$ independently represents any one of hydrogen, an alkyl group having 1 to 6 carbon atoms, a cycloalkyl group having 3 to 6 carbon atoms, and a cyano group, and at least one of $R^1$ to $R^5$ represents a cyano group. When at least one of $R^1$ to $R^5$ represents a cyano group, the organometallic complex represented by General Formula (G1) is inhibited from being decomposed. Thus, an impurity such as a decomposition product is inhibited from being mixed into a light-emitting device during manufacturing, whereby the light-emitting device can easily have a long lifetime.

It is preferable that at least one or two of $R^1$ to $R^5$ that are not cyano groups each include a substituent. That is, an organometallic complex represented by General Formula (G2) shown below is preferable. Note that each of $R^6$ and $R^7$ independently represents an alkyl group having 1 to 6 carbon atoms or a cycloalkyl group having 3 to 6 carbon atoms.

Each of $R^{11}$ to $R^{14}$ that are substituents of ancillary ligands independently represents an alkyl group having 2 to 6 carbon atoms or a cycloalkyl group having 3 to 6 carbon atoms. Moreover, each of $R^{15}$ and $R^{16}$ independently represents any one of hydrogen, a methyl group, and an ethyl group. Note that $R^{11}$ and $R^{12}$ may be bonded to each other to form a ring. In addition, $R^{13}$ and $R^{14}$ may be bonded to each other to form a ring. Each of $R^{15}$ and $R^{16}$ is preferably hydrogen.

It is preferable that in the ancillary ligands, $R^{11}$ and $R^{12}$ be the same group and $R^{13}$ and $R^{14}$ be the same group. It is further preferable that all of $R^{11}$ to $R^{14}$ be the same group.

It is still further preferable that in General Formula (G1) and in General Formula (G2), each of $R^{11}$ to $R^{14}$ be an ethyl group and each of $R^{15}$ and $R^{16}$ be hydrogen. That is, organometallic complexes represented by General Formulae (G1-1) and (G2-1) are further preferable.

[Chemical Formula 8]

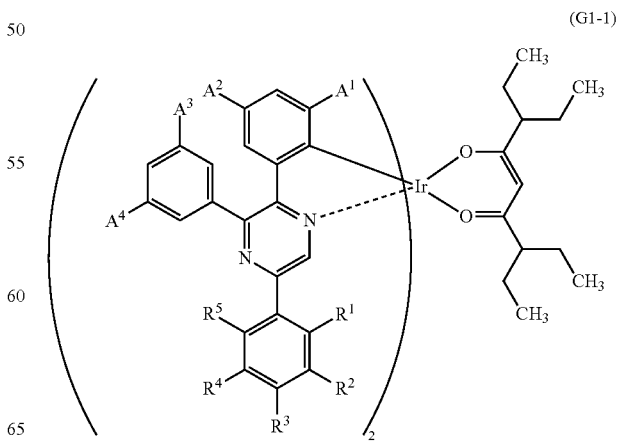

(G1-1)

[Chemical Formula 9]

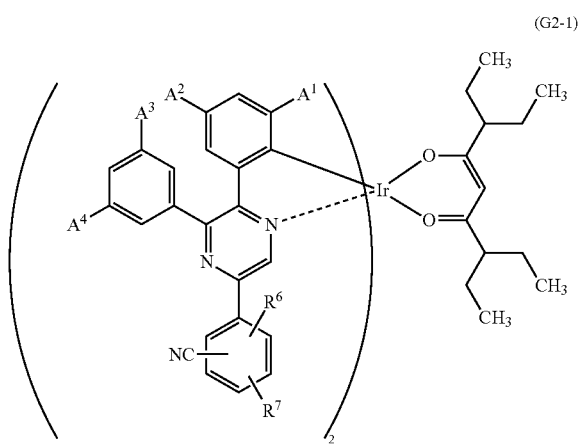

(G2-1)

In General Formula (G1-1), $A^1$ to $A^4$ and $R^1$ to $R^5$ are the same as those in General Formula (G1), and in General Formula (G2-1), $A^1$ to $A^4$, $R^6$, and $R^7$ are the same as those in General Formula (G2).

The ancillary ligands include substituents such as $R^{11}$ to $R^{16}$, whereby the emission spectrum of the organometallic complex represented by General Formula (G1) can be shifted slightly to a short wavelength side. Thus, the organometallic complex represented by General Formula (G1) can show excellent red light emission and have an improved luminosity factor, and a light-emitting device having high current efficiency and power efficiency can be provided.

In addition, the organometallic complex represented by General Formula (G1) has a narrowed half width of the emission spectrum. Owing to the narrowed half width of the emission spectrum, light emission in the long wavelength region, which has a low luminosity factor, is reduced and the emission intensity in the vicinity of the emission peak wavelength is increased instead, as compared to the conventional organometallic complex. Accordingly, a light-emitting device having high current efficiency and power efficiency can be easily provided. Moreover, owing to the narrowed half width of the emission spectrum, loss of light due to attenuation is small and the light can be efficiently amplified when the organometallic complex is used for a light-emitting device having a microcavity structure. Thus, the organometallic complex represented by General Formula (G1) is suitable for a light-emitting device having a microcavity structure. Since the microcavity structure is suitable for a light-emitting apparatus having a top-emission structure, it can be said that the organometallic complex represented by General Formula (G1) is extremely suitable as a light-emitting material for a light-emitting device having a top-emission structure.

Furthermore, the organometallic complex represented by General Formula (G1), in which the ancillary ligands are used, has an improved luminescence quantum yield, and thus a light-emitting device having high external quantum efficiency can be provided.

That is, a 2,3,5-triphenylpyrazine ligand to which a dimethyl group and a cyano group are bonded, which allows deep red light emission, and the ancillary ligand that enables shift of the emission spectrum to a short wavelength side have a great synergy effect. In addition, since the ancillary ligand has an effect of narrowing the emission spectrum, the organometallic complex of one embodiment of the present invention is extremely favorable as a light-emitting material used for a top-emission light-emitting apparatus having a microcavity structure.

A light-emitting device using the organometallic complex represented by General Formula (G1) can have a long lifetime especially at high temperatures.

Specific examples of the alkyl group having 1 to 6 carbon atoms include a methyl group, an ethyl group, a propyl group, an isopropyl group, a butyl group, a tert-butyl group, a pentyl group, and a hexyl group. Specific examples of the cycloalkyl group having 3 to 6 carbon atoms include a cyclopropyl group and a cyclohexyl group. Specific examples of the alkyl group having 2 to 6 carbon atoms include an ethyl group, a propyl group, an isopropyl group, a butyl group, a tert-butyl group, a pentyl group, and a hexyl group.

Specific examples of the organic compound having the above-described structure are shown below.

[Chemical Formula 10]

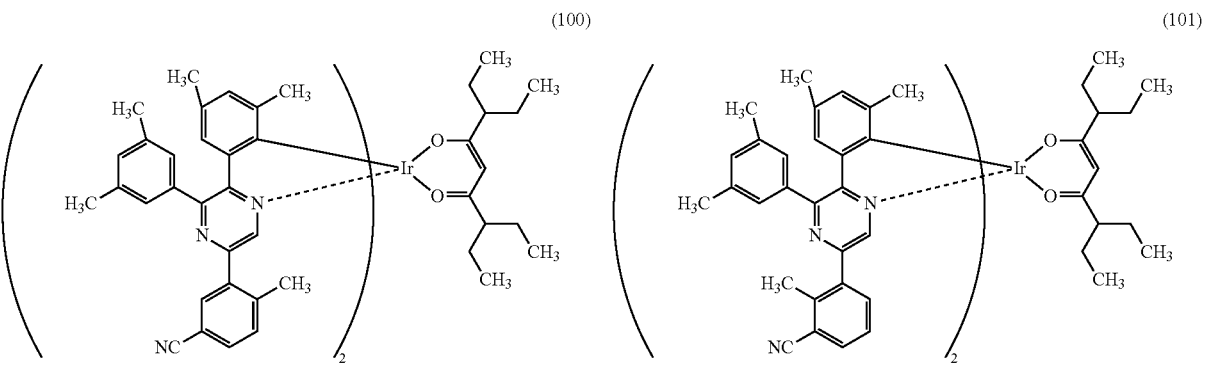

-continued
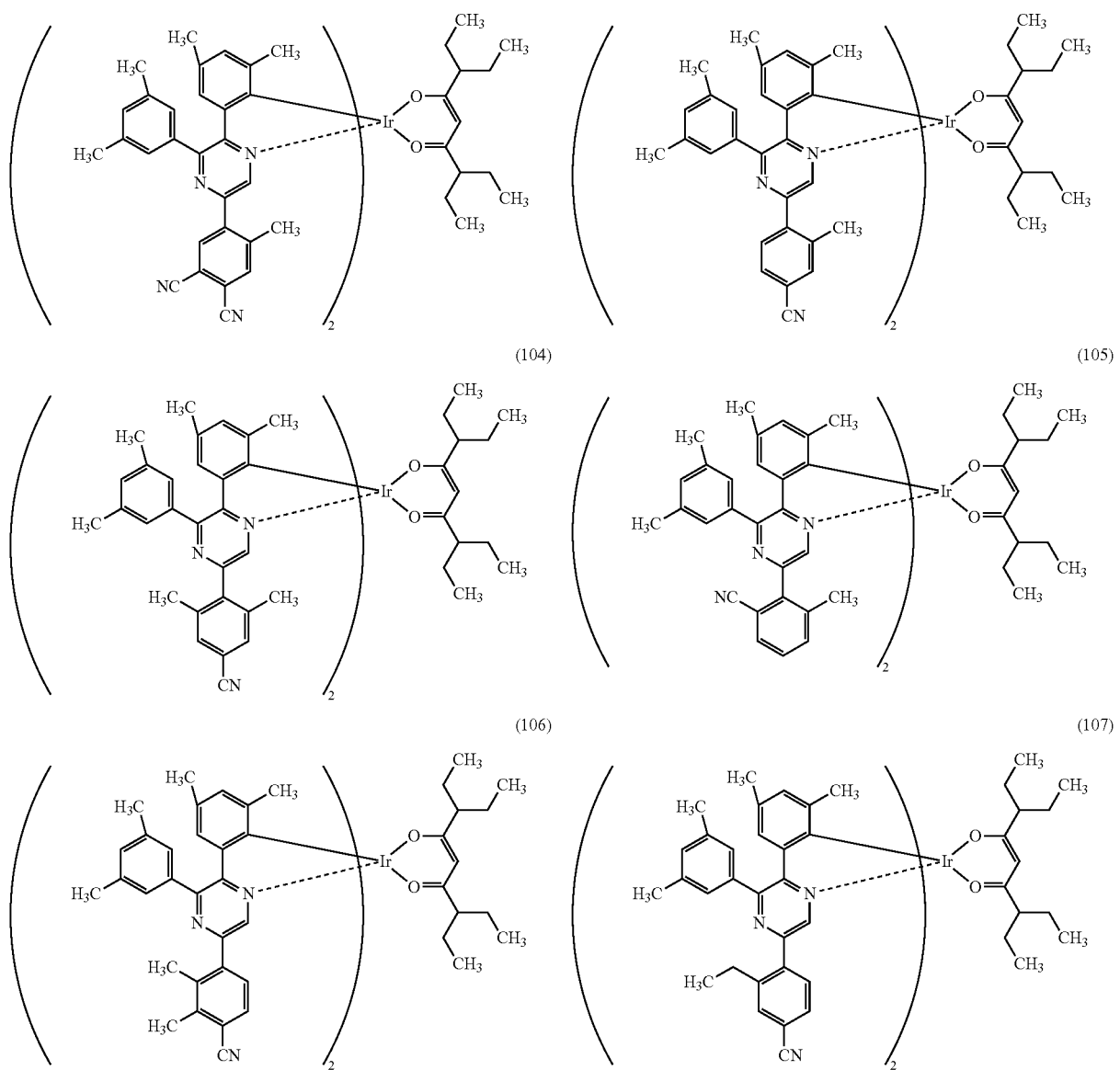
[Chemical Formula 11]
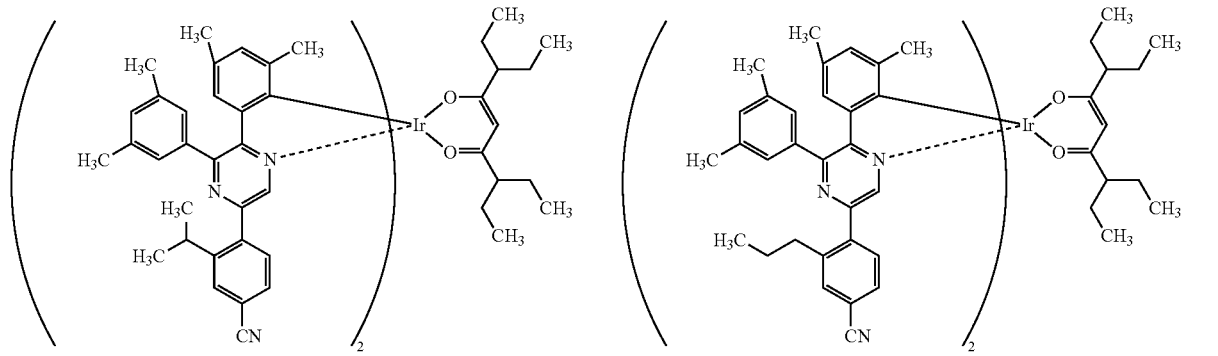

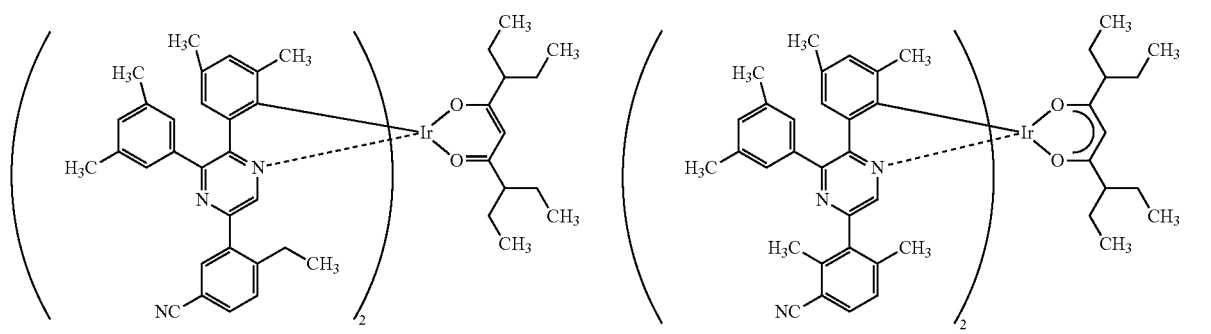
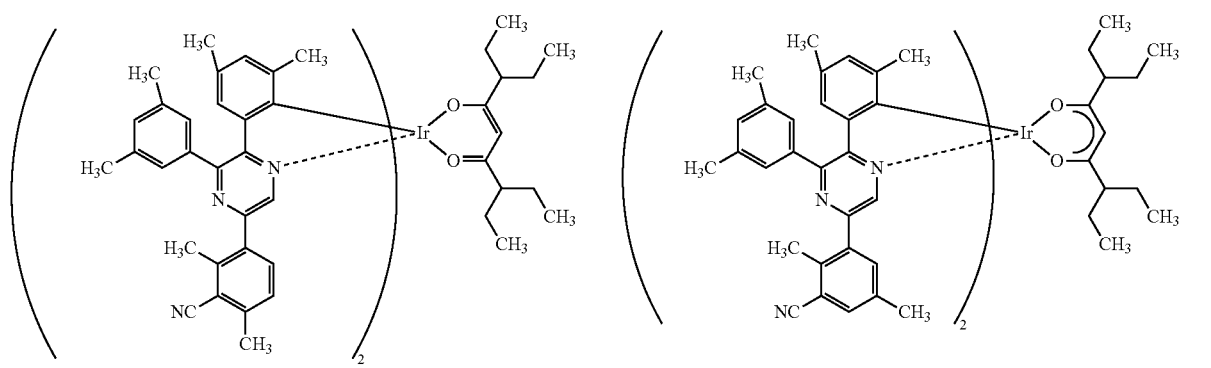
[Chemical Formula 12]
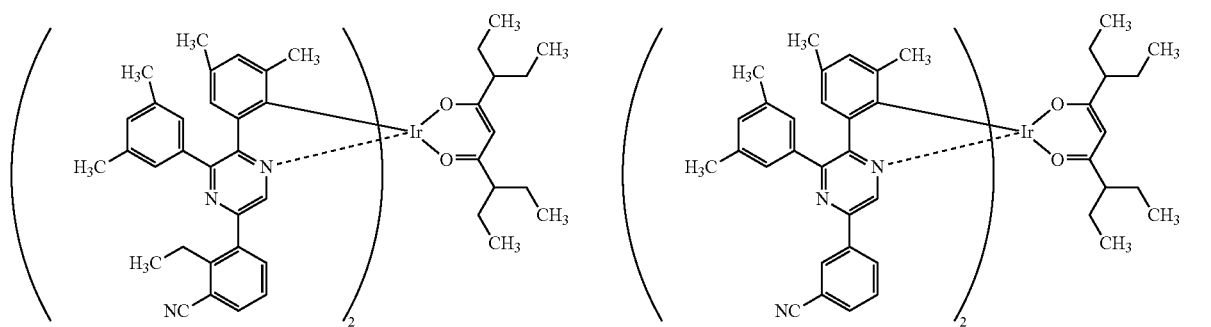
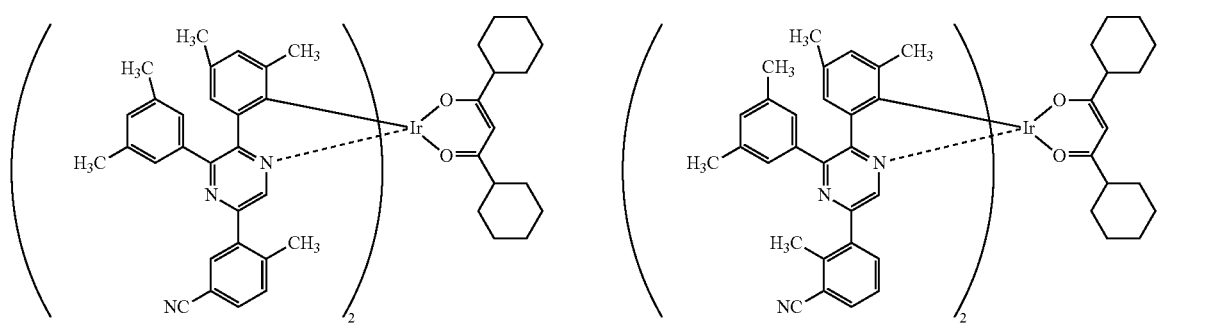

-continued
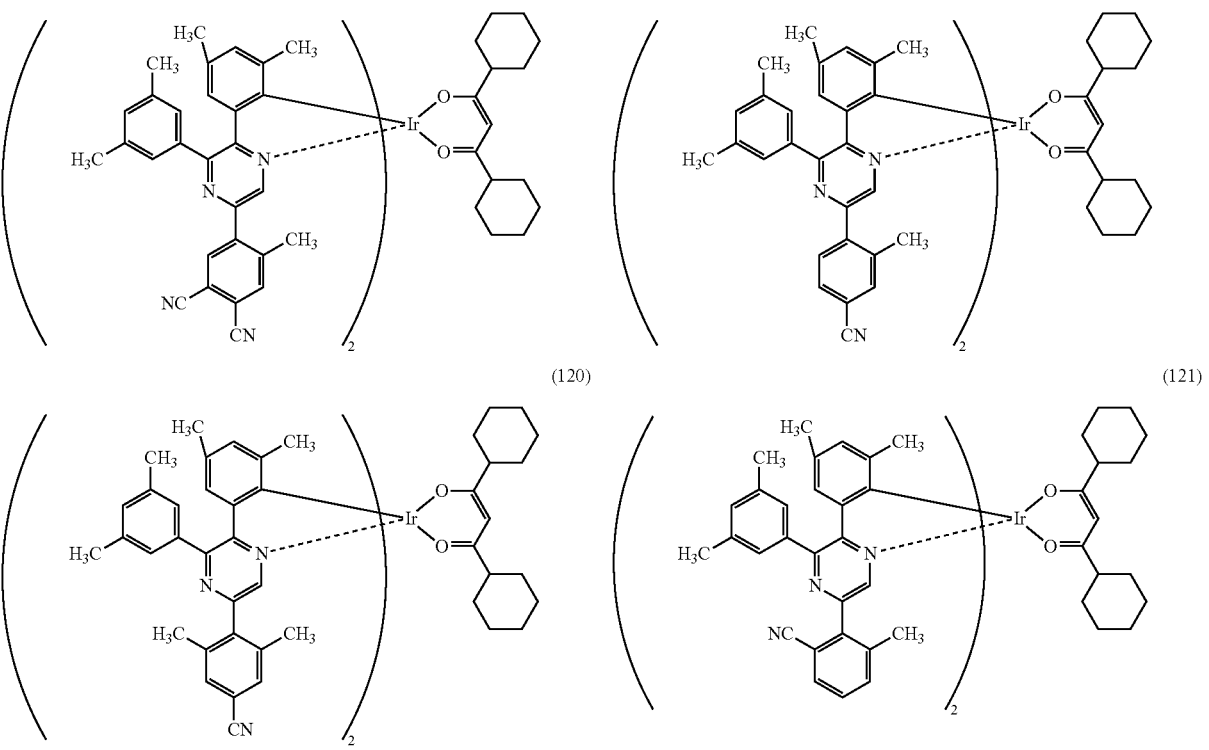
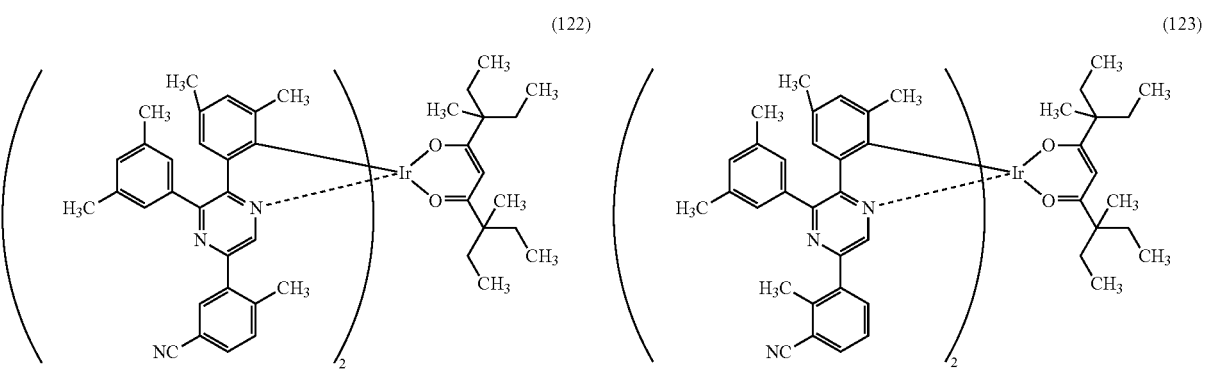
[Chemical Formula 13]
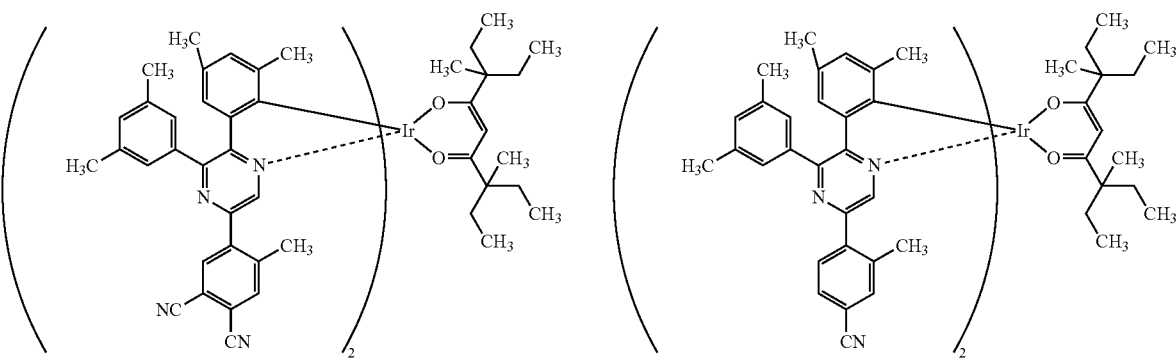

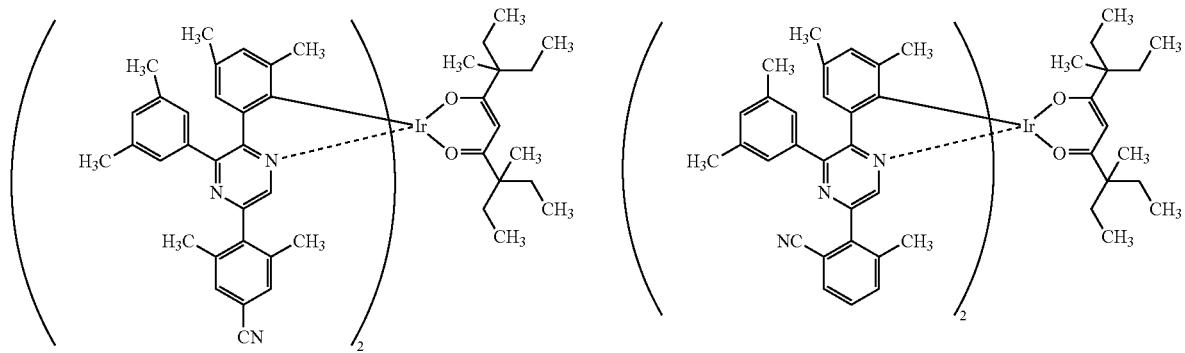
(126)
(127)
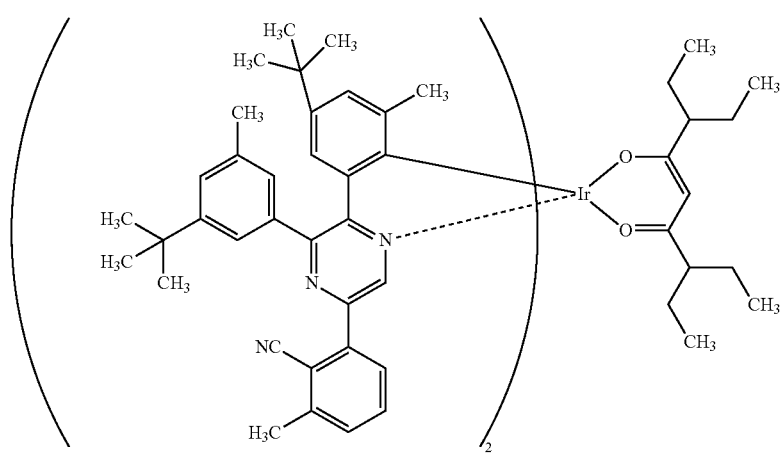
(128)
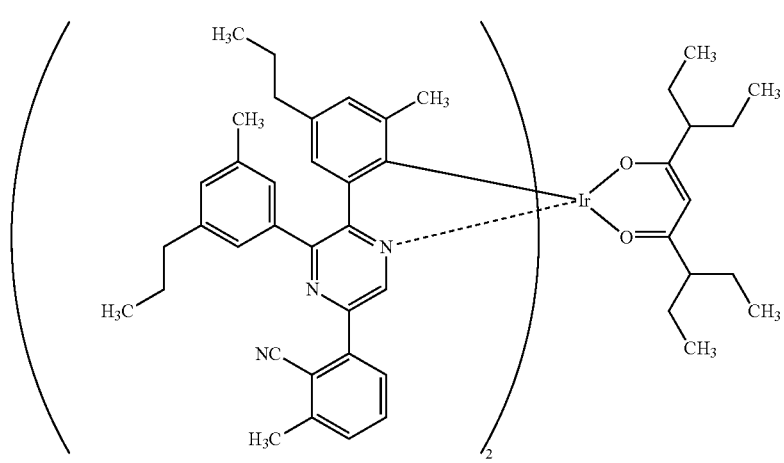
(129)

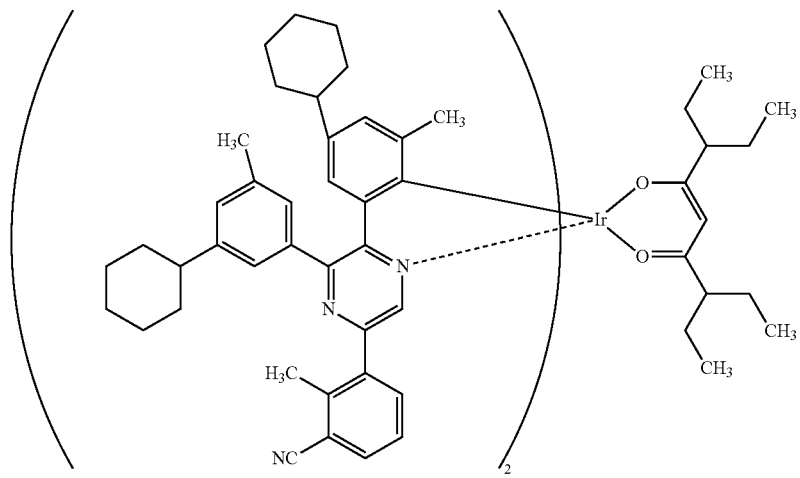

(130)

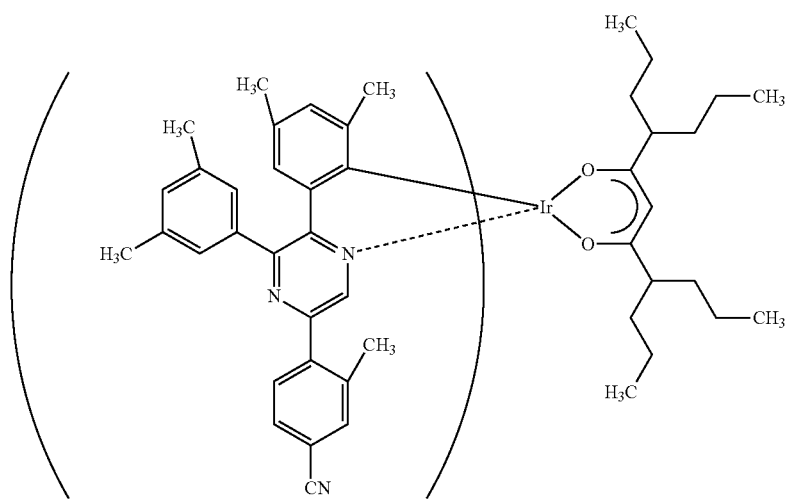

(131)

Here, an example of a method for synthesizing the organometallic complex having the structure represented by General Formula (G1) will be described below.

Synthesis Method of Organometallic Complex of One Embodiment of the Present Invention Represented by General Formula (G1)

The organometallic complex of one embodiment of the present invention represented by General Formula (G1) is synthesized as follows. As shown in Synthesis Scheme (A1) below, a pyrazine derivative represented by General Formula (G0) and an iridium compound containing a halogen (e.g., iridium chloride, iridium bromide, or iridium iodide) are heated in an inert gas atmosphere using no solvent, an alcohol-based solvent (e.g., glycerol, ethylene glycol, 2-methoxyethanol, or 2-ethoxyethanol) alone, or a mixed solvent of water and one or more of the alcohol-based solvents, so that a dinuclear complex (B) which is a kind of organometallic complex including a halogen-bridged structure and is a novel substance can be obtained. There is no particular limitation on a heating means, and an oil bath, a sand bath, or an aluminum block may be used. Alternatively, microwaves can be used as the heating means.

[Chemical Formula 14]

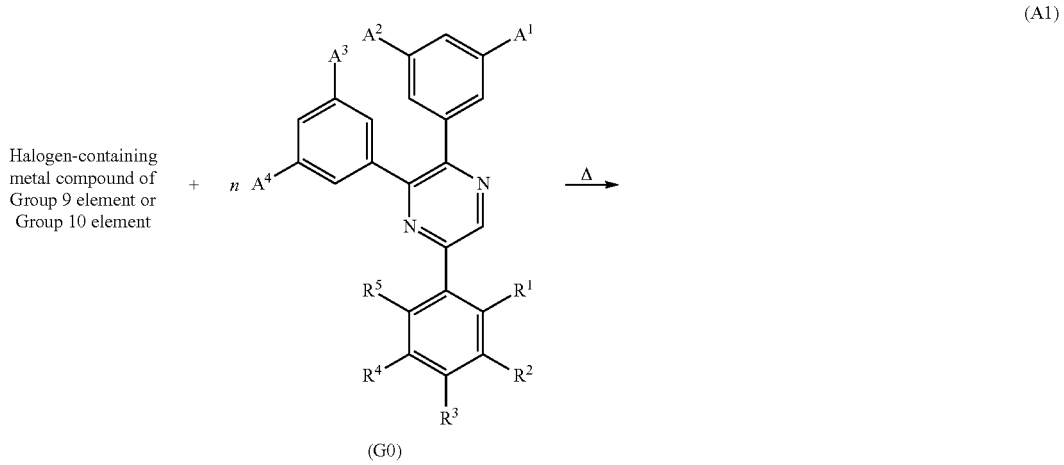

(A1)

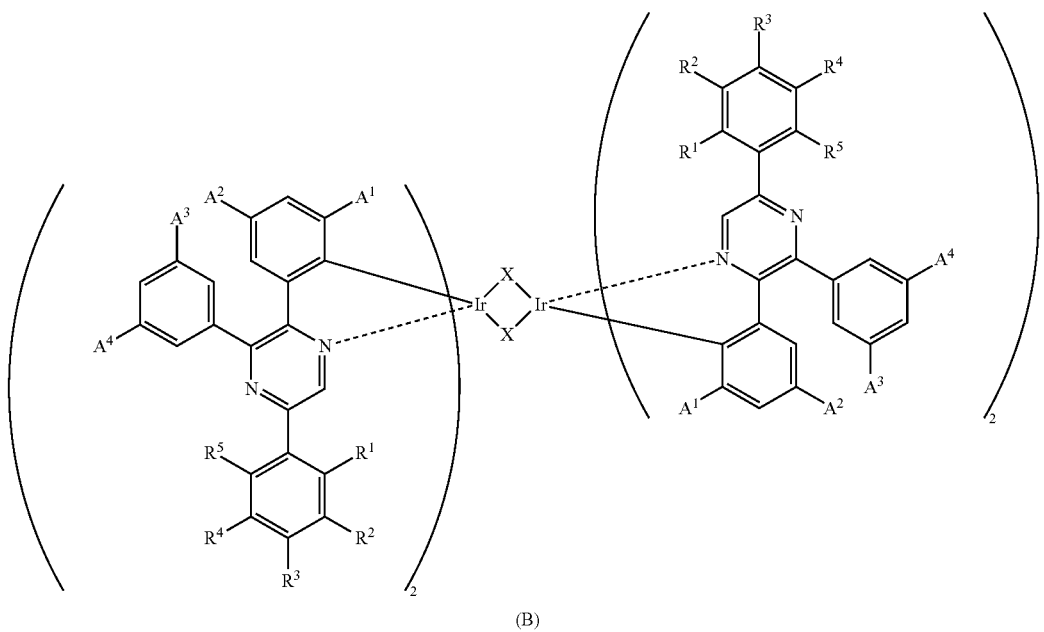

(B)

In Synthesis Scheme (A1), X represents a halogen and each of $A^1$ to $A^4$ independently represents an alkyl group having 1 to 6 carbon atoms or a cycloalkyl group having 3 to 6 carbon atoms. Each of $R^1$ to $R^5$ independently represents any one of hydrogen, an alkyl group having 1 to 6 carbon atoms, a cycloalkyl group having 3 to 6 carbon atoms, and a cyano group, and at least one of $R^1$ to $R^5$ represents a cyano group.

As shown in Synthesis Scheme (A2) below, the dinuclear complex (B) obtained in Synthesis Scheme (A1) is reacted with a source material of a ligand in an inert gas atmosphere, whereby a proton of the source material of the ligand is separated and the source material of the ligand coordinates to the central metal, iridium. Thus, the organometallic complex of one embodiment of the present invention represented by General Formula (G1) can be obtained. There is no particular limitation on a heating means, and an oil bath, a sand bath, or an aluminum block may be used. Alternatively, microwaves can be used as the heating means.

[Chemical Formula 15]

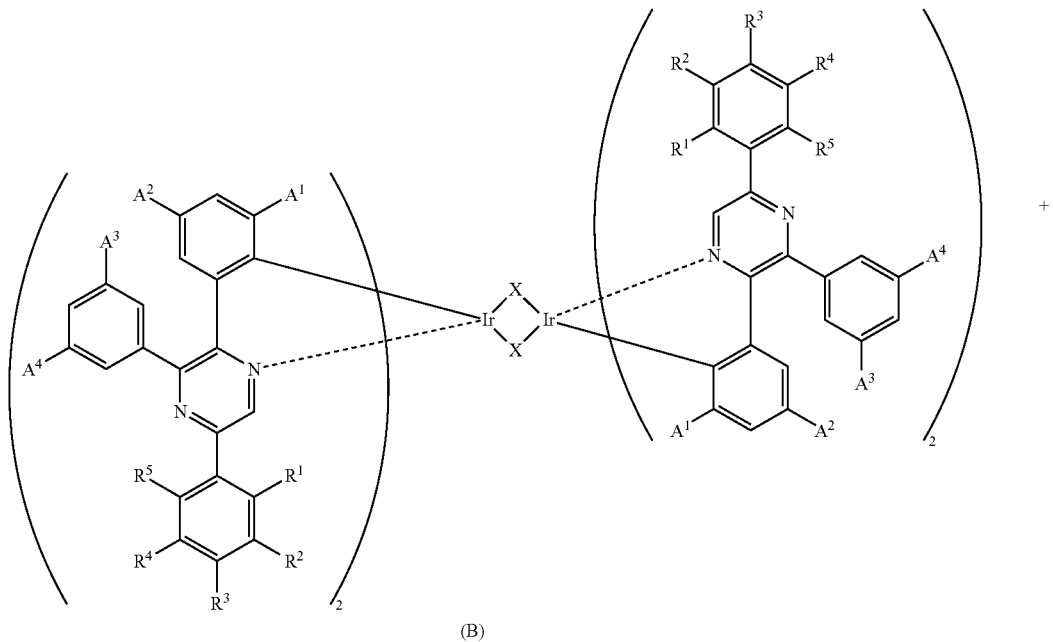

(B)

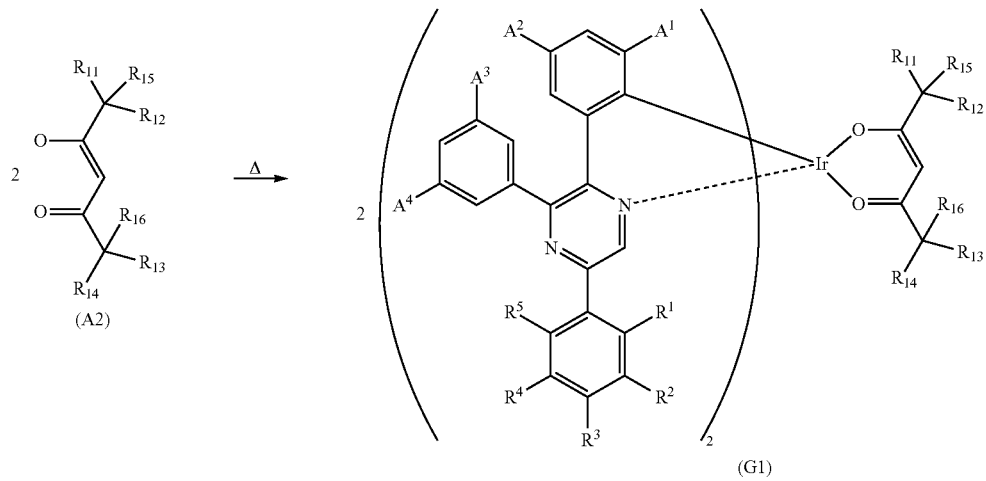

In Synthesis Scheme (A2), X represents a halogen and each of $A^1$ to $A^4$ independently represents an alkyl group having 1 to 6 carbon atoms or a cycloalkyl group having 3 to 6 carbon atoms. Each of $R^1$ to $R^5$ independently represents any one of hydrogen, an alkyl group having 1 to 6 carbon atoms, a cycloalkyl group having 3 to 6 carbon atoms, and a cyano group, and at least one of $R^1$ to $R^5$ represents a cyano group. Each of $R^{11}$ to $R^{14}$ independently represents an alkyl group having 2 to 6 carbon atoms or a cycloalkyl group having 3 to 6 carbon atoms. Moreover, each of $R^{15}$ and $R^{16}$ independently represents any one of hydrogen, a methyl group, and an ethyl group. Note that $R^{11}$ and $R^{12}$ may be bonded to each other to form a ring. In addition, $R^{13}$ and $R^{14}$ may be bonded to each other to form a ring.

Synthesis Method of Pyrazine Derivative Represented by General Formula (G0)

Here, a method for synthesizing the pyrazine derivative represented by General Formula (G0) and used in Synthesis Scheme (A1) is described.

A halide of pyrazine (a1) and a boronic acid or a boronic ester of a benzene derivative (a2) and (a3) are coupled with each other, whereby a compound (a4) is obtained. Then, a compound (a5) obtained by triflation of the compound (a4) and a boronic acid or a boronic ester of a benzene derivative (a6) are coupled with each other, whereby a pyrazine derivative represented by General Formula (G0-1) can be obtained.

[Chemical Formula 16]

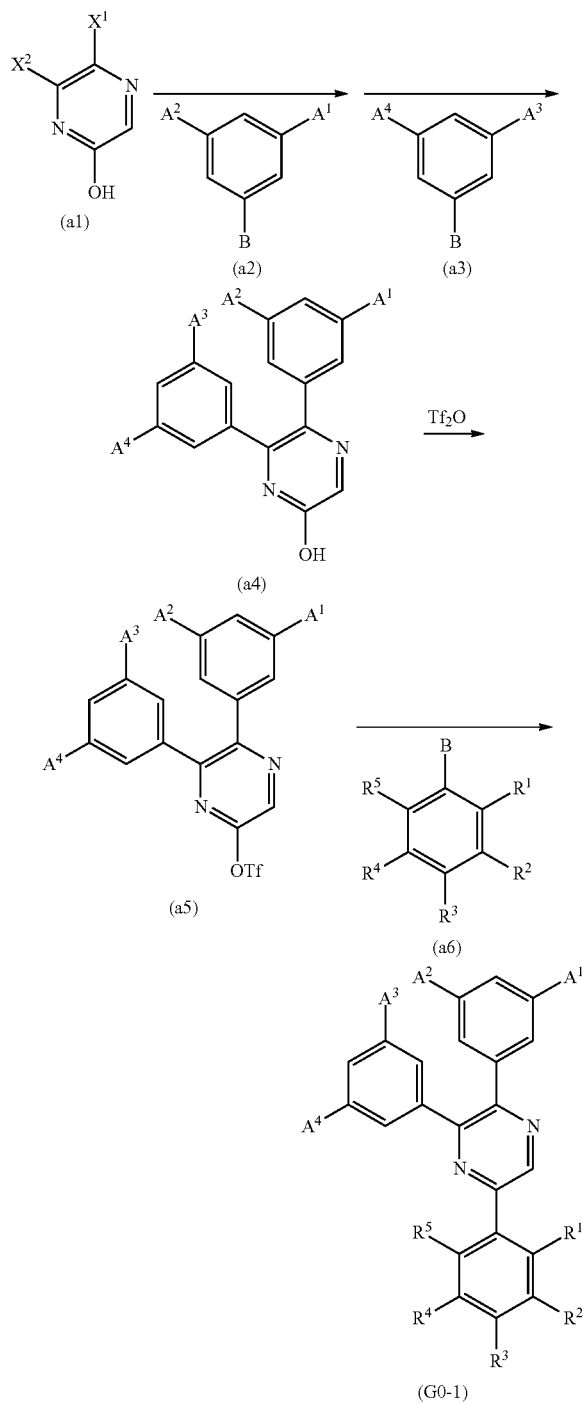

In Synthesis Scheme (A), each of $X^1$ and $X^2$ represents a halogen, B represents a boronic acid or a boronic ester, and each of $A^1$ to $A^4$ independently represents an alkyl group having 1 to 6 carbon atoms or a cycloalkyl group having 3 to 6 carbon atoms. Each of $R^1$ to $R^5$ independently represents any one of hydrogen, an alkyl group having 1 to 6 carbon atoms, a cycloalkyl group having 3 to 6 carbon atoms, and a cyano group.

When at least one of $R^1$ to $R^5$ is the boronic acid or the boronic ester of a benzene derivative (a6), which is a cyano group, in Synthesis Scheme (A), the pyrazine derivative represented by General Formula (G0) can be synthesized.

When $X^1$ and $X^2$ are different halogens in Synthesis Scheme (A), (a2) and (a3) can be different compounds. That is, a combination of $A^1$ and $A^2$ can be different from a combination of $A^3$ and $A^4$. This has advantages such as shifting an emission color and obtaining a narrowed emission spectrum of a final organometallic complex.

Other than the above-described method, there are a plurality of known methods for synthesizing the pyrazine derivative. Thus, the pyrazine derivative may be synthesized by any of the known methods.

The above is the description on the example of the synthesis method of the organometallic complex of one embodiment of the present invention; however, the present invention is not limited thereto and any other synthesis method may be employed.

Embodiment 2

In this embodiment, a light-emitting device of one embodiment of the present invention will be described.

FIG. 1A illustrates a light-emitting device of one embodiment of the present invention. The light-emitting device of one embodiment of the present invention includes a first electrode 101, a second electrode 102, and an EL layer 103. The EL layer 103 preferably includes the organic compound described in Embodiment 1.

The EL layer 103 includes a light-emitting layer 113, and the light-emitting layer 113 contains a light-emitting material (substance). A hole-injection layer 111, a hole-transport layer 112, and the like are provided between the light-emitting layer 113 and the first electrode 101. The organometallic complex described in Embodiment 1 is preferably used as the light-emitting material because it exhibits red phosphorescence efficiently.

The light-emitting layer 113 may contain a host material in addition to the light-emitting material. The host material is an organic compound having a carrier-transport property. The light-emitting layer 113 may contain one or more kinds of host materials. When a plurality of kinds of host materials are contained, the plurality of organic compounds are preferably an organic compound having an electron-transport property and an organic compound having a hole-transport property, in which case the carrier balance in the light-emitting layer 113 can be adjusted. Alternatively, the plurality of organic compounds may be organic compounds having an electron-transport property, and when the electron-transport properties are different, the electron-transport property of the light-emitting layer 113 can also be adjusted. Proper adjustment of the carrier balance enables a long-life light-emitting device to be provided. In addition, the plurality of organic compounds that are host materials may form an exciplex, or the host material and the light-emitting material may form an exciplex. The exciplex having an appropriate emission wavelength allows efficient energy transfer to the light-emitting material, achieving a light-emitting device with a high efficiency and a long lifetime.

Note that in FIG. TA, the EL layer 103 includes an electron-transport layer 114 and an electron-injection layer 115 in addition to the light-emitting layer 113, the hole-injection layer 111, and the hole-transport layer 112; however, the structure of the light-emitting device is not limited thereto. Any of these layers may be omitted or a layer having another function may be included.

Next, examples of specific structures and materials of the above-described light-emitting device will be described. As described above, the light-emitting device of one embodiment of the present invention includes, between the pair of electrodes of the first electrode 101 and the second electrode 102, the EL layer 103 including a plurality of layers; the EL layer 103 includes the organic compound disclosed in Embodiment 1 in any of the layers.

The first electrode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer in the EL layer 103 that is in contact with the first electrode 101, an electrode material can be selected regardless of its work function.

Although the EL layer 103 preferably has a stacked-layer structure, there is no particular limitation on the stacked-layer structure, and various layers such as a hole-injection layer, a hole-transport layer, a light-emitting layer, an electron-transport layer, an electron-injection layer, a carrier-blocking layer, an exciton-blocking layer, and a charge-generation layer can be employed. Two kinds of stacked-layer structure of the EL layer 103 are described in this embodiment: the structure illustrated in FIG. 1A, which includes the electron-transport layer 114 and the electron-injection layer 115 in addition to the hole-injection layer 111, the hole-transport layer 112, and the light-emitting layer 113; and the structure illustrated in FIG. 1B, which includes the electron-transport layer 114 and a charge-generation layer 116 in addition to the hole-injection layer 111, the hole-transport layer 112, and the light-emitting layer 113. Materials for forming each layer will be specifically described below.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) and copper phthalocyanine (CuPc), an aromatic amine compound such as 4,4'-bis[N-(4-diphenylaminophenyl)-N-phenylamino]biphenyl (abbreviation: DPAB) and N,N-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the first electrode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1 \times 10^{-6}$ cm$^2$/Vs or higher. Organic compounds which can be used as the material having a hole-transport property in the composite material are specifically given below.

Examples of the aromatic amine compounds that can be used for the composite material include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), and 1,4-bis[4-(N- carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis (4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra (tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide](abbreviation: PTPDMA), and poly[N,N-bis(4-butylphenyl)-N,N-bis(phenyl)benzidine](abbreviation: poly-TPD).

The material having a hole-transport property that is used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the second organic compound having an N,N-bis (4-biphenyl)amino group is preferable because a light-emitting device having a long lifetime can be fabricated. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl) triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris (1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]--4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi[9H-fluoren]-4-amine, N,N-bis(9,9-dimethyl-9H-fluoren-2-yl)-9,9'-spirobi [9H-fluoren]-3-amine, N,N-bis(9,9-dimethyl-9H-fluoren-2-yl)9,9'-spirobi[9H-fluoren]-2-amine, and N,N-bis(9,9-dimethyl-9H-fluoren-2-yl)-9,9'-spirobi[9H-fluoren]-1-amine.

Note that it is further preferable that the material having a hole-transport property to be used in the composite material have a relatively deep HOMO level of greater than or equal to −5.7 eV and lower than or equal to −5.4 eV. Using the hole-transport material with a relatively deep HOMO level in the composite material makes it easy to inject holes into the hole-transport layer 112 and to obtain a light-emitting device having a long lifetime.

Note that mixing the above composite material with a fluoride of an alkali metal or an alkaline earth metal (the proportion of fluorine atoms in a layer using the mixed material is preferably greater than or equal to 20%) can lower the refractive index of the layer. This also enables a layer with a low refractive index to be formed in the EL layer 103, leading to higher external quantum efficiency of the light-emitting device.

The formation of the hole-injection layer 111 can improve the hole-injection property, which allows the light-emitting device to be driven at a low voltage. In addition, the organic compound having an acceptor property is easy to use because it is easily deposited by vapor deposition.

The hole-transport layer 112 is formed using a material having a hole-transport property. The material having a hole-transport material preferably has a hole mobility higher than or equal to $1 \times 10^{-6}$ cm$^2$/Vs. Examples of the material having a hole-transport property include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in drive voltage. Note that any of the substances given as examples of the material having a hole-transport property that is used in the composite material for the hole-injection layer 111 can also be suitably used as the material included in the hole-transport layer 112. The organic compound described in Embodiment 1 can be highly suitably used as a material of the hole-transport layer 112 because of its high hole-transport property. Furthermore, since the organic compound described in Embodiment 1 has a high hole-transport property, even when the hole-transport layer 112 is formed to have a large thickness of 100 nm or more, a light-emitting device with a small increase in drive voltage and favorable device characteristics can be provided. The large thickness of the hole-transport layer 112 facilitates appropriate formation of a microcavity structure because it allows the optical length between electrodes to be adjusted easily.

Since the organic compound described in Embodiment 1 includes a bulky alkyl group, a film with a low refractive index can be obtained. Thus, a light-emitting device including the organic compound can have high light extraction efficiency and high emission efficiency.

The light-emitting layer 113 includes a light-emitting substance and a host material. The light-emitting layer 113 may additionally include other materials. Alternatively, the light-emitting layer 113 may be a stack of two layers with different compositions.

The light-emitting substance may be a fluorescent substance, a phosphorescent substance, a substance exhibiting thermally activated delayed fluorescence (TADF), or any other light-emitting substance.

Examples of the fluorescent substance that can be used in the light-emitting layer 113 include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]

furan)-8-amine] (abbreviation:1,6BnfAPm-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPm, 1,6mMemFLPAPm, and 1,6BnfAPm-03 are particularly preferable because of their high hole-trapping properties, high emission efficiency, and high reliability. Other fluorescent substances can also be used.

The organometallic complex described in Embodiment 1 can be used as the phosphorescent substance. The light-emitting device of one embodiment of the present invention preferably includes the organometallic complex described in Embodiment 1. The organometallic complex described in Embodiment 1 is easy to purify and evaporate, and thus enables the provision of a highly reliable light-emitting device. Furthermore, the organometallic complex can have higher thermophysical properties while keeping high color purity, and thus enables the provision of a light-emitting device with high color purity and high reliability. Furthermore, a light-emitting device having a long driving lifetime at high temperatures can be provided.

Examples of the material that can be used when a phosphorescent substance is used as the light-emitting substance in the light-emitting layer 113 are as follows: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptzl-mp)$_3$]) and tris(1-methyl-5-phenyl-3-propyl-1H-1,2,4-triazolato)iridium(III) (abbreviation: [Ir(Prptzl-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF3ppy)$_2$(pic)]), and bis[2-(4',6'-difluorophenyl)pyridinato-N,C$^{2'}$]iridium(III) acetylacetonate (abbreviation: FIr(acac)). These compounds emit blue phosphorescence and have an emission spectrum peak at 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-d3-methyl-8-(2-pyridinyl-κN)benzofuro[2,3-b]pyridine-κC]bis[2-(5-d3-methyl-2-pyridinyl-κN2)phenyl-xC]iridium(III) (abbreviation: [Ir(5mppy-d3)$_2$(mbfpypy-d3)]), [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]); and a rare earth metal complex such as tris(acetylacetonato) (monophenanthroline)terbium(III) (abbreviation: [Tb(acac)$_3$(Phen)]). These are mainly compounds that exhibit green phosphorescence and have an emission spectrum peak at 500 nm to 600 nm. Note that an organometallic iridium complex having a pyrimidine skeleton has distinctively high reliability and emission efficiency and thus is particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato(dipivaloylmethanato)iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato) (monophenanthroline)europium(III) (abbreviation: [Eu(DBM)$_3$(Phen)]) and tris[1-(2-thenoyl)-3,3,3-trifluoroacetonato(monophenanthroline)europium(III) (abbreviation: [Eu (TTA)$_3$(Phen)]). These compounds emit red phosphorescence having an emission spectrum peak at 600 nm to 700 nm. Furthermore, the organometallic iridium complexes having a pyrazine skeleton can provide red light emission with favorable chromaticity. Note that the organometallic complex that is one embodiment of the present invention and described in Embodiment 1 also has favorable chromaticity and provide red light emission at high efficiency.

Besides the above phosphorescent compounds, known phosphorescent substances may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structure formulae.

[Chemical Formula 17]

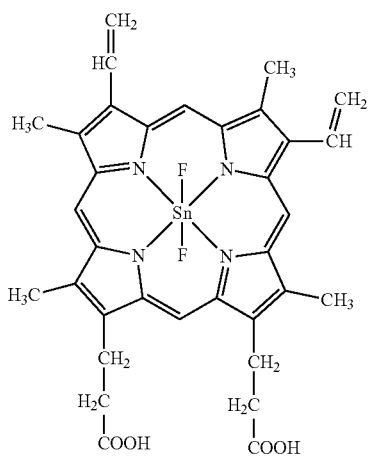

SnF$_2$(Proto IX)

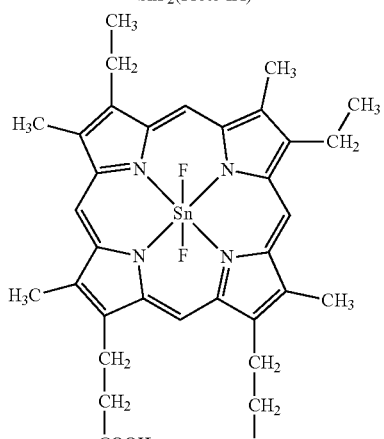

SnF$_2$(Meso IX)

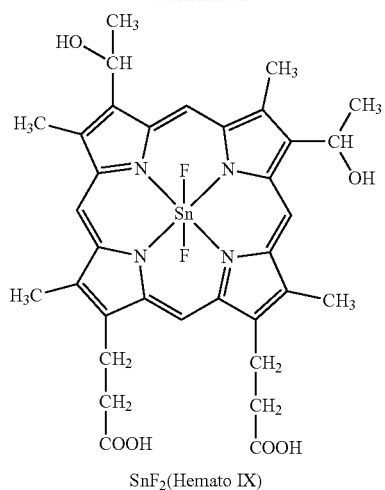

SnF$_2$(Hemato IX)

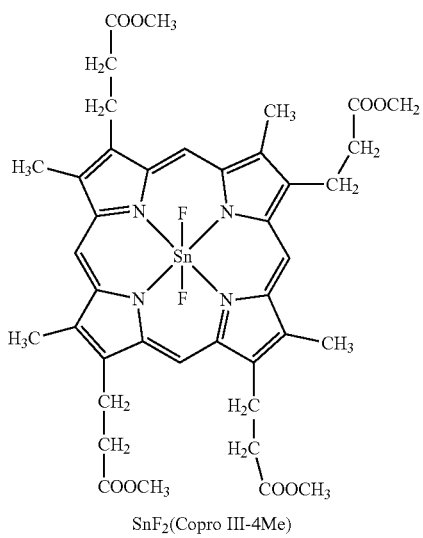

SnF$_2$(Copro III-4Me)

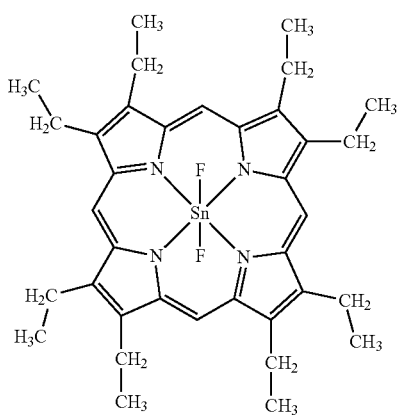

SnF$_2$(OEP)

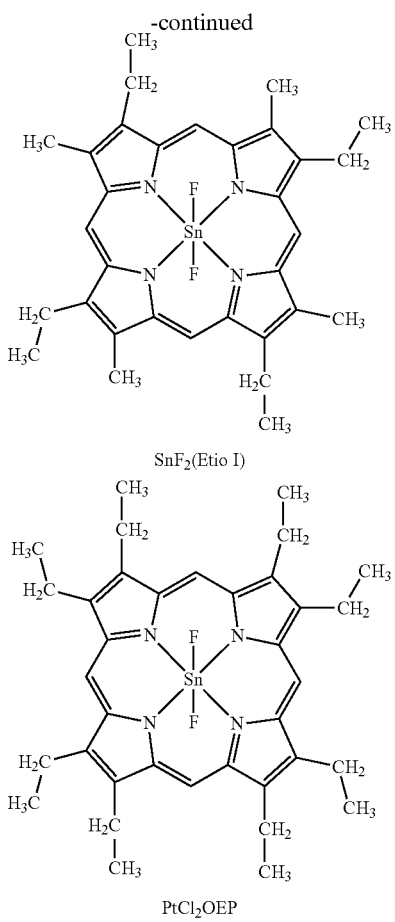

SnF₂(Etio I)

PtCl₂OEP

It is also possible to use a heterocyclic compound having one or both of a 7r-electron rich heteroaromatic ring and a π-electron deficient heteroaromatic ring that is represented by the following structure formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the it-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 18]

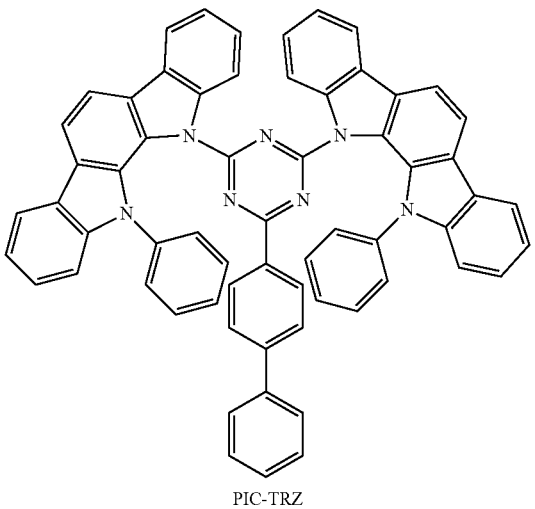

PIC-TRZ

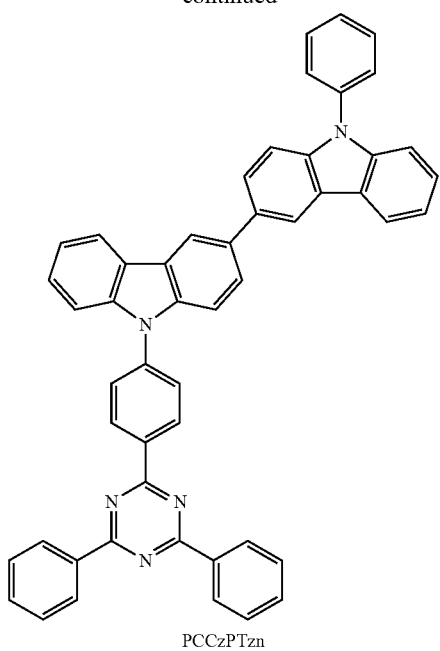

PCCzPTzn

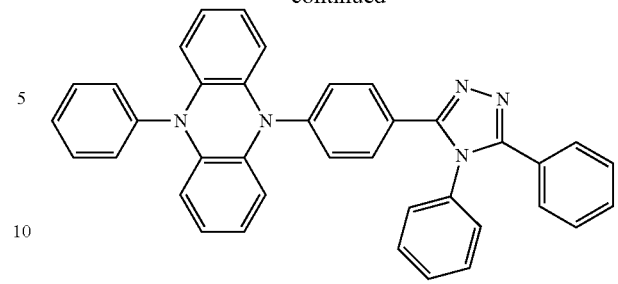

PPZ-3TPT

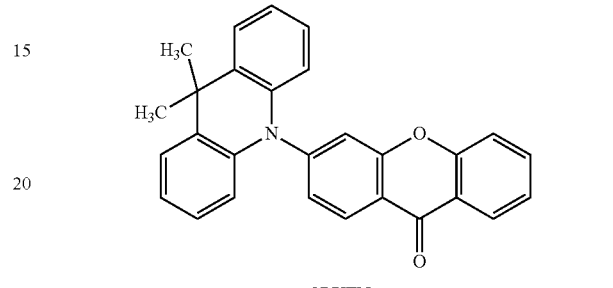

ACRXTN

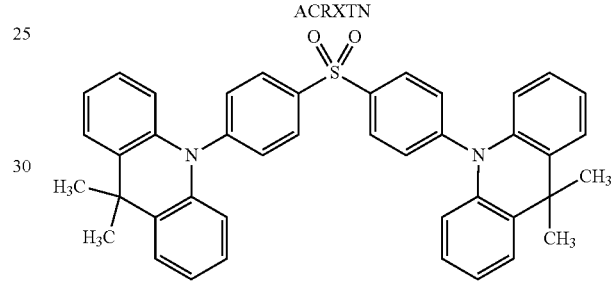

DMAC-DPS

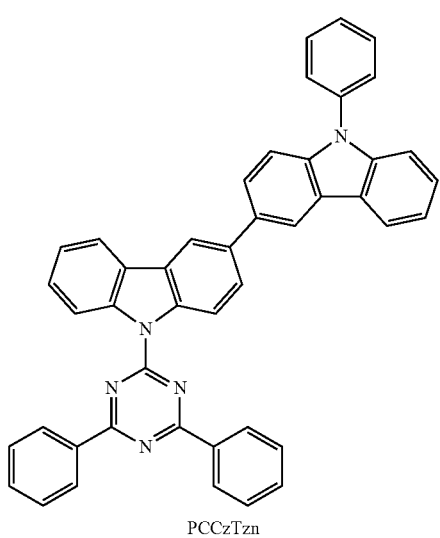

PCCzTzn

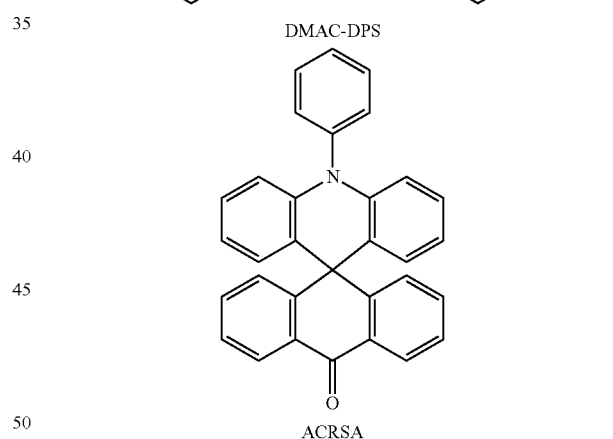

ACRSA

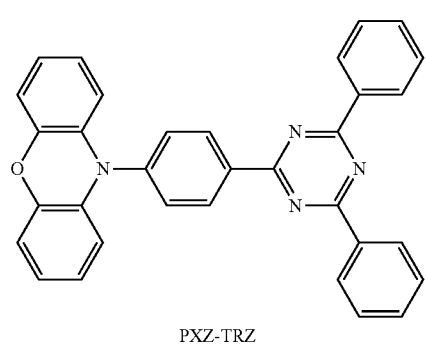

PXZ-TRZ

Note that the TADF material is a material having a small difference between the S1 level and the T1 level and a function of converting triplet excitation energy into singlet excitation energy by reverse intersystem crossing. Thus, the TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton, a π-electron rich heteroaromatic ring skeleton, or the like. Examples of the material include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAIBP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in drive voltage.

As the material having an electron-transport property, metal complexes such as bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,8-bis[3-(dibenzothiophen-4-yl)phenyl]benzo[h]quinazoline (abbreviation: 4,8mDBtP2Bqn); heterocyclic compounds having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), and 2-{3-[3-(benzo[b]naphtho[1,2-d]furan-6-yl)phenyl]phenyl}-4,6-diphenyl-1,3,5-triazine (abbreviation: mBnfBPTzn-02); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (pyrimidine or pyrazine) skeleton has a high electron-transport property to contribute to a reduction in drive voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting substance, energy can be transferred smoothly and light emission can be obtained efficiently, which is preferable. The use of such a structure is preferable because the drive voltage can also be reduced.

Note that at least one of the materials forming an exciplex may be a phosphorescent substance. In this case, triplet excitation energy can be efficiently converted into singlet excitation energy by reverse intersystem crossing.

In order to form an exciplex efficiently, a material having an electron-transport property and a material having a hole-transport property and a HOMO level higher than or equal to that of the material having an electron-transport property are preferably used in combination. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example.

Alternatively, the formation of an exciplex can be confirmed by a difference in transient response, such as a phenomenon in which the transient PL lifetime of the mixed film has more long lifetime components or has a larger proportion of delayed components than that of each of the materials, observed by comparison of transient photoluminescence (PL) of the material having a hole-transport property, the material having an electron-transport property, and the mixed film of the materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of the materials.

The electron-transport layer 114 contains a substance having an electron-transport property. As the substance having an electron-transport property, it is possible to use any of the above-listed substances having electron-transport properties that can be used as the host material.

The electron mobility of the material included in the electron-transport layer 114 in the case where the square root of the electric field strength [V/cm] is 600 is preferably higher than or equal to $1 \times 10^{-7}$ cm$^2$/Vs and lower than or equal to $5 \times 10^{-5}$ cm$^2$/Vs. The amount of electrons injected into the light-emitting layer can be controlled by the reduction in the electron-transport property of the electron-transport layer 114, whereby the light-emitting layer can be prevented from having excess electrons. The electron-transport layer 114 preferably includes a material having an electron-transport property and an alkali metal, an alkaline earth metal, a compound thereof, or a complex thereof. It is particularly preferable that this structure be employed when the hole-injection layer is formed using a composite material that includes a material having a hole-transport property with a relatively deep HOMO level of −5.7 eV or higher and −5.4 eV or lower, in which case the light-emitting device can have a long lifetime. In this case, the material having an electron-transport property preferably has a HOMO level of −6.0 eV or higher. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof have a 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) of the alkali metal, the alkaline earth metal, the compound, or the complex can also be used. There is preferably a difference in the concentration (including 0) of the alkali metal, the alkaline earth metal, the compound thereof, or the complex thereof in the electron-transport layer in the thickness direction.

A layer containing an alkali metal, an alkaline earth metal, or a compound thereof such as lithium fluoride (LiF), cesium fluoride (CsF), calcium fluoride (CaF$_2$), or 8-hydroxyquinolinato-lithium (Liq) may be provided as the electron-injection layer 115 between the electron-transport layer 114 and the second electrode 102. As the electron-injection layer 115, an electride or a layer that is formed using a substance having an electron-transport property and that includes an alkali metal, an alkaline earth metal, or a compound thereof can be used. Examples of the electride include a substance in which electrons are added at high concentration to calcium oxide-aluminum oxide.

Note that as the electron-injection layer 115, it is possible to use a layer that contains a substance having an electron-transport property (preferably an organic compound having a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, a light-emitting device including the layer can have high external quantum efficiency.

Figure 1B:
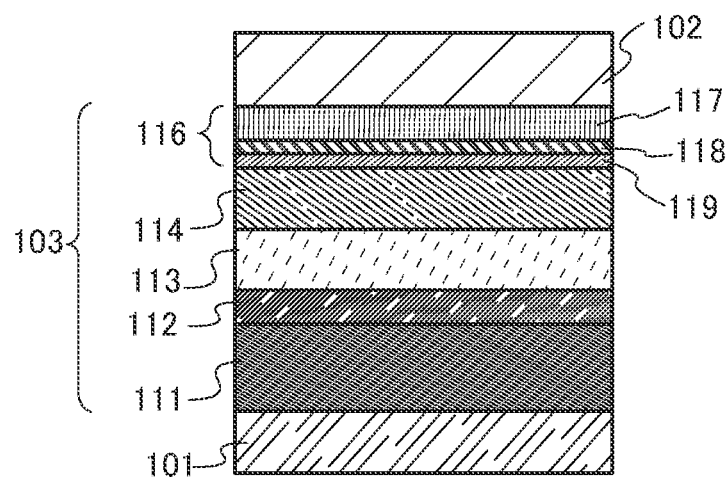

Instead of the electron-injection layer 115, the charge-generation layer 116 may be provided (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the second electrode 102 serving as a cathode; thus, the light-emitting device operates. Since the organic compound of one embodiment of the present invention has a low refractive index, using the organic compound for the p-type layer 117 enables the light-emitting device to have high external quantum efficiency.

Note that the charge-generation layer 116 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the acceptor substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119; for example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the second electrode 102, a metal, an alloy, an electrically conductive compound, or a mixture thereof each having a low work function (specifically, lower than or equal to 3.8 eV) or the like can be used. Specific examples of such a cathode material are elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the second electrode 102 and the electron-transport layer, for the second electrode 102, a variety of conductive materials such as Al, Ag, ITO, or indium oxide-tin oxide containing silicon or silicon oxide can be used regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 1C. This light-emitting device includes a plurality of light-emitting units between an anode and a cathode. One light-emitting unit has substantially the same structure as the EL layer 103 illustrated in FIG. TA. In other words, the light-emitting device illustrated in FIG. TA or 1B includes a single light-emitting unit, and the light-emitting device illustrated in FIG. 1C includes a plurality of light-emitting units.

Figure 1C:
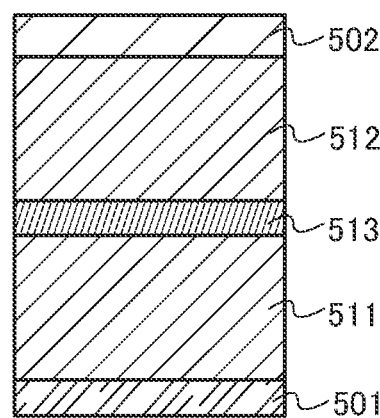

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the first electrode 101 and the second electrode 102 illustrated in FIG. TA, and the materials given in the description for FIG. TA can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 1C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. When a plurality of light-emitting units partitioned by the charge-generation layer 513 are provided between a pair of electrodes as in the light-emitting device of this embodiment, it is possible to provide a long-life device which can emit light with high luminance at a low current density. Alight-emitting apparatus which can be driven at a low voltage and has low power consumption can be provided.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as the whole.

The above-described layers and electrodes such as the EL layer 103, the first light-emitting unit 511, the second light-emitting unit 512, and the charge-generation layer 513 can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus including the light-emitting device described in Embodiment 2 is described.

Figure 2A:
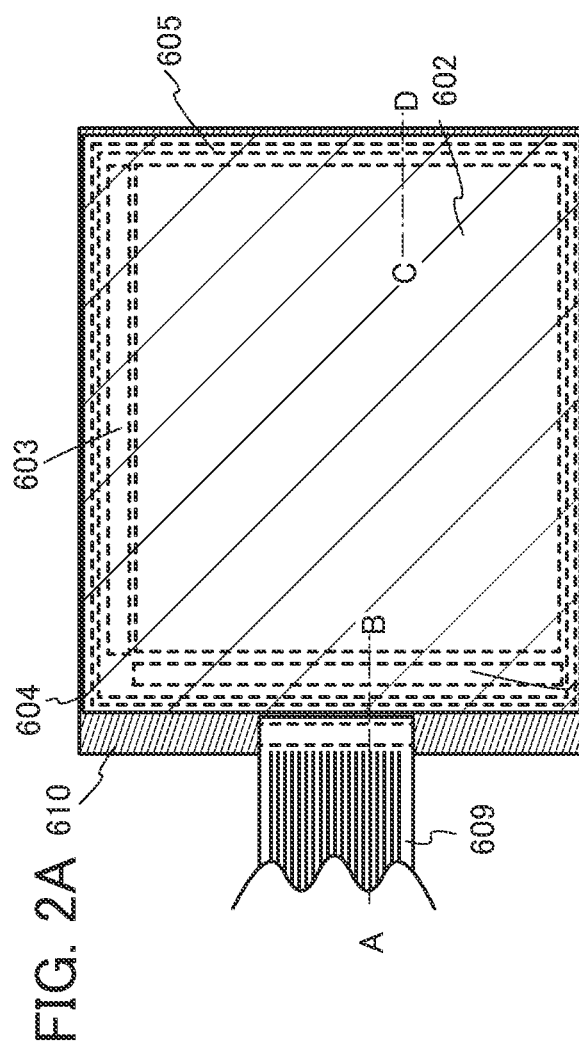
FIGS. 2A and 2B are conceptual views of an active matrix light-emitting apparatus.
Figure 2B:
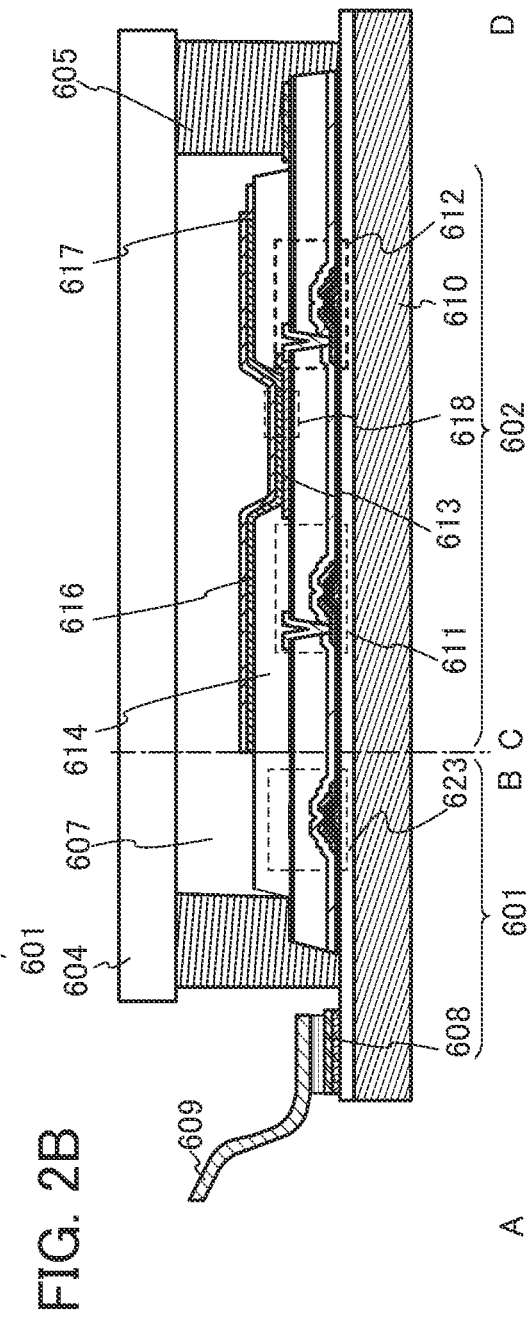

In this embodiment, the light-emitting apparatus manufactured using the light-emitting device described in Embodiment 2 is described with reference to FIGS. 2A and 2B. Note that FIG. 2A is a top view of the light-emitting apparatus and FIG. 2B is a cross-sectional view taken along the lines A-B and C-D in FIG. 2A. This light-emitting apparatus includes a driver circuit portion (source line driver circuit) 601, a pixel portion 602, and a driver circuit portion (gate line driver circuit) 603, which are to control light emission of alight-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), poly(vinyl fluoride) (PVF), polyester, or acrylic resin.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where positive photosensitive acrylic resin is used as a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 2. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in Embodiment 2. In the light-emitting apparatus of this embodiment, the pixel portion, which includes a plurality of light-emitting devices, may include both the light-emitting device described in Embodiment 2 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastic (FRP), poly(vinyl fluoride) (PVF), polyester, and acrylic resin can be used.

Although not illustrated in FIGS. 2A and 2B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus manufactured using the light-emitting device described in Embodiment 2 can be obtained.

The light-emitting apparatus in this embodiment is manufactured using the light-emitting device described in Embodiment 2 and thus can have favorable characteristics. Specifically, since the light-emitting device described in Embodiment 2 has high emission efficiency, the light-emitting apparatus can achieve low power consumption.

FIGS. 3A and 3B each illustrate an example of a light-emitting apparatus in which full color display is achieved by formation of a light-emitting device exhibiting white light emission and with the use of coloring layers (color filters) and the like. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition 1025, an EL layer 1028, a second electrode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. Since the light that does not pass through the coloring layers is white and the light that passes through any one of the coloring layers is red, green, or blue, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
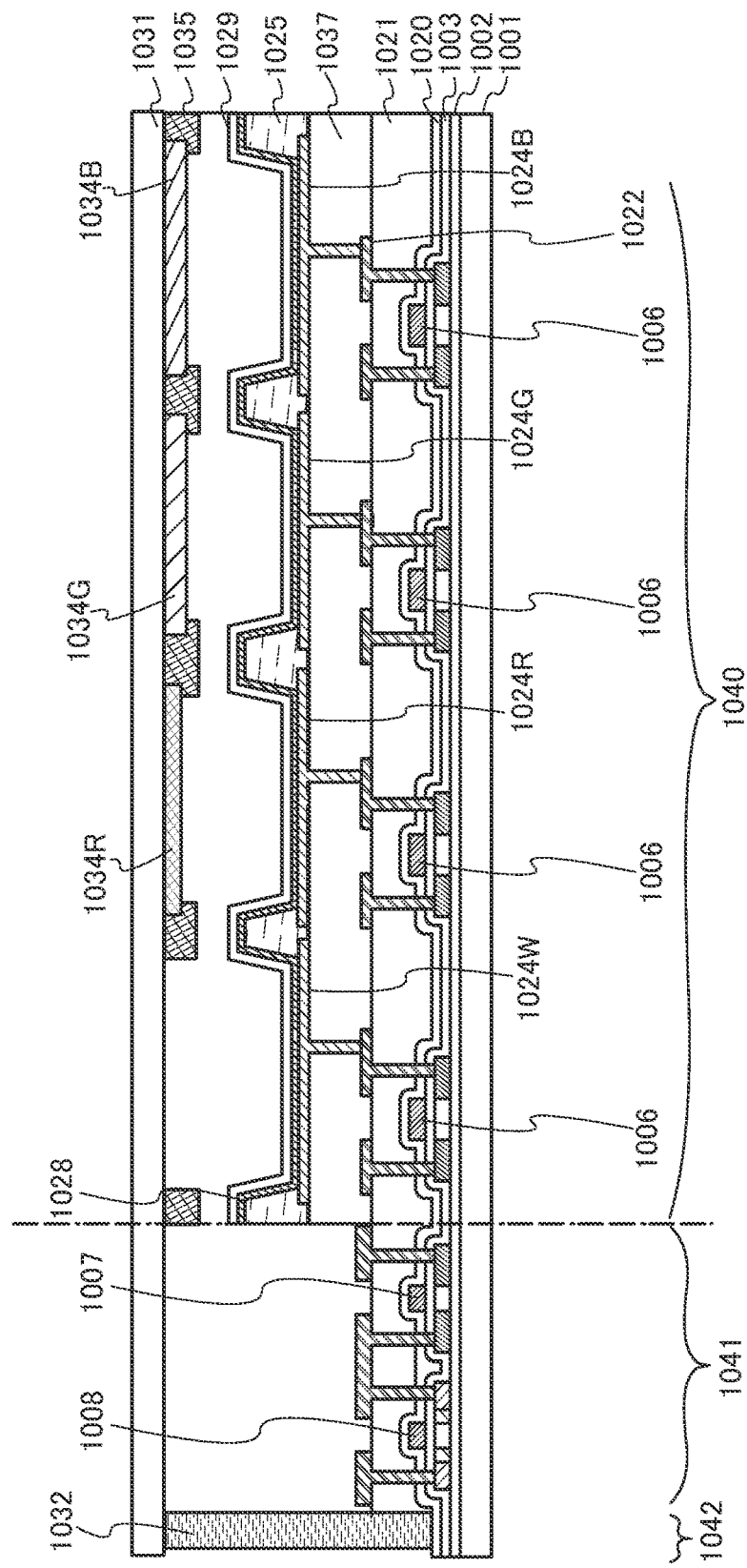
FIG. 4 is a conceptual view of an active matrix light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 4 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover the electrode 1022. This insulating film may have a planarization function. The third interlayer insulating film 1037 can be formed using a material similar to that of the second interlayer insulating film, and can alternatively be formed using any of other known materials.

The first electrodes 1024W, 1024R, 1024G, and 1024B of the light-emitting devices each serve as an anode here, but may serve as a cathode. Furthermore, in the case of a light-emitting apparatus having a top emission structure as illustrated in FIG. 4, the first electrodes are preferably reflective electrodes. The EL layer 1028 is formed to have a structure similar to the structure of the EL layer 103, which is described in Embodiment 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix 1035 may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with the use of a reflective electrode as the first electrode and a transflective electrode as the second electrode. The light-emitting device with a microcavity structure includes at least an EL layer between the reflective electrode and the transflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiment 2 and thus can have favorable characteristics. Specifically, since the light-emitting device described in Embodiment 2 has high emission efficiency, the light-emitting apparatus can achieve low power consumption.

Figure 5A:
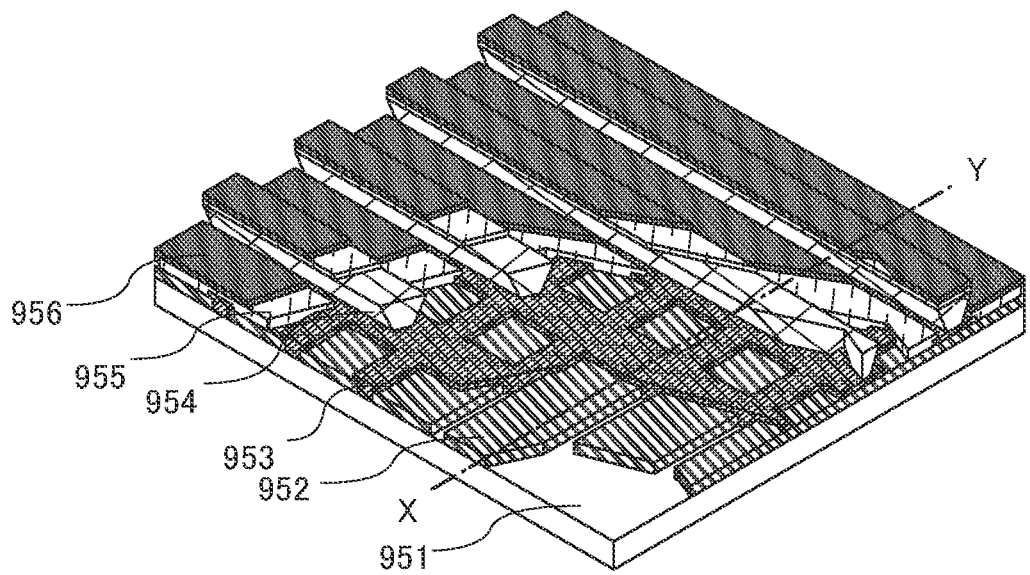
FIGS. 5A and 5B are conceptual views of a passive matrix light-emitting apparatus.
Figure 5B:
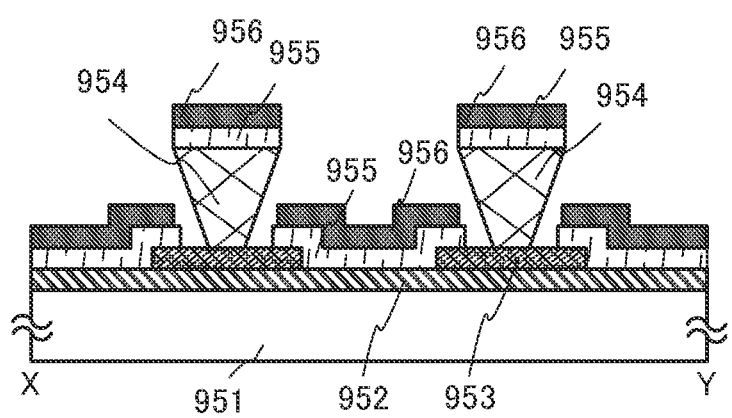

An active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in Embodiment 2; thus, the light-emitting apparatus can have high reliability or low power consumption.

In the light-emitting apparatus described above, many minute light-emitting devices arranged in a matrix can each be controlled; thus, the light-emitting apparatus can be suitably used as a display device for displaying images.

This embodiment can be freely combined with any of the other embodiments.

Embodiment 4

Figure 6A:
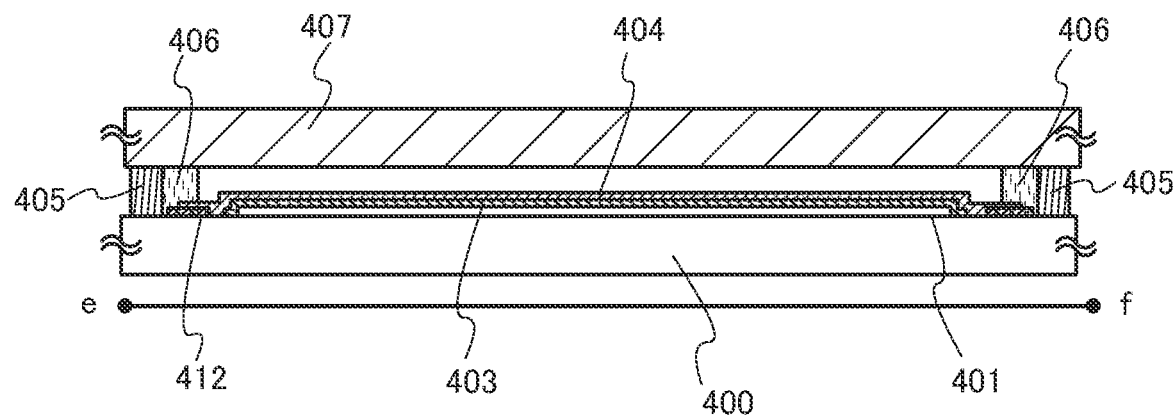
FIGS. 6A and 6B illustrate a lighting device.
Figure 6B:
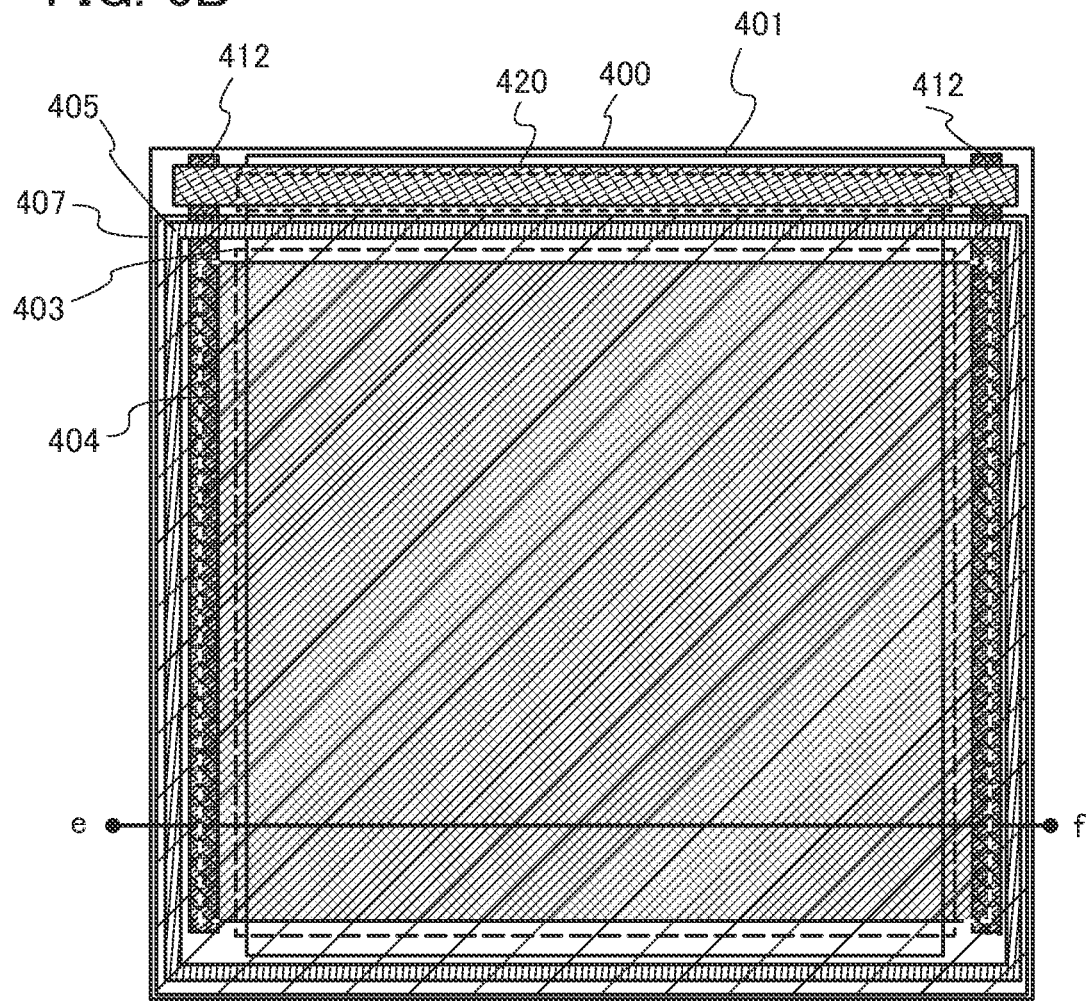

In this embodiment, an example in which the light-emitting device described in Embodiment 2 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, a first electrode 401 is formed over a substrate 400 which is a support with a light-transmitting property. The first electrode 401 corresponds to the first electrode 101 in Embodiment 2. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 2, or the structure in which the light-emitting units 511 and 512 and the charge-generation layer 513 are combined. Refer to the descriptions for the structure.

The second electrode 404 is formed to cover the EL layer 403. The second electrode 404 corresponds to the second electrode 102 in Embodiment 2. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can have low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting device described in Embodiment 2; thus, the lighting device can have low power consumption.

Embodiment 5

In this embodiment, examples of electronic devices each including the light-emitting device described in Embodiment 2 will be described. The light-emitting device described in Embodiment 2 has high emission efficiency and low power consumption. As a result, the electronic devices described in this embodiment can each include a light-emitting portion having low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiment 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiment 2 and arranged in a matrix in the display portion 7203. The computer illustrated in FIG. 7B1 may have a structure illustrated in FIG. 7B2. A computer illustrated in FIG. 7B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 7C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiment 2 and arranged in a matrix.

When the display portion 7402 of the portable terminal illustrated in FIG. 7C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Figure 8A:
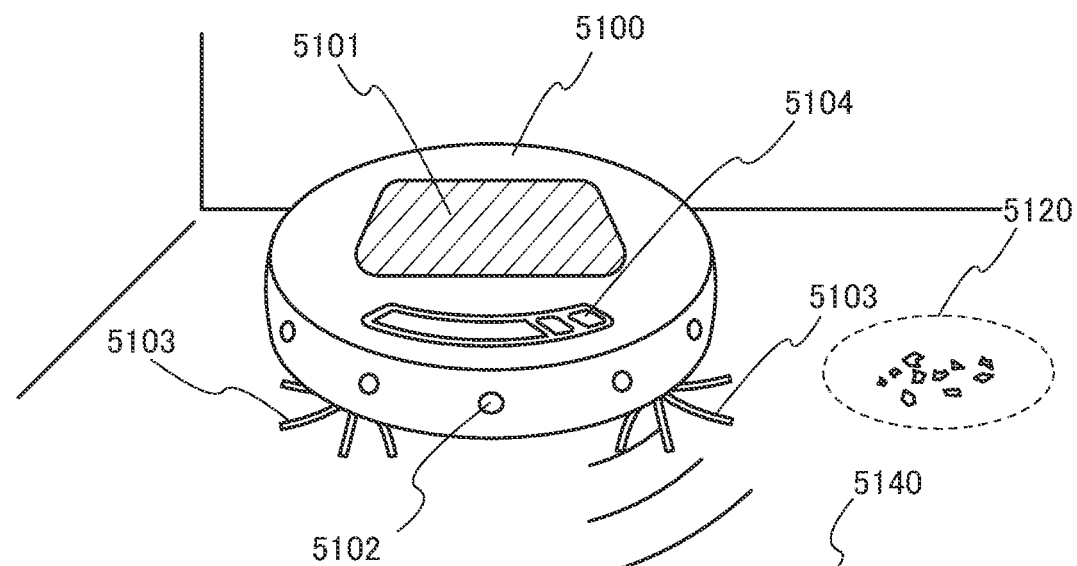
FIGS. 8A, 8B, and 8C illustrate electronic devices.

FIG. 8A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 8B:
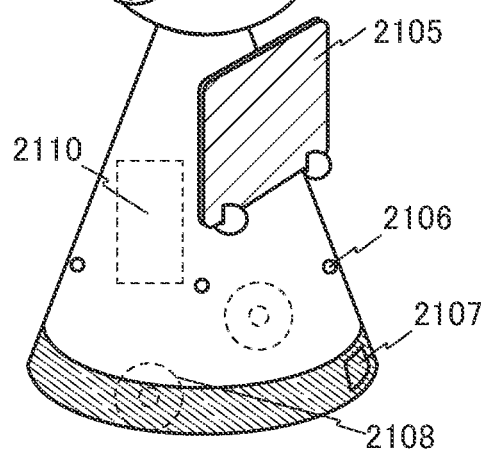

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
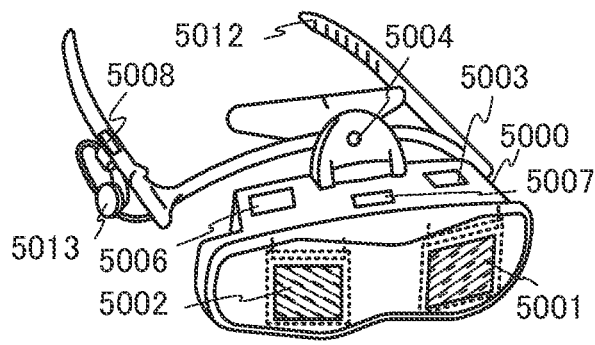

FIG. 8C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 9:
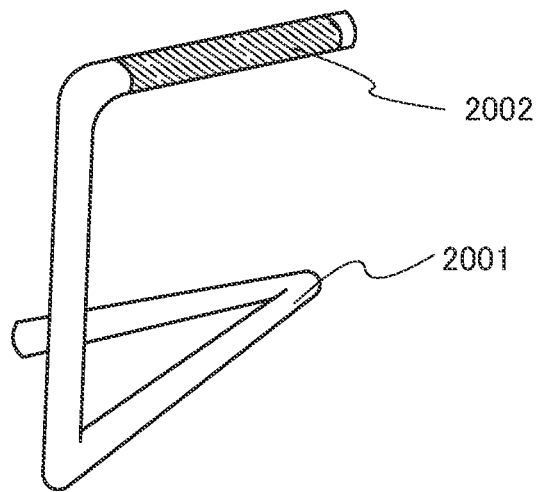
FIG. 9 illustrates a lighting device.

FIG. 9 illustrates an example in which the light-emitting device described in Embodiment 2 is used for a table lamp which is a lighting device. The table lamp illustrated in FIG. 9 includes a housing 2001 and a light source 2002, and the lighting device described in Embodiment 3 may be used for the light source 2002.

Figure 10:
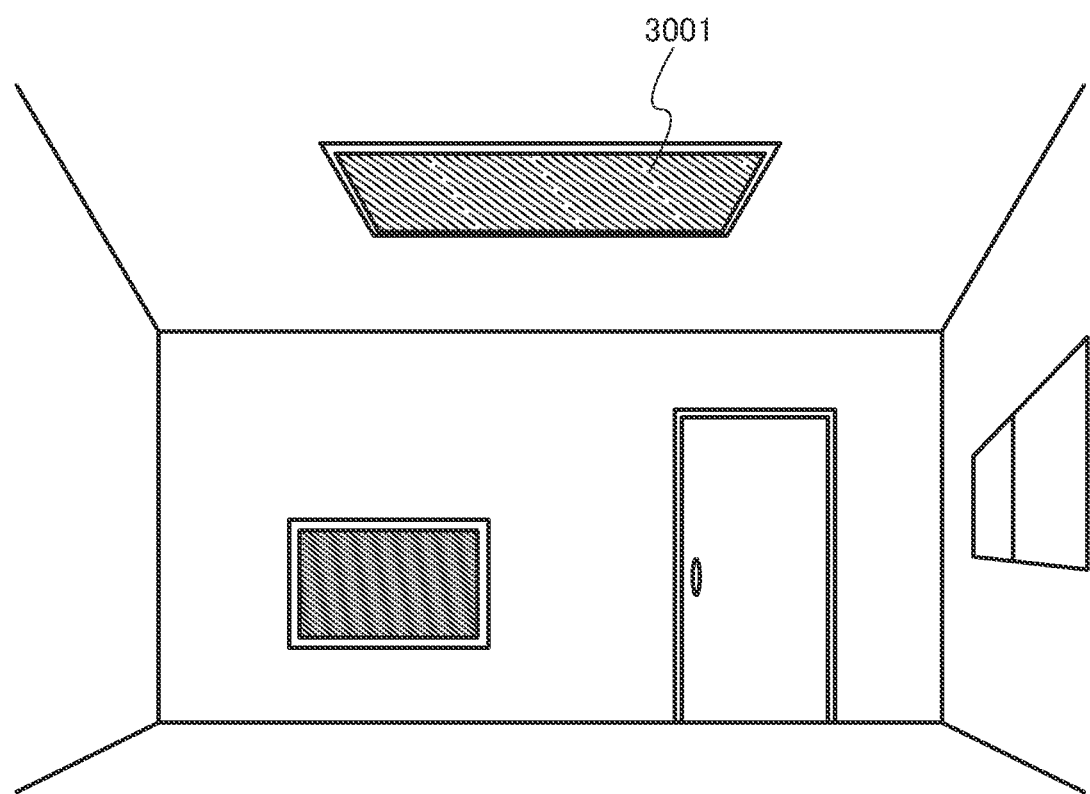
FIG. 10 illustrates a lighting device.

FIG. 10 illustrates an example in which the light-emitting device described in Embodiment 2 is used for an indoor lighting device 3001. Since the light-emitting device described in Embodiment 2 has high emission efficiency, the lighting device can have low power consumption. Furthermore, since the light-emitting device described in Embodiment 2 can have a large area, the light-emitting device can be used for a large-area lighting device. Furthermore, since the light-emitting device described in Embodiment 2 is thin, the light-emitting device can be used for a lighting device having a reduced thickness.

Figure 11:
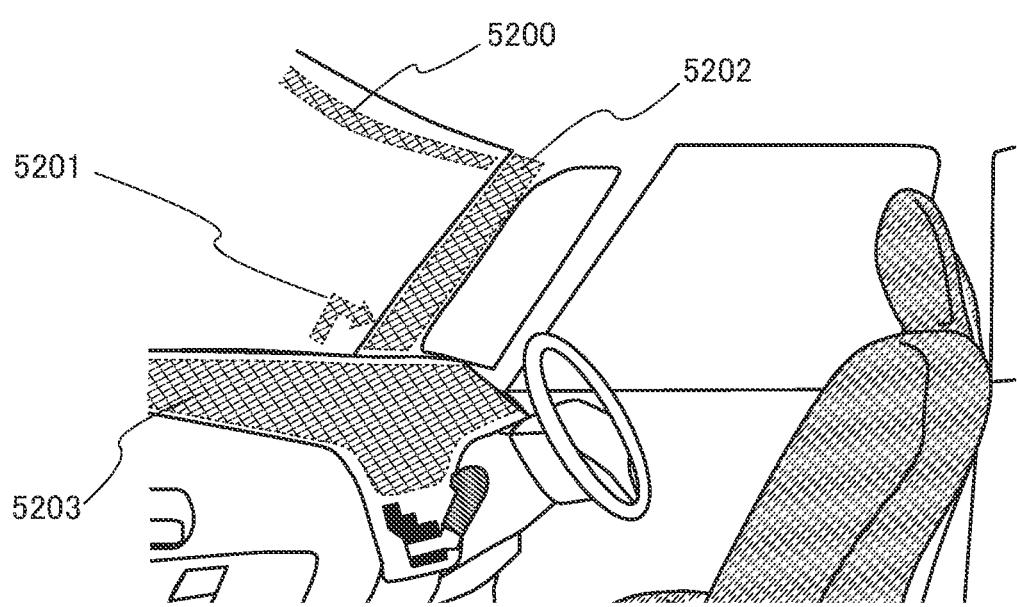
FIG. 11 illustrates in-vehicle display devices and lighting devices.

The light-emitting device described in Embodiment 2 can also be used for an automobile windshield, an automobile dashboard, or the like. FIG. 11 illustrates one mode in which the light-emitting devices described in Embodiment 2 are used for an automobile windshield and an automobile dashboard. Display regions 5200 to 5203 each include the light-emitting device described in Embodiment 2.

The display regions 5200 and 5201 are display devices which are provided in the automobile windshield and include the light-emitting device described in Embodiment 2. The light-emitting device described in Embodiment 2 can be formed into what is called a see-through display device, through which the opposite side can be seen, by including a first electrode and a second electrode formed of light-transmitting electrodes. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and includes the light-emitting device described in Embodiment 2. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information such as navigation data, speed, the number of revolutions, and the like. The content or layout of the display can be changed freely by a user as appropriate. Note that such information can also be displayed on the display regions 5200 to 5202. The display regions 5200 to 5203 can also be used as lighting devices.

Figure 12A:
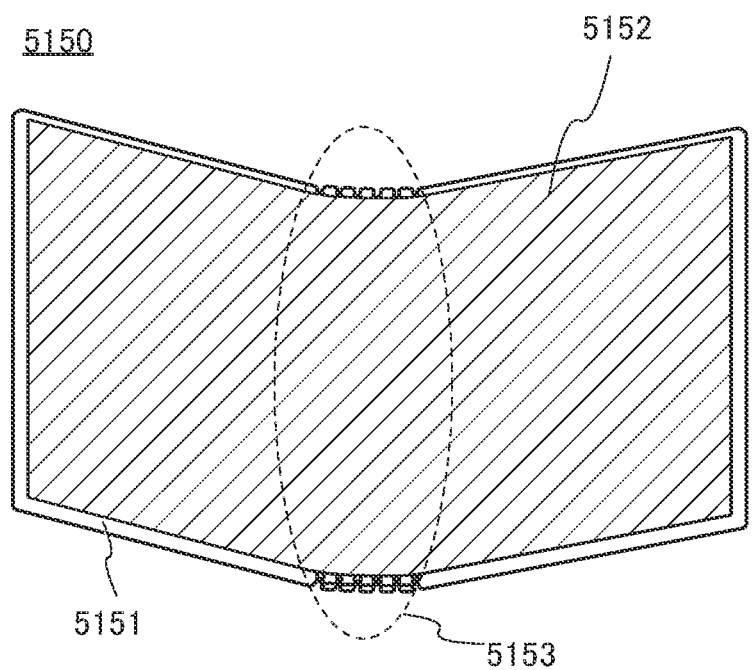
FIGS. 12A and 12B illustrate an electronic device.
Figure 12B:
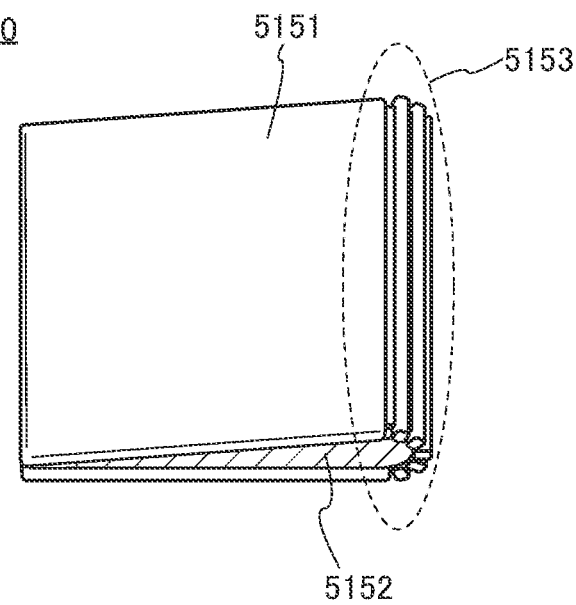

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 13A:
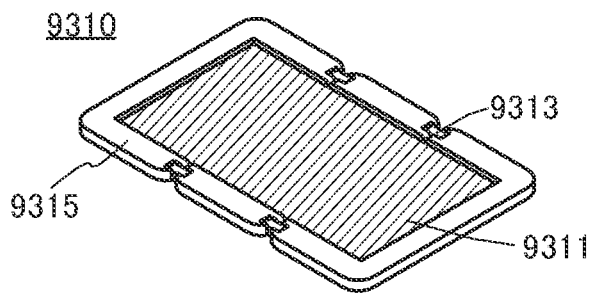
FIGS. 13A, 13B, and 13C illustrate an electronic device.
Figure 13B:
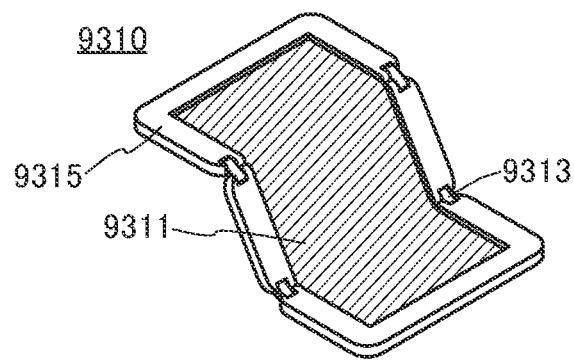
Figure 13C:
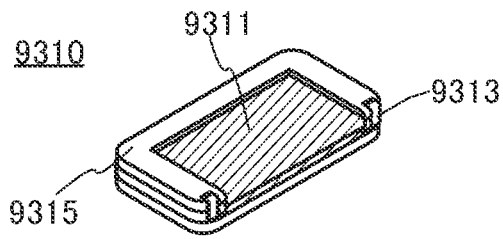

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structure described in this embodiment can be combined with any of the structures described in Embodiments 1 to 4 as appropriate.

As described above, the application range of the light-emitting apparatus including the light-emitting device described in Embodiment 2 is wide so that this light-emitting apparatus can be applied to electronic devices in a variety of fields. By using the light-emitting device described in Embodiment 2, an electronic device with low power consumption can be obtained.

Example 1

Synthesis Example 1

In this synthesis example, a synthesis method of bis{4,6-dimethyl-2-[5-(5-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-m5CP)$_2$(debm)]), which is the organometallic complex of one embodiment of the present invention represented by Structure Formula (100) in Embodiment 1, is specifically described. The structure formula of [Ir(dmdppr-m5CP)$_2$(debm)] is shown below.

[Chemical Formula 19]

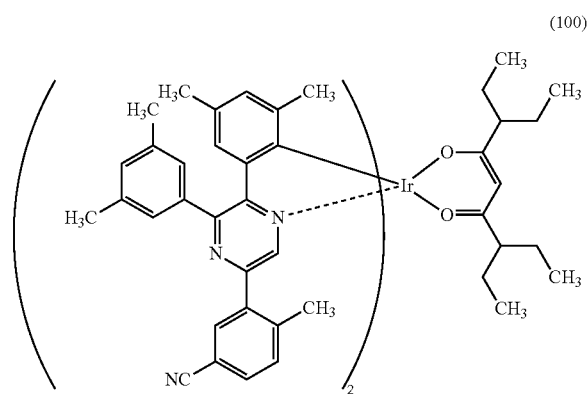

(100)

Step 1; Synthesis of bis{4,6-dimethyl-2-[5-(5-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-m5CP)$_2$(debm)])

First, 32 mL of 2-ethoxyethanol, 2.33 g of di-μ-chloro-tetrakis{4,6-dimethyl-2-[5-(5-cyano-2-methylphenyl)-3-(3,5-dimethylphenyl)-2-pyrazinyl-κN]phenyl-κC}diiridium(III) (abbreviation: [Ir(dmdppr-m5CP)$_2$Cl]$_2$), 0.72 g of 3,7-diethylnonane-4,6-dione (abbreviation: Hdebm), and 1.22 g of sodium carbonate were put into a recovery flask equipped with a reflux pipe, and the atmosphere in the flask was replaced with argon. After that, the mixture was irradiated with microwaves (2.45 GHz, 100 W) for two hours to cause a reaction. The solvent was distilled off, the obtained residue was purified by silica gel column chromatography using dichloromethane as a developing solvent, and then recrystallization was performed with a mixed solvent of dichloromethane and methanol to give 1.39 g of the organometallic complex of the present invention, [Ir(dmdppr-m5CP)$_2$(debm)], as a red solid in a yield of 51%. By a train sublimation method, 1.33 g of the obtained red solid was purified. In the purification by sublimation, the solid was heated at 315° C. under a pressure of 2.6 Pa with an argon gas flow rate of 10.5 mL/min. After the purification by sublimation, 1.13 g of the target red solid was obtained in a yield of 81%. The synthesis scheme of Step 1 is shown below.

[Chemical Formula 20]

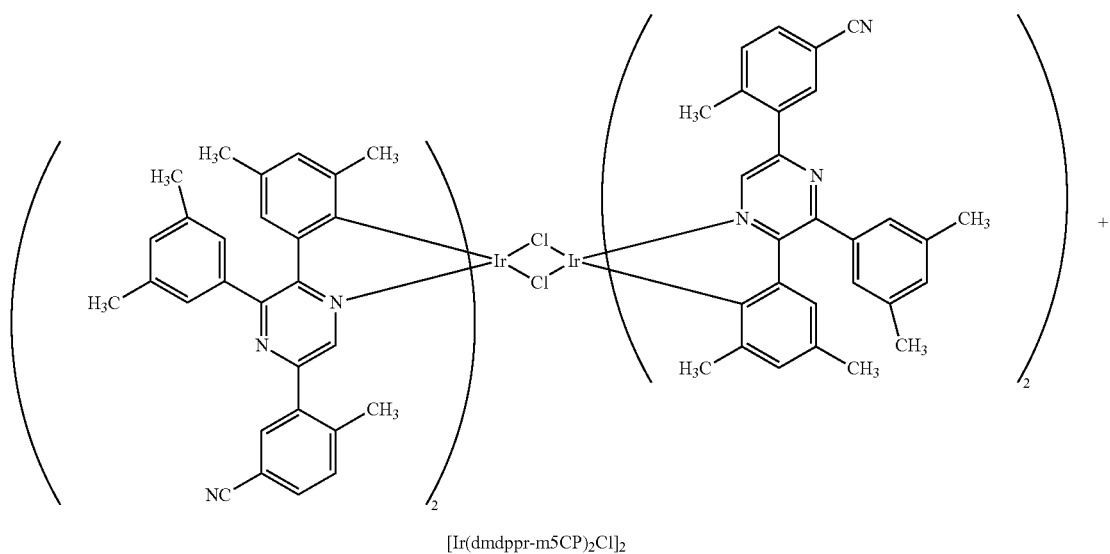

[Ir(dmdppr-m5CP)$_2$Cl]$_2$

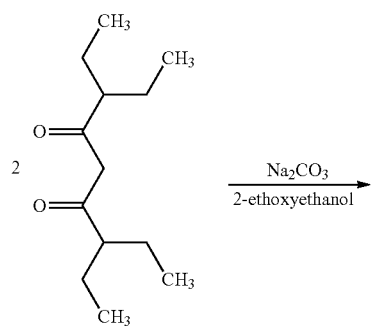
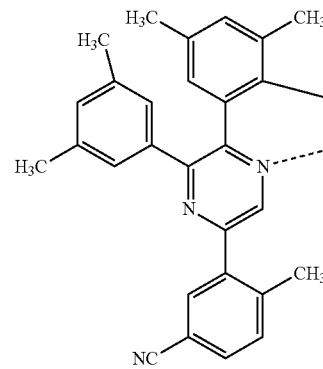

[Ir(dmdppr-m5CP)₂(debm)]

Figure 14:
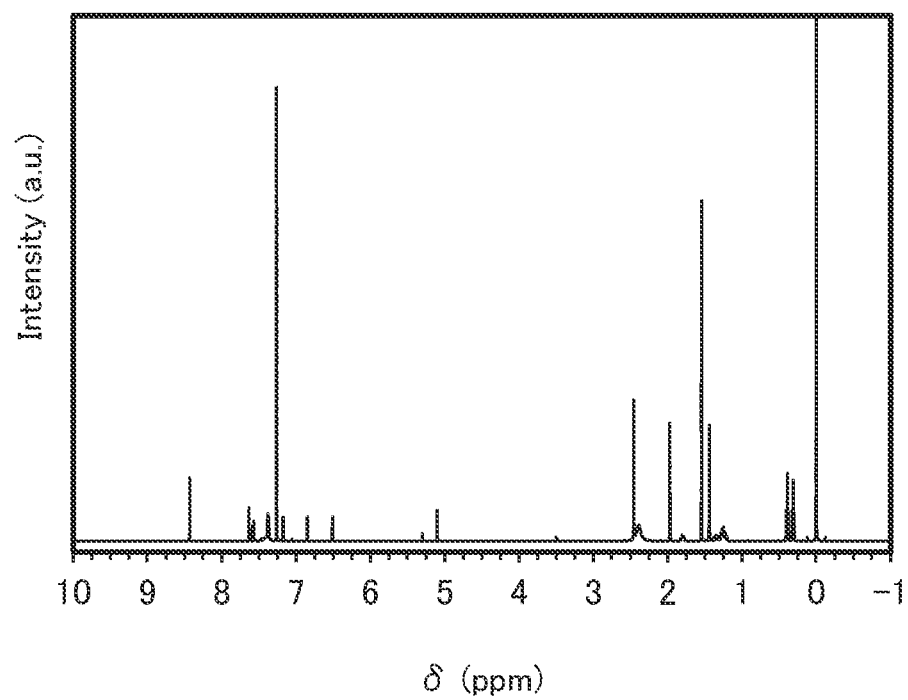
FIG. 14 is a $^1$H-NMR chart of [Ir(dmdppr-m5CP)$_2$(debm)]

Analysis results by nuclear magnetic resonance spectroscopy ($^1$H-NMR) of the red solid obtained in Step 1 are shown below. FIG. 14 is the $^1$H-NMR chart. These results revealed that the organometallic complex of the present invention, [Ir(dmdppr-m5CP)₂(debm)], was obtained in this synthesis example.

$^1$H-NMR. δ (CDCl₃): 0.31 (t, 6H), 0.39 (t, 6H), 1.19-1.29 (m, 6H), 1.30-1.38 (m, 2H), 1.44 (s, 6H), 1.77-1.83 (m, 2H), 1.97 (s, 6H), 2.39 (s, 12H), 2.45 (s, 6H), 5.10 (s, 1H), 6.51 (s, 2H), 6.85 (s, 2H), 7.18 (s, 2H), 7.37-7.44 (m, 6H), 7.58 (d, 2H), 7.63 (s, 2H), 8.43 (s, 2H).

Figure 15:
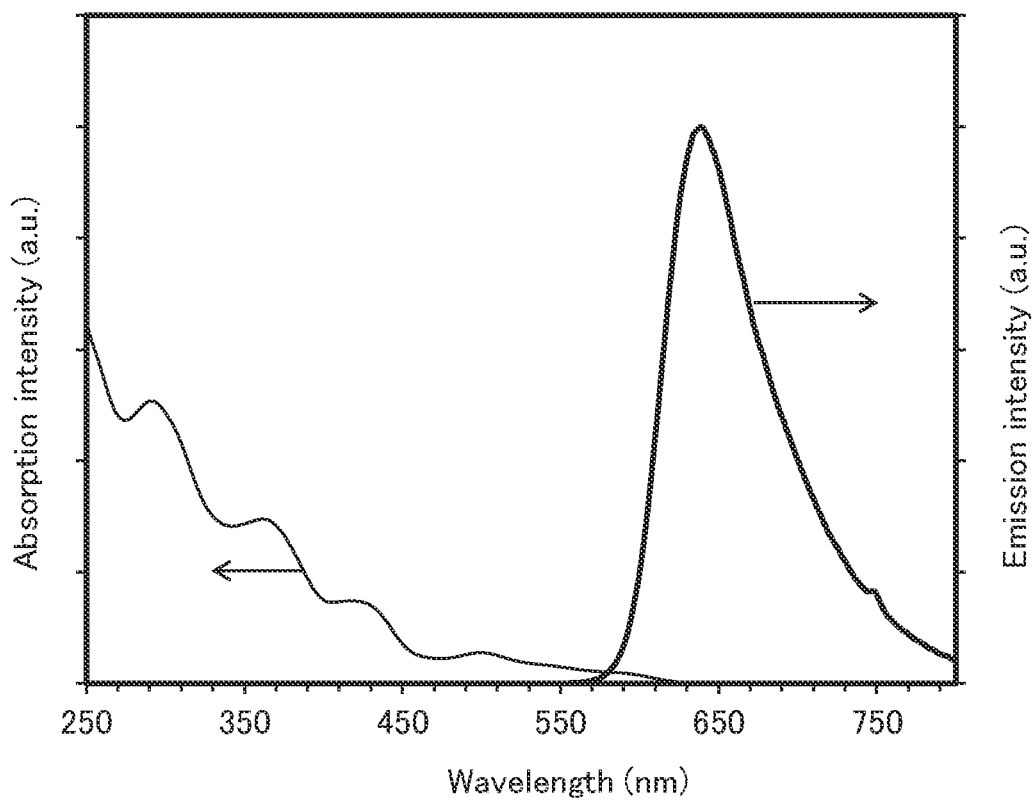
FIG. 15 shows an absorption spectrum and an emission spectrum of [Ir(dmdppr-m5CP)$_2$(debm)] in a solution.

FIG. 15 shows measurement results of an absorption spectrum and an emission spectrum of [Ir(dmdppr-m5CP)₂(debm)] in a dichloromethane solution. The absorption spectrum of [Ir(dmdppr-m5CP)₂(debm)] in the dichloromethane solution was measured with an ultraviolet-visible light spectrophotometer (V550, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 15 shows that [Ir(dmdppr-m5CP)₂(debm)] in the dichloromethane solution has an absorption peak at 595 nm and an emission wavelength peak at 639 nm (excitation wavelength: 500 nm). These results indicate that [Ir(dmdppr-m5CP)₂(debm)] emits red light and can be used as a light-emitting substance.

Example 2

Synthesis Example 2

In this synthesis example, a synthesis method of bis{4,6-dimethyl-2-[5-(3-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-m3CP)₂(debm)]), which is the organometallic complex of one embodiment of the present invention represented by Structure Formula (101) in Embodiment 1, is specifically described. The structure formula of [Ir(dmdppr-m3CP)₂(debm)] is shown below.

[Chemical Formula 21]

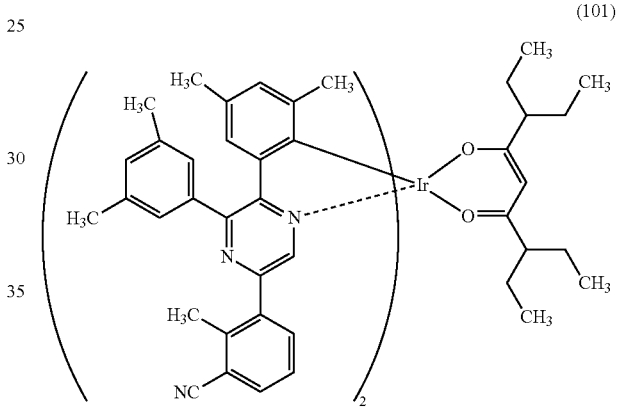

(101)

Step 1; Synthesis of bis{4,6-dimethyl-2-[5-(3-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-m3CP)₂(debm)])

First, 20 mL of 2-ethoxyethanol, 1.37 g of di-μ-chloro-tetrakis{4,6-dimethyl-2-[5-(3-cyano-2-methylphenyl)-3-(3,5-dimethylphenyl)-2-pyrazinyl-κN]phenyl-κC}diiridium (III) (abbreviation: [Ir(dmdppr-m3CP)₂Cl]₂), 0.44 g of 3,7-diethylnonane-4,6-dione (abbreviation: Hdebm), and 0.72 g of sodium carbonate were put into a recovery flask equipped with a reflux pipe, and the atmosphere in the flask was replaced with argon. After that, the mixture was irradiated with microwaves (2.45 GHz, 100 W) for two hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.81 g of the organometallic complex of the present invention, [Ir(dmdppr-m3CP)₂(debm)], as a red solid in a yield of 51%. By a train sublimation method, 0.80 g of the obtained red solid was purified. In the purification by sublimation, the solid was heated at 320° C. under a pressure of 2.7 Pa with an argon gas flow rate of 10.5 mL/min. After the purification by sublimation, 0.36 g of the target red solid was obtained in a yield of 45%. The synthesis scheme of Step 1 is shown below.

[Chemical Formula 22]

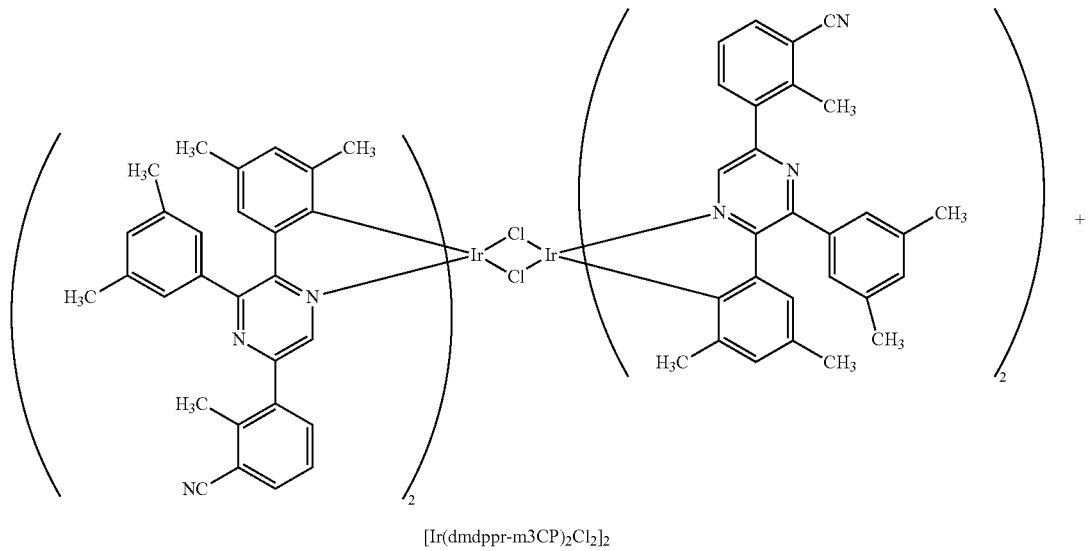

[Ir(dmdppr-m3CP)₂Cl₂]₂

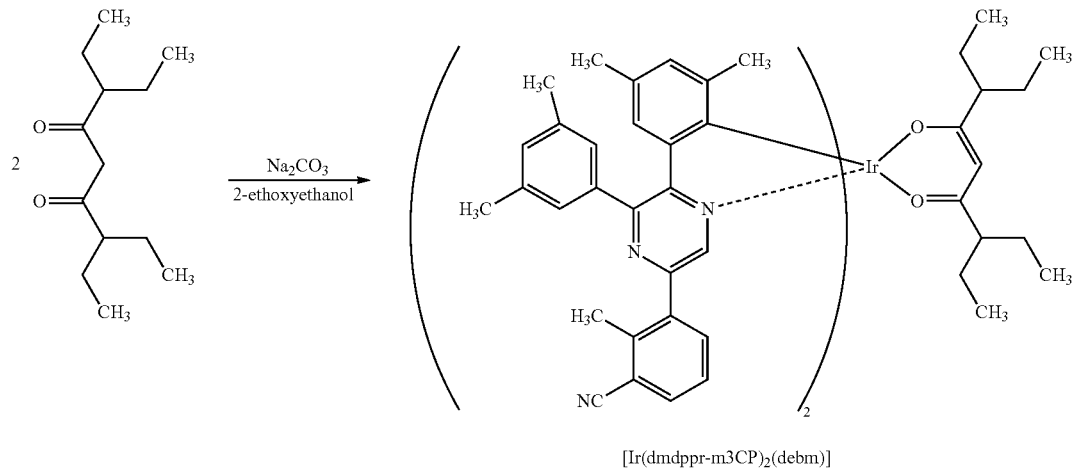

[Ir(dmdppr-m3CP)₂(debm)]

Figure 16:
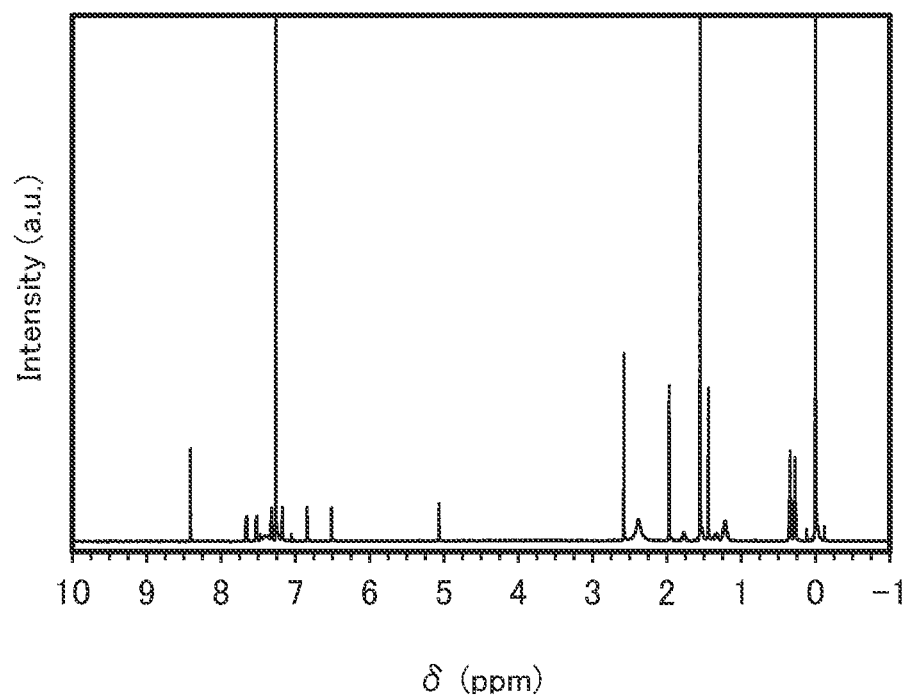
FIG. 16 is a $^1$H-NMR chart of [Ir(dmdppr-m3CP)$_2$(debm)]

Analysis results by nuclear magnetic resonance spectroscopy ($^1$H-NMR) of the red solid obtained in Step 1 are shown below. FIG. 16 is the $^1$H-NMR chart. These results revealed that the organometallic complex of the present invention, [Ir(dmdppr-m3CP)₂(debm)], was obtained in this synthesis example.

$^1$H-NMR. δ (CDCl₃): 0.28 (t, 6H), 0.34 (t, 6H), 1.17-1.25 (m, 6H), 1.31-1.37 (m, 2H), 1.44 (s, 6H), 1.74-1.79 (m, 2H), 1.97 (s, 6H), 2.38 (s, 12H), 2.58 (s, 6H), 5.06 (s, 1H), 6.51 (s, 2H), 6.84 (s, 2H), 7.17 (s, 2H), 7.31 (t, 2H), 7.40 (s, 4H), 7.53 (d, 2H), 7.66 (d, 2H), 8.41 (s, 2H).

Figure 17:
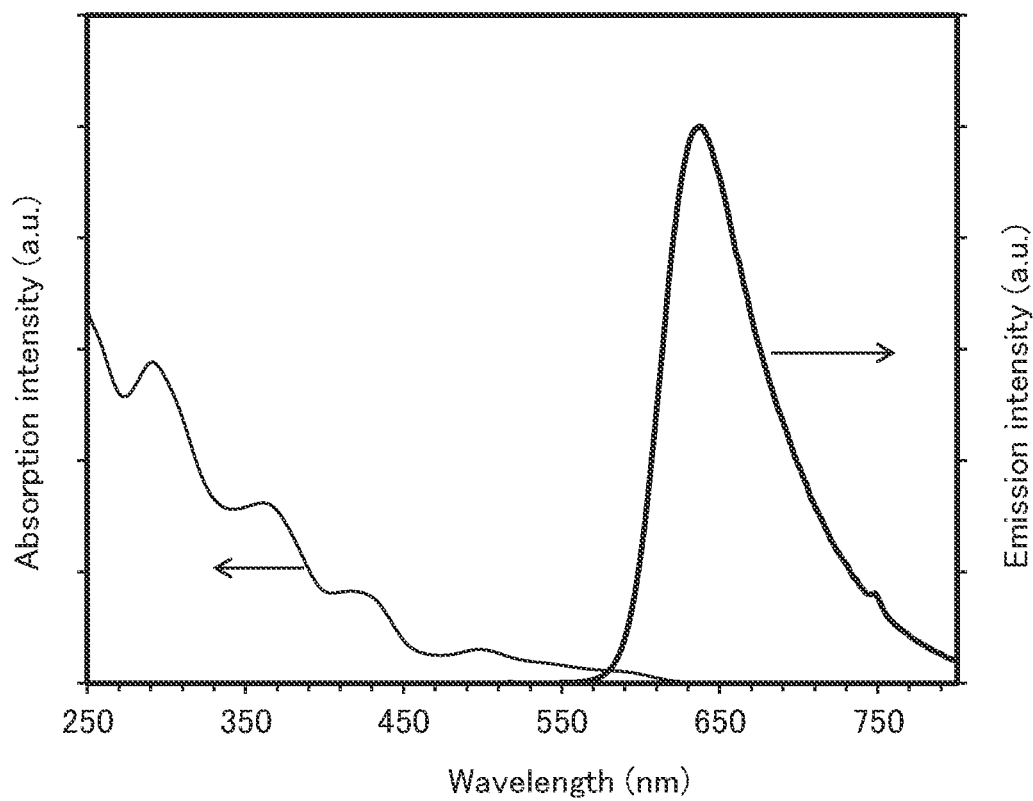
FIG. 17 shows an absorption spectrum and an emission spectrum of [Ir(dmdppr-m3CP)$_2$(debm)] in a solution.

FIG. 17 shows measurement results of an absorption spectrum and an emission spectrum of [Ir(dmdppr-m3CP)₂(debm)] in a dichloromethane solution. The absorption spectrum of [Ir(dmdppr-m3CP)₂(debm)] in the dichloromethane solution was measured with an ultraviolet-visible light spectrophotometer (V550, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 17 shows that [Ir(dmdppr-m3CP)₂(debm)] in the dichloromethane solution has an absorption peak at 590 nm and an emission wavelength peak at 638 nm (excitation wavelength: 500 nm). These results indicate that [Ir(dmdppr-m3CP)₂(debm)] emits red light and can be used as a light-emitting substance.

Example 3

Synthesis Example 3

In this synthesis example, a synthesis method of bis{4,6-dimethyl-2-[5-(4-cyano-2,5-dimethylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-25dmCP)₂(debm)]), which is the organometallic complex of the present invention represented by Structure Formula (102) in Embodiment 1, is specifically described. The structure formula of [Ir(dmdppr-25dmCP)$_2$(debm)] is shown below.

[Chemical Formula 23]

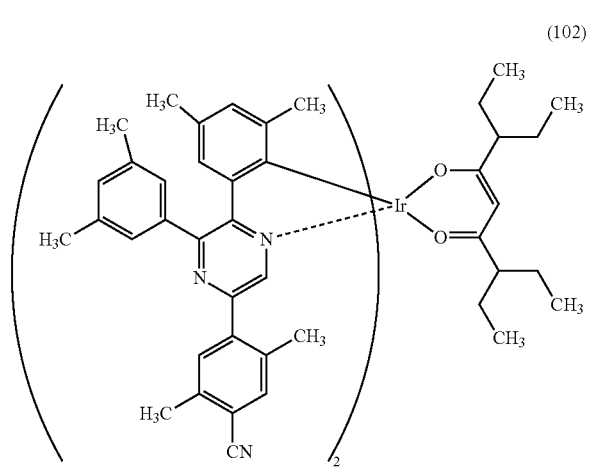

<Step 1; Synthesis of bis{4,6-dimethyl-2-[5-(4-cyano-2,5-dimethylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-25dmCP)$_2$(debm)])>

First, 20 mL of 2-ethoxyethanol, 1.64 g of di-μ-chloro-tetrakis{4,6-dimethyl-2-[5-(4-cyano-2,5-dimethylphenyl)-3-(3,5-dimethylphenyl)-2-pyrazinyl-κN]phenyl-κC}diiridium(III) (abbreviation: [Ir(dmdppr-25dmCP)$_2$Cl]$_2$), 0.49 g of 3,7-diethylnonane-4,6-dione (abbreviation: Hdebm), and 0.82 g of sodium carbonate were put into a recovery flask equipped with a reflux pipe, and the atmosphere in the flask was replaced with argon. After that, the mixture was irradiated with microwaves (2.45 GHz, 100 W) for two hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 1.16 g of the organometallic complex of the present invention, [Ir(dmdppr-25dmCP)$_2$(debm)], as a deep red solid in a yield of 61%. By a train sublimation method, 1.14 g of the obtained deep red solid was purified. In the purification by sublimation, the solid was heated at 308° C. under a pressure of 2.6 Pa with an argon gas flow rate of 10.5 mL/min. After the purification by sublimation, 0.85 g of the target deep red solid was obtained in a yield of 75%. The synthesis scheme of Step 1 is shown below.

[Chemical Formula 24]

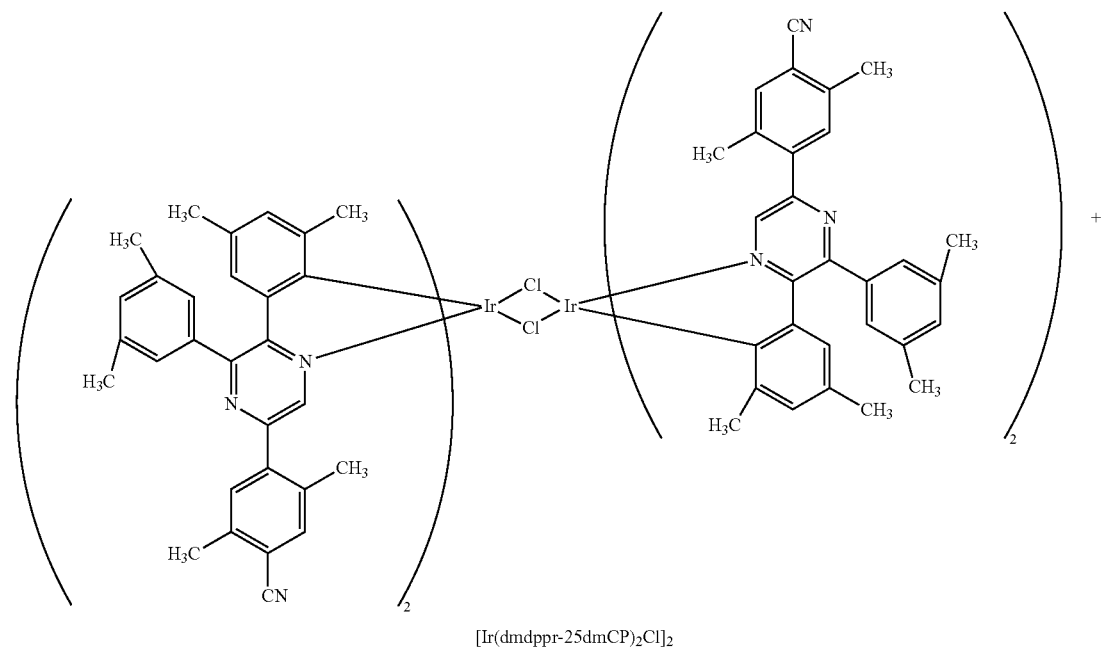

[Ir(dmdppr-25dmCP)$_2$Cl]$_2$

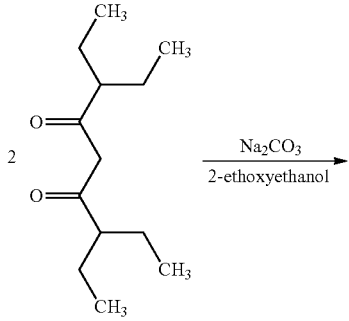
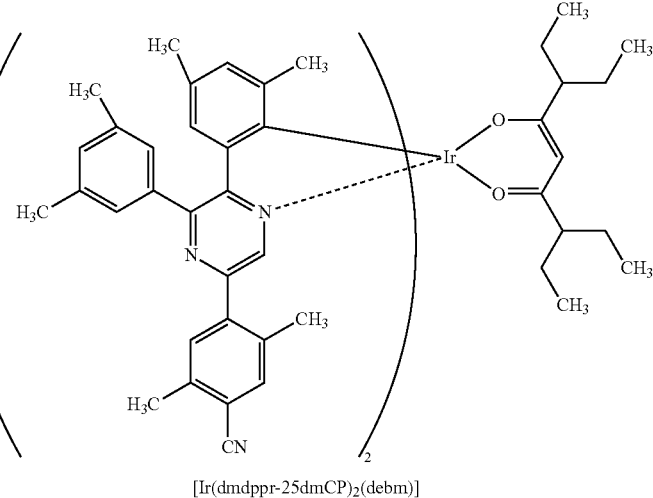

[Ir(dmdppr-25dmCP)₂(debm)]

Figure 18:
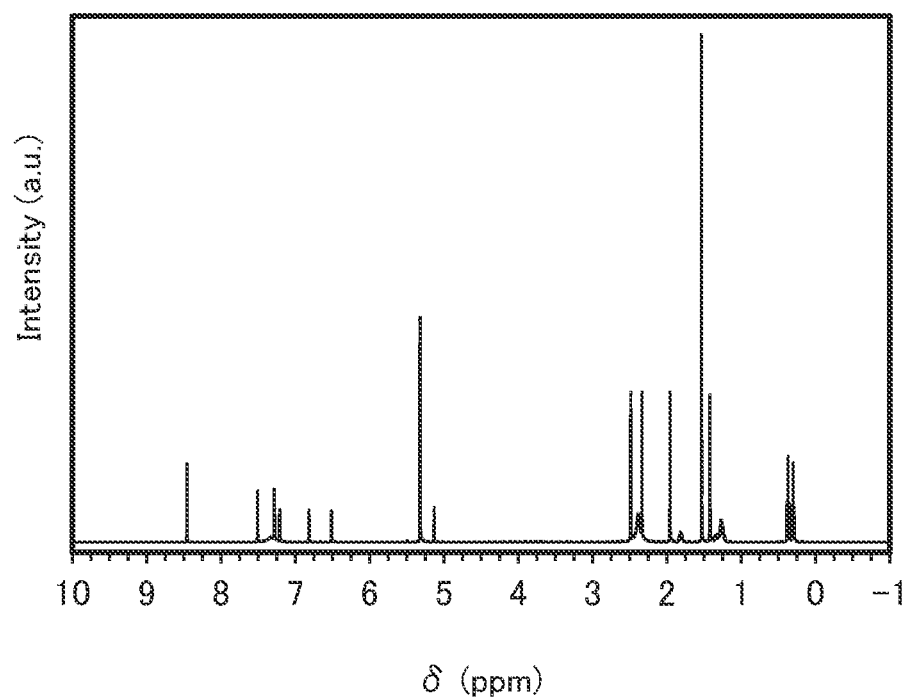
FIG. 18 is a $^1$H-NMR chart of [Ir(dmdppr-25dmCP)$_2$(debm)]

Analysis results by nuclear magnetic resonance spectroscopy (¹H-NMR) of the deep red solid obtained in Step 1 are shown below. FIG. 18 is the ¹H-NMR chart. These results revealed that the organometallic complex of the present invention, [Ir(dmdppr-25dmCP)₂(debm)], was obtained in this synthesis example.

¹H-NMR. δ (CD₂Cl₂): 0.30 (t, 6H), 0.37 (t, 6H), 1.21-1.37 (m, 8H), 1.42 (s, 6H), 1.79-1.83 (m, 2H), 1.96 (s, 6H), 2.32-2.46 (m, 18H), 2.49 (s, 6H), 5.13 (s, 1H), 6.51 (s, 2H), 6.81 (s, 2H), 7.21 (s, 2H), 7.20-7.39 (m, 6H), 7.51 (s, 2H), 8.46 (s, 2H).

Figure 19:
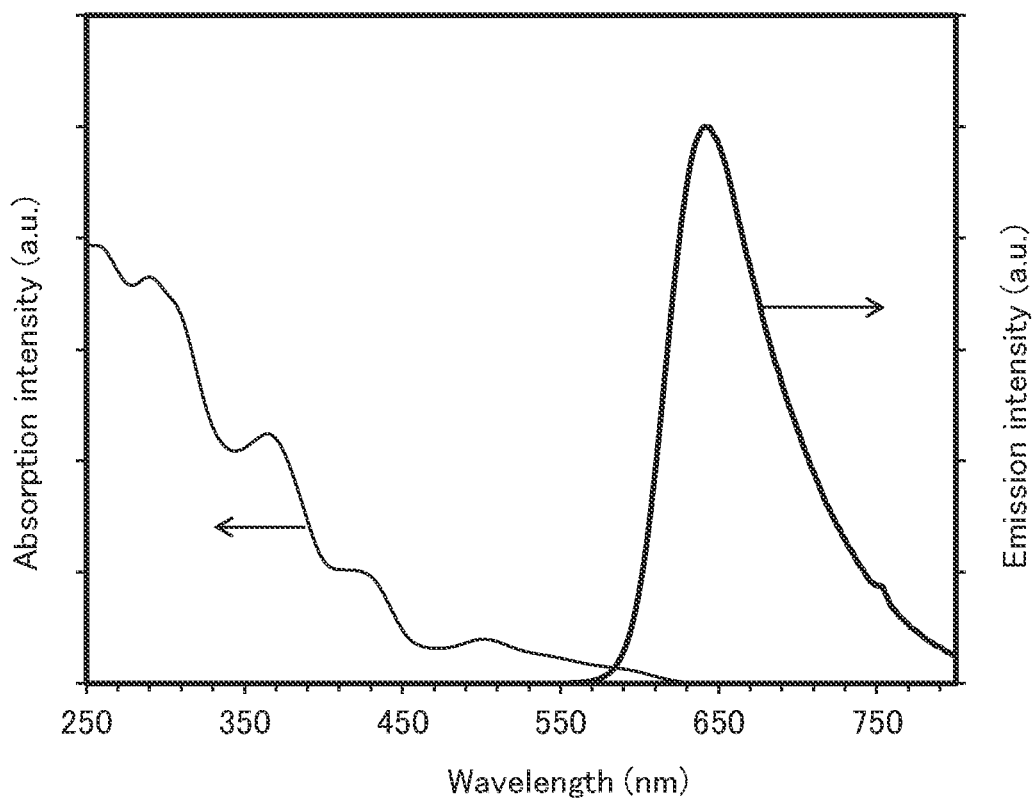
FIG. 19 shows an absorption spectrum and an emission spectrum of [Ir(dmdppr-25dmCP)$_2$(debm)] in a solution.

FIG. 19 shows measurement results of an absorption spectrum and an emission spectrum of [Ir(dmdppr-25dmCP)₂(debm)] in a dichloromethane solution. The absorption spectrum of [Ir(dmdppr-25dmCP)₂(debm)] in the dichloromethane solution was measured with an ultraviolet-visible light spectrophotometer (V550, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 19 shows that [Ir(dmdppr-25dmCP)₂(debm)] in the dichloromethane solution has an absorption peak at 592 nm and an emission wavelength peak at 641 nm (excitation wavelength: 503 nm). These results indicate that [Ir(dmdppr-25dmCP)₂(debm)] emits red light and can be used as a light-emitting substance.

Example 4

Synthesis Example 4

In this synthesis example, a synthesis method of bis{4,6-dimethyl-2-[5-(4-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-mCP)₂(debm)]), which is the organometallic complex of the present invention represented by Structure Formula (103) in Embodiment 1, is specifically described. The structure formula of [Ir(dmdppr-mCP)₂(debm)] is shown below.

[Chemical Formula 25]

(103)

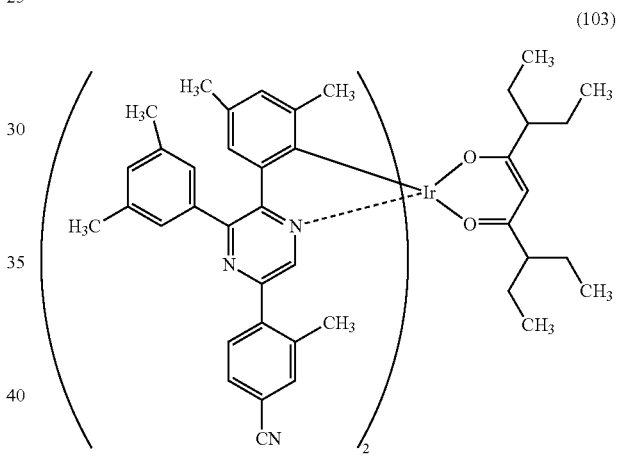

<Step 1; Synthesis of bis{4,6-dimethyl-2-[5-(4-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-mCP)₂(debm)])>

First, 20 mL of 2-ethoxyethanol, 1.68 g of di-μ-chloro-tetrakis{4,6-dimethyl-2-[5-(4-cyano-2,5-dimethylphenyl)-3-(3,5-dimethylphenyl)-2-pyrazinyl-κN]phenyl-κC}diiridium(III) (abbreviation: [Ir(dmdppr-mCP)₂Cl]₂), 0.52 g of 3,7-diethylnonane-4,6-dione (abbreviation: Hdebm), and 0.87 g of sodium carbonate were put into a recovery flask equipped with a reflux pipe, and the atmosphere in the flask was replaced with argon. After that, the mixture was irradiated with microwaves (2.45 GHz, 100 W) for two hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.85 g of the organometallic complex of the present invention, [Ir(dmdpprmCP)₂(debm)], as a deep red solid in a yield of 43%. By a train sublimation method, 0.84 g of the obtained deep red solid was purified. In the purification by sublimation, the solid was heated at 307° C. under a pressure of 2.5 Pa with an argon gas flow rate of 10.5 mL/min. After the purification by sublimation, 0.71 g of the target deep red solid was obtained in a yield of 85%. The synthesis scheme of Step 1 is shown below.

2.35-2.41 (s, 18H), 5.13 (s, 1H), 6.51 (s, 2H), 6.83 (s, 2H), 7.21 (s, 2H), 7.33 (s, 4H), 7.43 (d, 2H), 7.53 (d, 2H), 7.58 (s, 2H), 8.46 (s, 2H).

Figure 21:
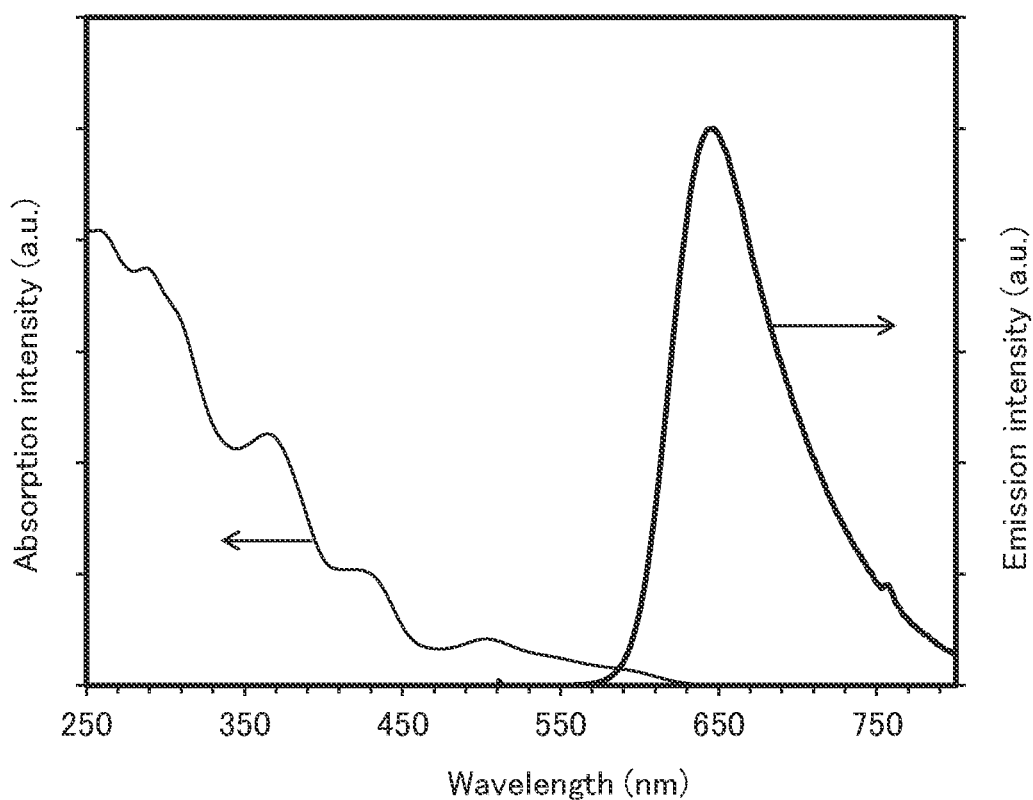
FIG. 21 shows an absorption spectrum and an emission spectrum of [Ir(dmdppr-mCP)$_2$(debm)] in a solution.

FIG. 21 shows measurement results of an absorption spectrum and an emission spectrum of [Ir(dmdppr-mCP)₂(debm)] in a dichloromethane solution. The absorption spectrum of [Ir(dmdppr-mCP)₂(debm)] in the dichloromethane solution was measured with an ultraviolet-visible light spec-

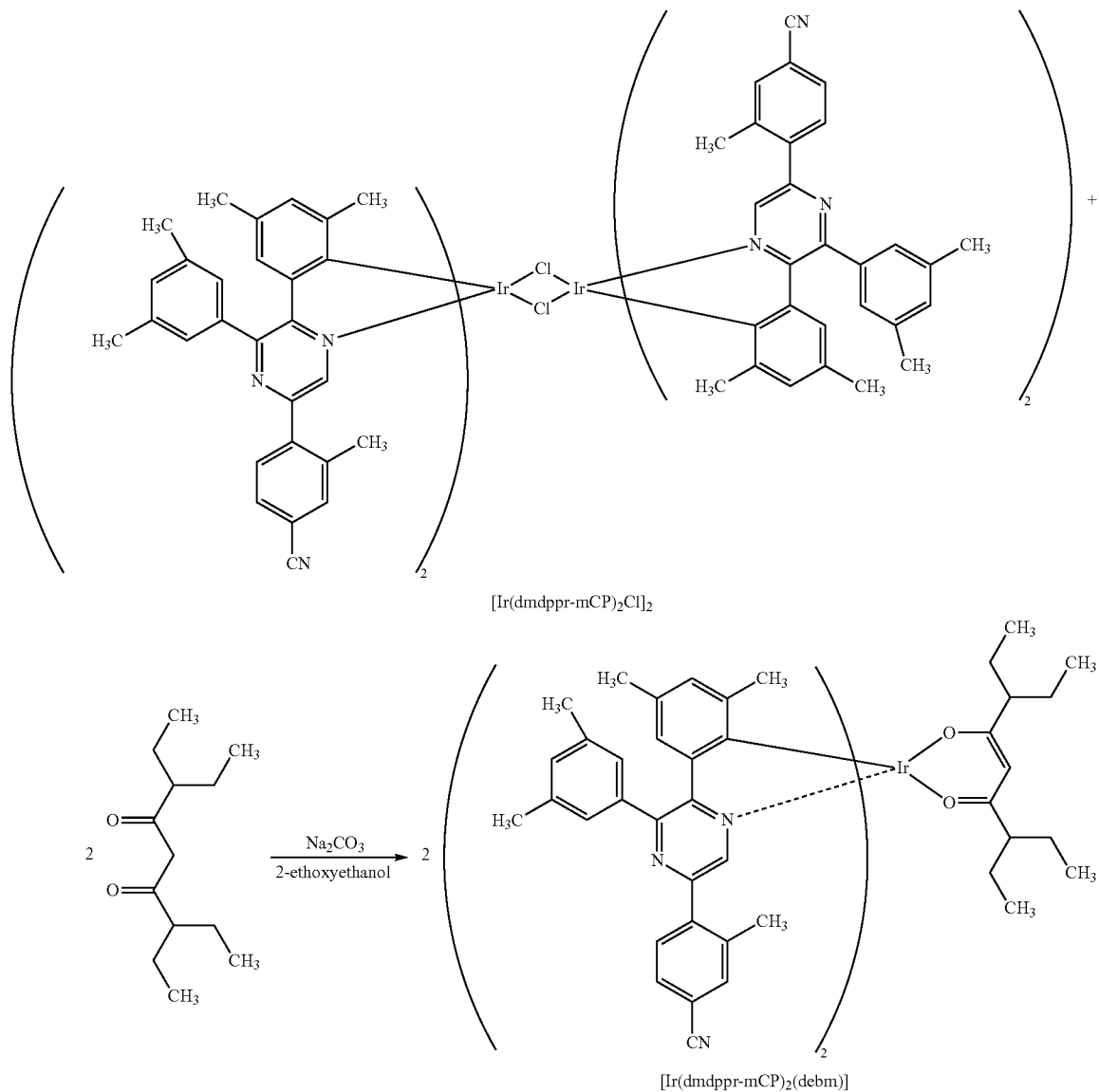

[Chemical Formula 26]

Figure 20:
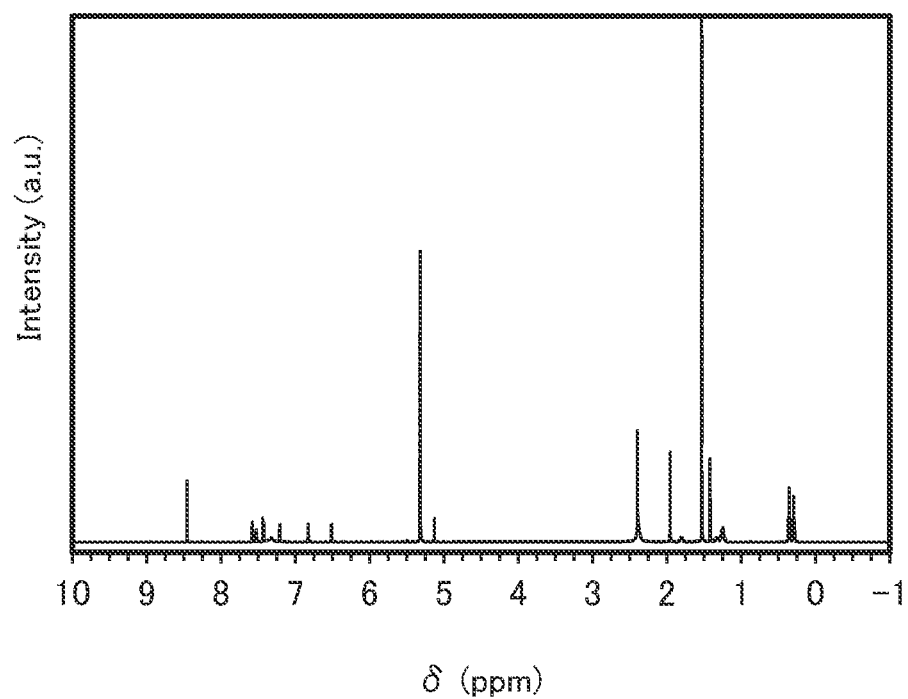
FIG. 20 is a $^1$H-NMR chart of [Ir(dmdppr-mCP)$_2$(debm)]

Analysis results by nuclear magnetic resonance spectroscopy (¹H-NMR) of the deep red solid obtained in Step 1 are shown below. FIG. 20 is the ¹H-NMR chart. These results revealed that the organometallic complex of the present invention, [Ir(dmdppr-mCP)₂(debm)], was obtained in this synthesis example.

¹H-NMR. δ (CD₂Cl₂): 0.29 (t, 6H), 0.36 (t, 6H), 1.20-1.36 (m, 8H), 1.42 (s, 6H), 1.78-1.83 (m, 2H), 1.96 (s, 6H), trophotometer (V550, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 21 shows that [Ir(dmdppr-mCP)₂(debm)] in the dichloromethane solution has an absorption peak at 596 nm and an emission wavelength peak at 647 nm (excitation wavelength: 506 nm). These results indicate that [Ir(dmdppr-mCP)₂(debm)] emits red light and can be used as a light-emitting substance.

Example 5

Synthesis Example 5

In this synthesis example, a synthesis method of bis{4-tert-butyl-6-methyl-2-[5-(3-cyano-2-methylphenyl)-3-(3-tert-butyl-5-methylphenyl)-2-pyrazinyl-κN]phenyl-κC}(3,7-diethyl-4,6-nonanedionato-κ²O,O')iridium(III) (abbreviation: [Ir(tBumdppr-m3CP)₂(debm)]), which is the organometallic complex of the present invention represented by Structure Formula (128) in Embodiment 1, is specifically described. The structure formula of [Ir(tBumdppr-m3CP)₂(debm)] is shown below.

[Chemical Formula 27]

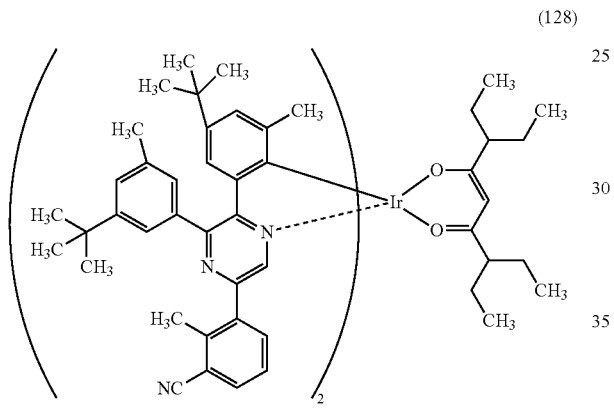

(128)

Step 1; Synthesis of 5,6-bis(3-tert-butyl-5-methylphenyl)-2(1H)-pyrazinone

First, 2.92 g of 5-bromo-6-chloro-2(1H)-pyrazinone, 5.72 g of 3-tert-butyl-5-methylphenylboronic acid, 8.91 g of tripotassium phosphate, 60 mL of toluene, and 12 mL of water were put into a three-neck flask equipped with a reflux pipe, and the atmosphere in the flask was replaced with nitrogen. The mixture in the flask was degassed by being stirred under reduced pressure, and then 0.094 g of palladium(II) acetate (abbreviation: Pd(OAc)₂) and 0.35 g of 2-dicyclohexylphosphino-2 ',6'-dimethoxybiphenyl (abbreviation: S-Phos) were added thereto. The mixture was stirred at 100° C. for 6.5 hours to be reacted.

After a predetermined time elapsed, extraction was performed with toluene. Then, purification by silica gel column chromatography using hexane and ethyl acetate as a developing solvent in a volume ratio of 5:1 was performed, so that 4.12 g of a target pyrazine derivative (white solid) was obtained in a yield of 76%. The synthesis scheme of Step 1 is shown below.

[Chemical Formula 28]

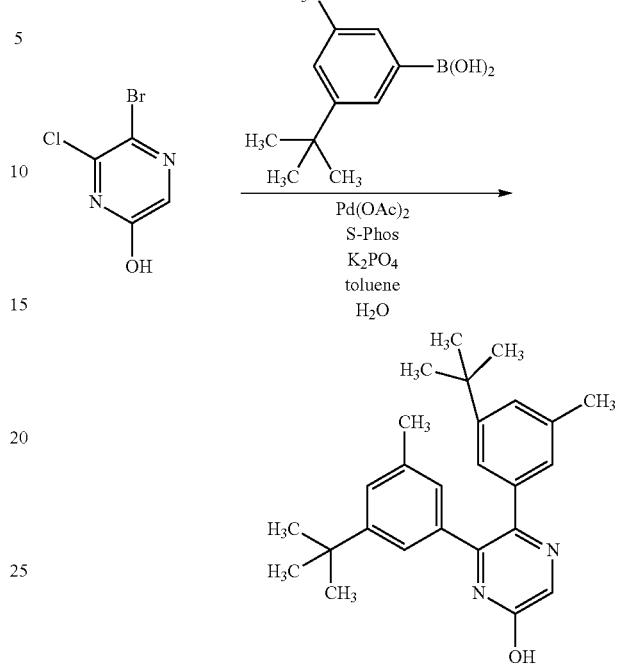

Step 2; Synthesis of 2,3-bis(3-tert-butyl-5-methylphenyl)-5-triflatepyrazine Next, 4.09 g of 5,6-bis(3-tert-butyl-5-methylphenyl)-2(1H)-pyrazinone obtained in Step 1, 3.0 mL of triethylamine, 53 mL of dehydrated dichloromethane were put into a 200 mL three-neck flask, and the atmosphere in the flask was replaced with nitrogen. The flask was cooled down to −20° C., 2.3 mL of trifluoromethanesulfonic anhydride was dropped therein, and stirring at room temperature was performed for 19 hours. Then, 40 mL of water and 4 mL of 1M hydrochloric acid were added to the reaction solution, and the reaction solution was subjected to extraction with dichloromethane. Then, purification by flash column chromatography using hexane and ethyl acetate as a developing solvent in a volume ratio of 10:1 was performed, so that 5.36 g of a target pyrazine derivative (colorless oil) was obtained in a yield of 98%. The synthesis scheme of Step 2 is shown below.

[Chemical Formula 29]

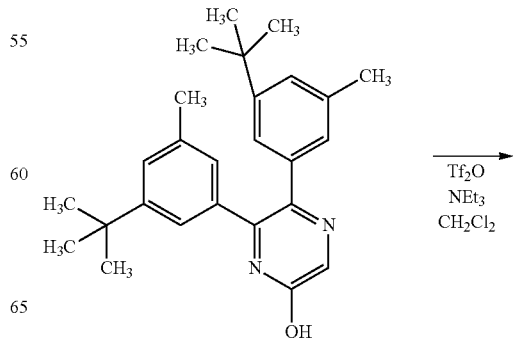

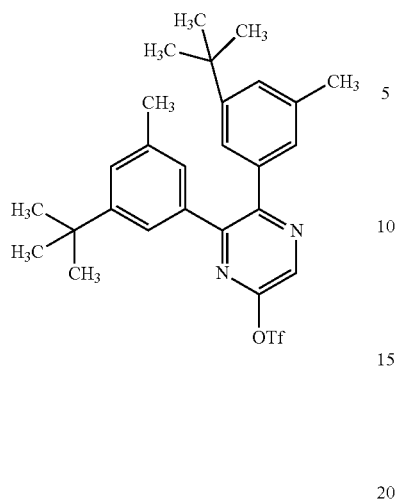

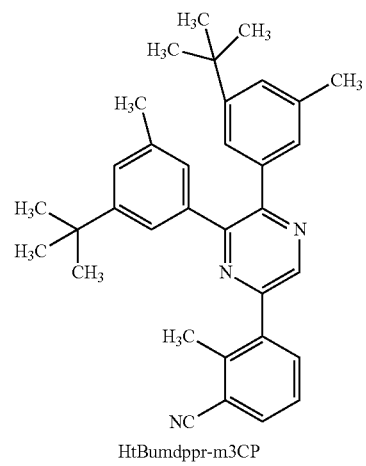

HtBumdppr-m3CP

Step 3; Synthesis of 5-(3-cyano-2-methylphenyl)-2,3-bis(3-tert-butyl-5-methylphenyl)pyrazine (abbreviation: HtBumdppr-m3CP)

Next, 1.84 g of 2,3-bis(3-tert-butyl-5-methylphenyl)-5-triflatepyrazine obtained in Step 2, 0.68 g of 3-cyano-2-methylphenylboronic acid, 2.71 g of tripotassium phosphate, 28 mL of toluene, and 2.8 mL of water were put into a 200 mL three-neck flask, and the atmosphere in the flask was replaced with nitrogen. The mixture in the flask was degassed by being stirred under reduced pressure, 0.032 g of tris(dibenzylideneacetone)dipalladium(0) (abbreviation: $Pd_2(dba)_3$) and 0.062 g of tris(2,6-dimethoxyphenyl)phosphine (abbreviation: $(2,6-MeOPh)_3P$) were added thereto, and the mixture was refluxed for seven hours. After a predetermined time elapsed, extraction was performed with toluene. Then, purification by silica gel column chromatography using hexane and ethyl acetate as a developing solvent in a volume ratio of 10:1 was performed, so that 1.62 g of a target pyrazine derivative HtBumdppr-m3CP (yellowish white solid) was obtained in a yield of 93%. The synthesis scheme of Step 3 is shown below.

[Chemical Formula 30]

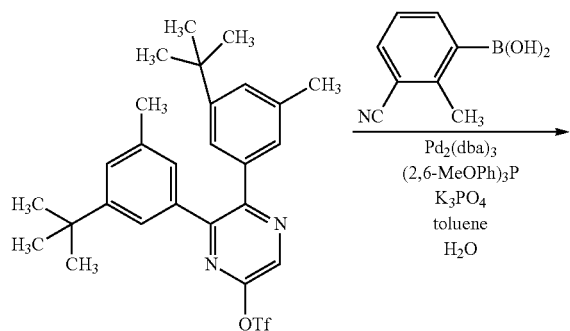

Step 4; Synthesis of di-μ-chloro-tetrakis{4-tert-butyl-6-methyl-2-[5-(3-cyano-2-methylphenyl)-3-(3-tert-butyl-5-methylphenyl)-2-pyrazinyl-κN]phenyl-κC}diiridium(III) (abbreviation: [Ir(tBumdppr-m3CP)$_2$Cl]$_2$)

Next, 15 mL of 2-ethoxyethanol, 5 mL of water, 1.62 g of HtBumdppr-m3CP obtained in Step 3, and 0.48 g of iridium chloride hydrate (IrCl$_3$·H$_2$O) (produced by Furuya Metal Co., Ltd.) were put into a recovery flask equipped with a reflux pipe, and the atmosphere in the flask was replaced with argon. After that, the mixture was irradiated with microwaves (2.45 GHz, 100 W) for an hour to cause a reaction. After a predetermined time elapsed, the obtained residue was suction-filtered and washed with methanol to give 1.14 g of a dinuclear complex [Ir(tBumdppr-m3CP)$_2$Cl]$_2$ as an orange solid in a yield of 59%. The synthesis scheme of Step 4 is shown below.

[Chemical Formula 31]

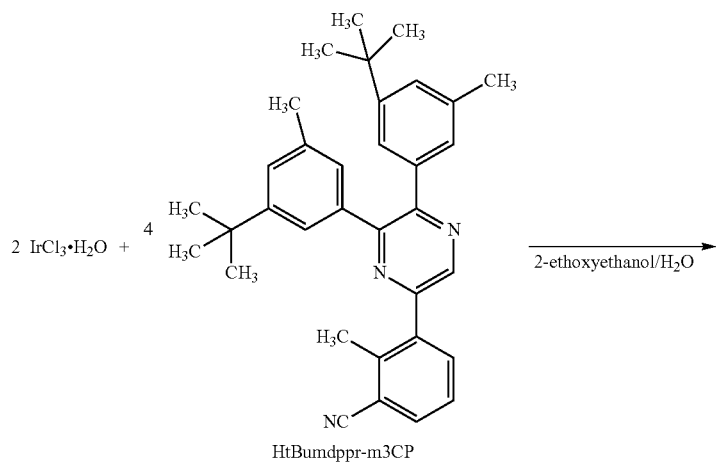

HtBumdppr-m3CP

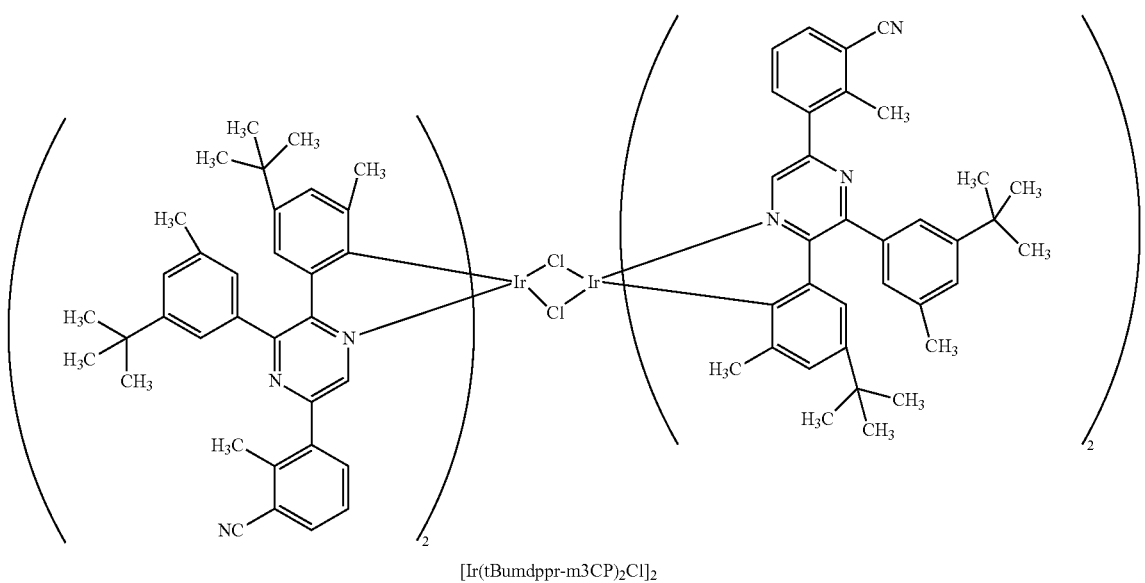

[Ir(tBumdppr-m3CP)$_2$Cl]$_2$

Step 5; Synthesis of bis{4-tert-butyl-6-methyl-2-[5-(3-cyano-2-methylphenyl)-3-(3-tert-butyl-5-methylphenyl)-2-pyrazinyl-κN]phenyl-κC}(3,7-diethyl-4,6-nonanedionato-κ$^2$O,O')iridium(III) (abbreviation: [Ir(tBumdppr-m3CP)$_2$(debm)])

Furthermore, 20 mL of 2-ethoxyethanol, 1.13 g of [Ir(tBumdppr-m3CP)$_2$Cl]$_2$ that is the dinuclear complex obtained in Step 4, 0.30 g of 3,7-diethylnonane-4,6-dione (abbreviation: Hdebm), and 0.50 g of sodium carbonate were put into a recovery flask equipped with a reflux pipe, and the atmosphere in the flask was replaced with argon. After that, the mixture was irradiated with microwaves (2.45 GHz, 100 W) for two hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.52 g of the organometallic complex of the present invention, [Ir(tBumdppr-m3CP)$_2$(debm)](abbreviation), as a deep red solid in a yield of 41%. By a train sublimation method, 0.51 g of the obtained deep red solid was purified. In the purification by sublimation, the solid was heated at 303° C. under a pressure of 2.5 Pa with an argon gas flow rate of 10.5 mL/min. After the purification by sublimation, 0.17 g of the target deep red solid was obtained in a yield of 33%. The synthesis scheme of Step 5 is shown below.

[Chemical Formula 32]

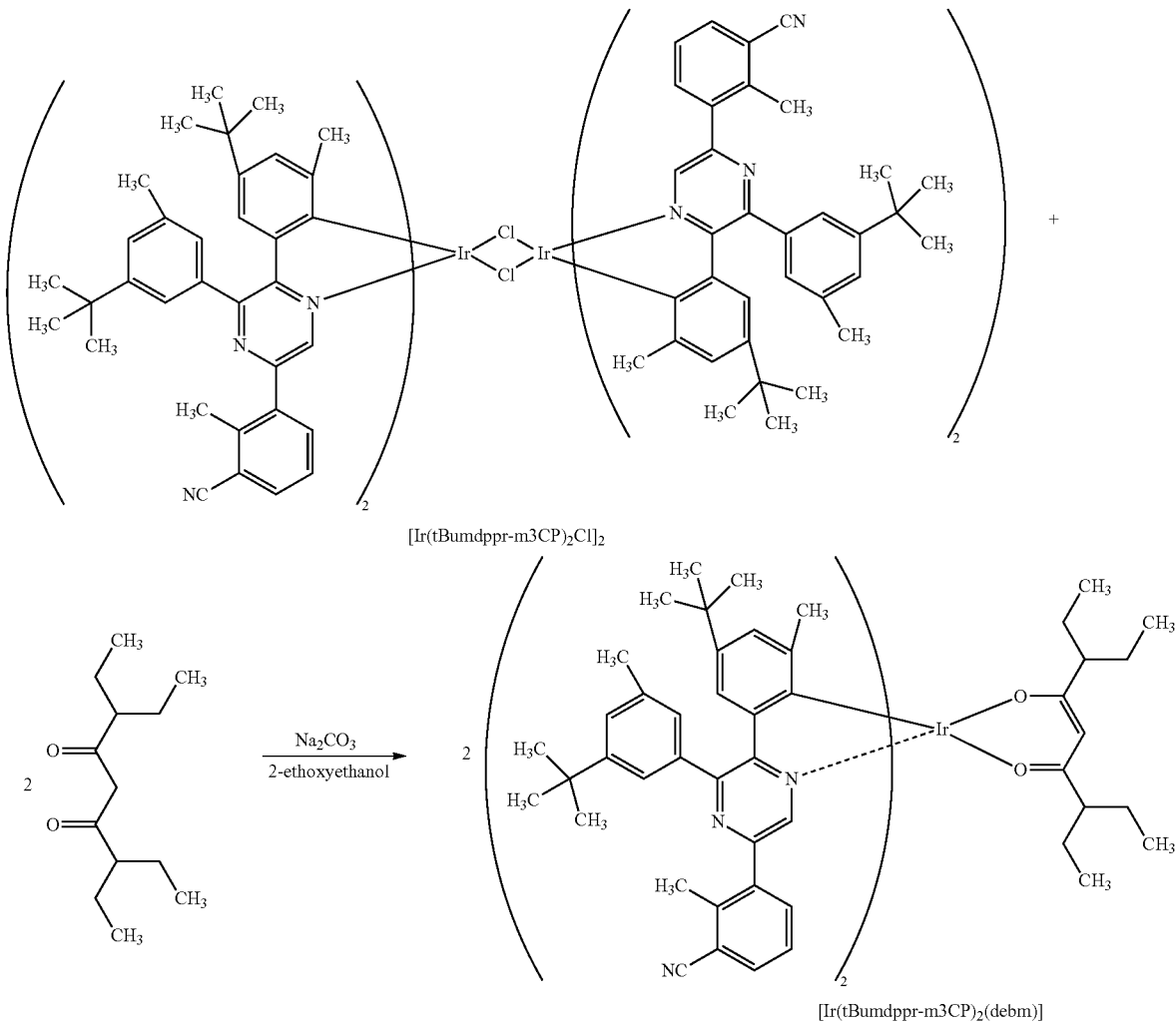

Figure 22:
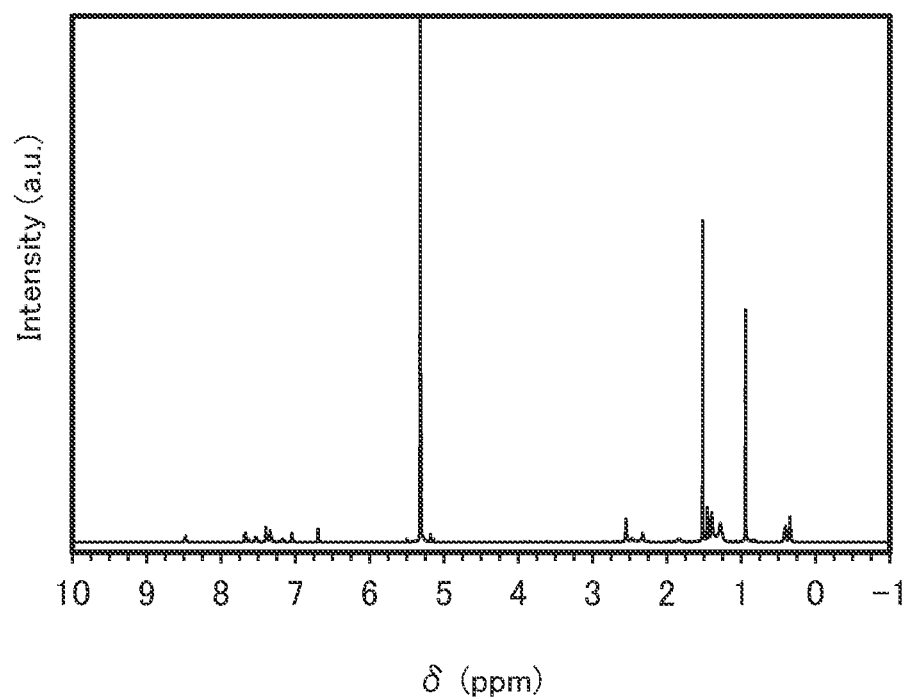
FIG. 22 is a $^1$H-NMR chart of [Ir(tBumdppr-m3CP)$_2$(debm)]

Analysis results by nuclear magnetic resonance spectroscopy ($^1$H-NMR) of the deep red solid obtained in Step 5 are shown below. FIG. 22 is the $^1$H-NMR chart. These results revealed that the above-described organometallic complex of the present invention, [Ir(tBumdppr-m3CP)$_2$(debm)], was obtained in this synthesis example.

$^1$H-NMR. δ (CD$_2$Cl$_2$): 0.34 (t, 6H), 0.41 (t, 6H), 0.94 (s, 18H), 1.38-1.45 (m, 34H), 1.84 (s, 2H), 2.33 (s, 3H), 2.47 (s, 1H), 2.55 (s, 6H), 5.18 (s, 1H), 6.69 (s, 2H), 7.04 (s, 2H), 7.17 (s, 1H), 7.34 (t, 3H), 7.40 (s, 3H), 7.53 (d, 2H), 7.63 (d, 1H), 7.68 (d, 2H), 8.48 (s, 2H).

Figure 23:
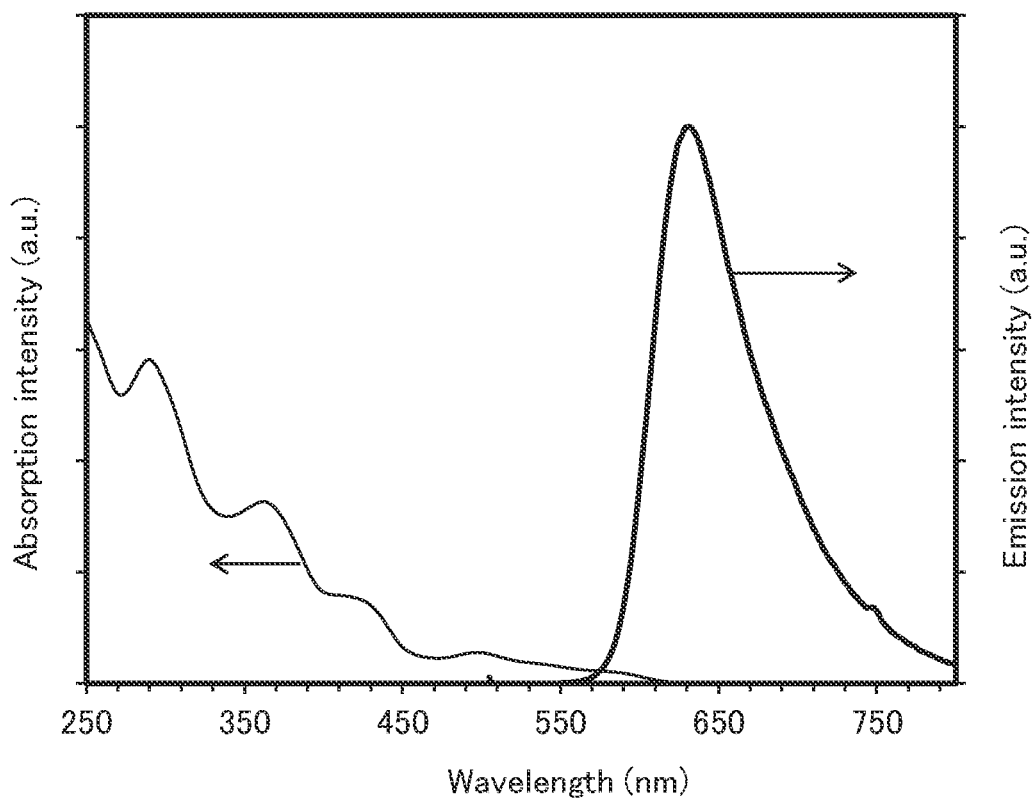
FIG. 23 shows an absorption spectrum and an emission spectrum of [Ir(tBumdppr-m3CP)$_2$(debm)] in a solution.

FIG. 23 shows measurement results of an absorption spectrum and an emission spectrum of [Ir(tBumdppr-m3CP)$_2$(debm)] in a dichloromethane solution. The absorption spectrum of [Ir(tBumdppr-m3CP)$_2$(debm)] in the dichloromethane solution was measured with an ultraviolet-visible light spectrophotometer (V550, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 23 shows that [Ir(tBumdppr-m3CP)$_2$(debm)] in the dichloromethane solution has an absorption peak at 585 nm and an emission wavelength peak at 631 nm (excitation wavelength: 500 nm). These results indicate that [Ir(tBumdppr-m3CP)$_2$(debm)] emits red light and can be used as a light-emitting substance.

Example 6

In this example, described are comparison results of bis{4,6-dimethyl-2-[5-(5-cyano-2-methylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-m5CP)$_2$(debm)]), which is the organometallic complex of one embodiment of the present invention, and bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-m5CP)$_2$(dpm)]) and bis{4,6-dimethyl-2-[5-(5-cyano-2-methylphenyl)-3-(3,5-dimethylphenyl)-2-pyrazinyl-κN]phenyl-κC}(2,6-dimethyl-3,5-heptadionato-κ$^2$O,O')iridium(III) (abbreviation: [Ir(dmdppr-m5CP)$_2$(dibm)]), which are organometallic complexes of comparative examples.

The structure formulae of [Ir(dmdppr-m5CP)₂(debm)], [Ir(dmdppr-m5CP)₂(dpm)], and [Ir(dmdppr-m5CP)₂(dibm)] are shown below.

[Chemical Formula 33]

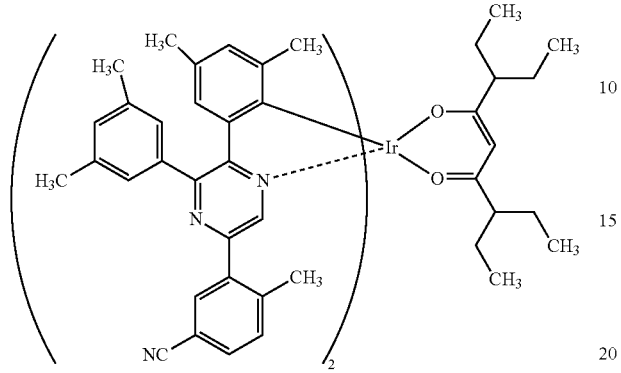

[Ir(dmdppr-m5CP)₂(debm)]

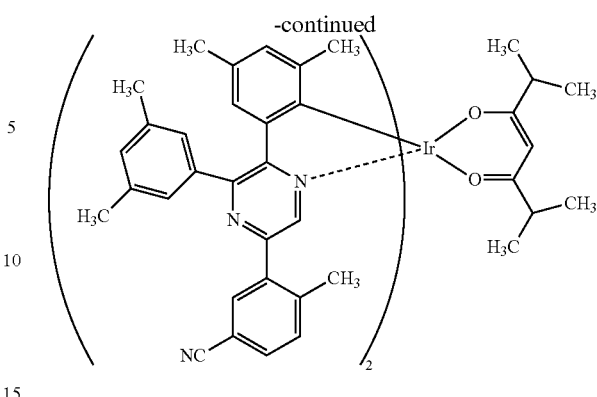

[Ir(dmdppr-m5CP)₂(dpm)]

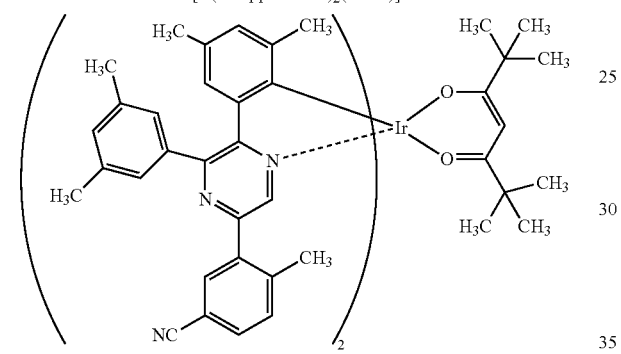

[Ir(dmdppr-m5CP)₂(dpm)]

Each of the above three organometallic complexes is synthesized in such a manner that an ancillary ligand is coordinated with the same dinuclear complex, di-μ-chloro-tetrakis{4,6-dimethyl-2-[5-(5-cyano-2-methylphenyl)-3-(3,5-dimethylphenyl)-2-pyrazinyl-κN]phenyl-κC}diiridium (III) (abbreviation: [Ir(dmdppr-m5CP)₂Cl]₂). The structure formula of [Ir(dmdppr-m5CP)₂Cl]₂ is shown below.

[Chemical Formula 34]

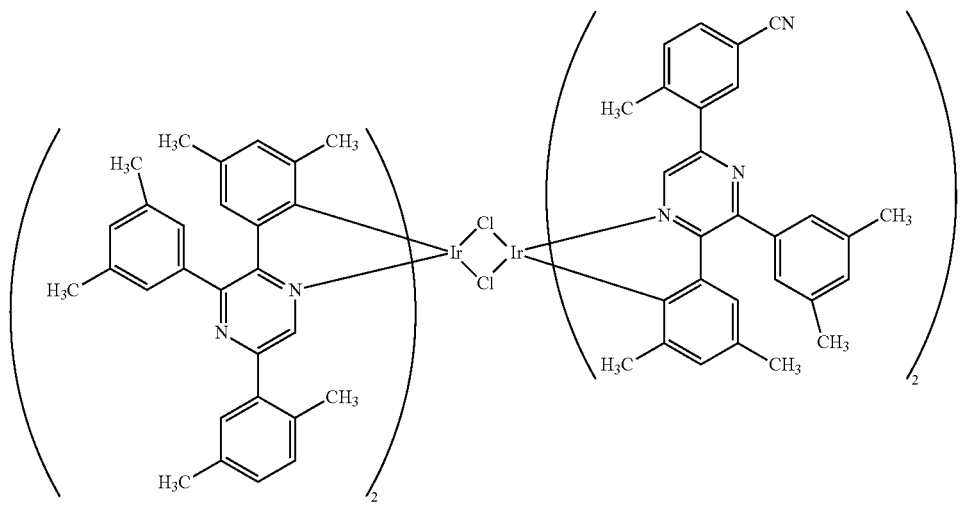

[Ir(dmdppr-m5CP)₂Cl]₂

The amounts of [Ir(dmdppr-m5CP)₂Cl]₂ used in synthesis, and the amounts and the yields of the three organometallic complexes are shown below.

TABLE 1

|  | Usage of dinuclear complex | Obtained amount | Yield |
|---|---|---|---|
| [Ir(dmdppr-m5CP)₂(debm)] | 2.3 g | 1.4 g | 51% |
| [Ir(dmdppr-m5CP)₂(dpm)] | 1.2 g | 0.38 g | 28% |
|  | 19.6 g | 6.2 g | 27% |
|  | 22 g | 6.1 g | 22% |
| [Ir(dmdppr-m5CP)₂(dibm)] | 3.4 g | 1.7 g | 45% |

It was found that [Ir(dmdppr-m5CP)₂(debm)], which is the organometallic complex of one embodiment of the present invention and includes 3,7-diethylnonane-4,6-dione (abbreviation: Hdebm) as an ancillary ligand, was obtained in a higher yield than [Ir(dmdppr-m5CP)₂(dpm)] and [Ir(dmdppr-m5CP)₂(dibm)].

Figure 24:
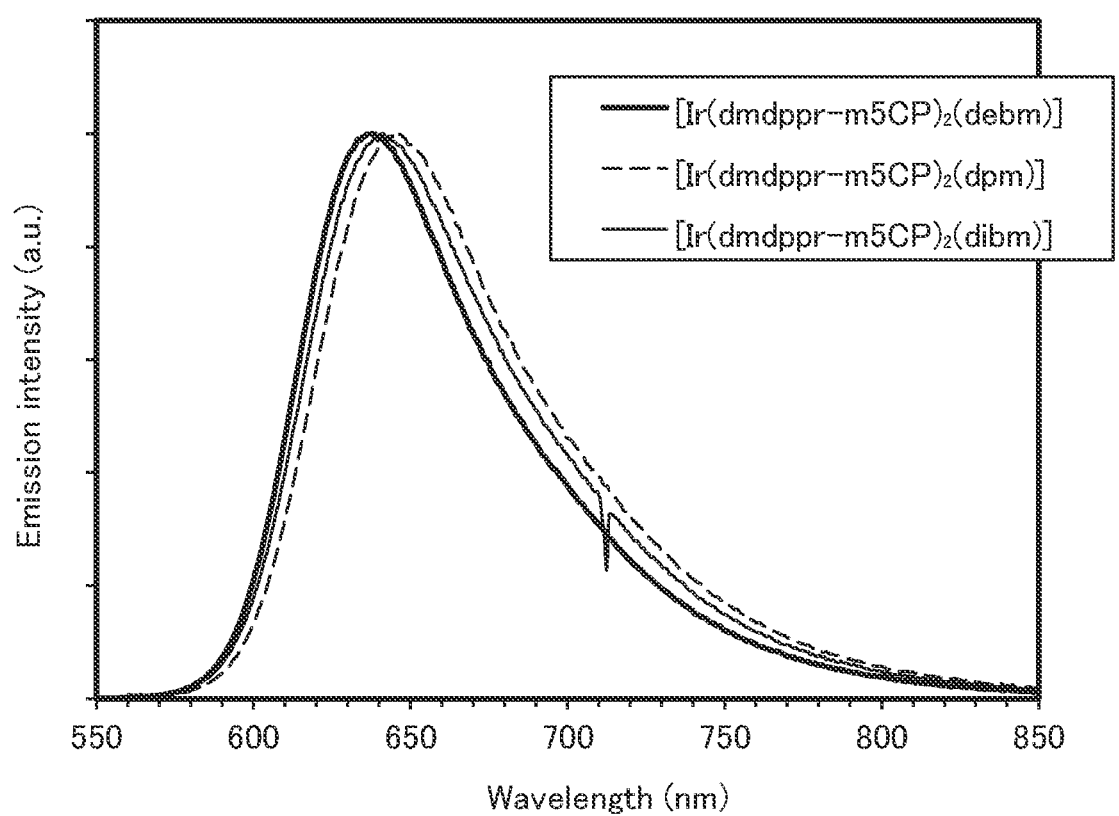
FIG. 24 shows PL spectra of [Ir(dmdppr-m5CP)$_2$(debm)], [Ir(dmdppr-m5CP)$_2$(dpm)], and [Ir(dmdppr-m5CP)$_2$(dibm)] in a dichloromethane solution.

FIG. 24 shows PL spectra of [Ir(dmdppr-m5CP)₂(debm)], [Ir(dmdppr-m5CP)₂(dpm)], and [Ir(dmdppr-m5CP)₂(dibm)] in a dichloromethane solution.

FIG. 24 shows that the emission spectra of the organometallic complexes are located within the red wavelength range and that the peak of [Ir(dmdppr-m5CP)₂(debm)] is located on the shortest wavelength side of the three, the peak of [Ir(dmdppr-m5CP)₂(dpm)] is located on the second shortest wavelength side, and the peak of [Ir(dmdppr-m5CP)₂(dibm)] is located on the third shortest wavelength side.

The emission peak wavelength, the half width, and the PL quantum efficiency of each of the organometallic complexes are shown in the table below.

TABLE 2

|  | Peak wavelength | Half width | PL quantum efficiency |
|---|---|---|---|
| [Ir(dmdppr-m5CP)₂(debm)] | 638 nm | 73 nm | 77% |
| [Ir(dmdppr-m5CP)₂(dpm)] | 645 nm | 79 nm | 67% |
| [Ir(dmdppr-m5CP)₂(dibm)] | 641 nm | 78 nm | 73% |

This table shows that [Ir(dmdppr-m5CP)₂(debm)] is an organometallic complex having the shortest emission peak wavelength and a high luminosity factor. That is, the emission spectrum of the organometallic complex including Hdebm as an ancillary ligand is shifted slightly to a short wavelength side, as compared to the emission spectra of the organometallic complexes including other ancillary ligands. It is also found that [Ir(dmdppr-m5CP)₂(debm)] has high color purity owing to its narrow half width and can provide a light-emitting device having a cavity structure with a small loss. That is, it is found that [Ir(dmdppr-m5CP)₂(debm)], which is the organometallic complex of one embodiment of the present invention, is extremely suitable as a light-emitting material for a light-emitting device because it emits light with an extremely high efficiency owing to its high luminosity factor and high quantum efficiency and has a small loss of, for example, energy when used in a microcavity structure. Moreover, the microcavity structure is suitable for a top-emission light-emitting device, and the organometallic complex of one embodiment of the present invention is particularly suitable as a light-emitting material for a top-emission light-emitting device.

Example 7

In this example, a light-emitting device using the organometallic complex of one embodiment of the present invention and a comparative light-emitting device not using the organometallic complex are described. Structure formulae of compounds used for a light-emitting device 1 and a comparative light-emitting device 1 are shown below.

[Chemical Formula 35]

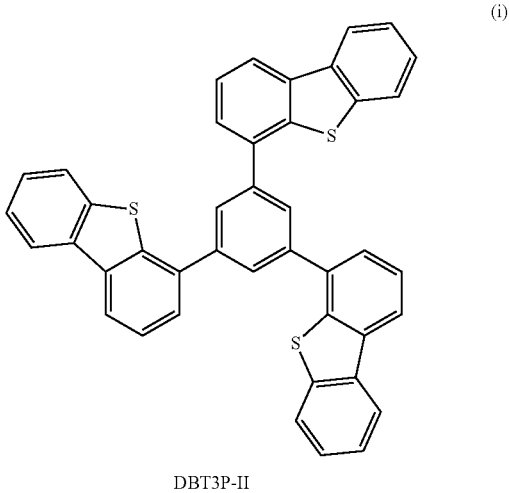

DBT3P-II

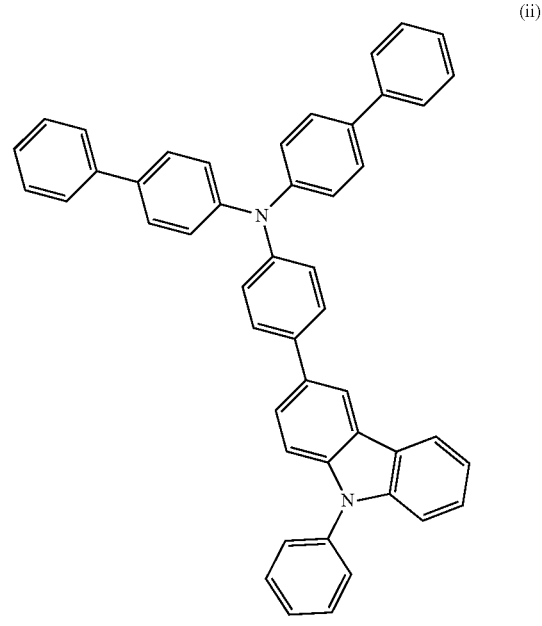

PCBBi1BP

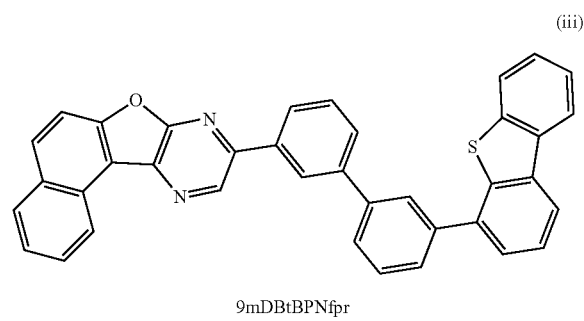

9mDBtBPNfpr

-continued

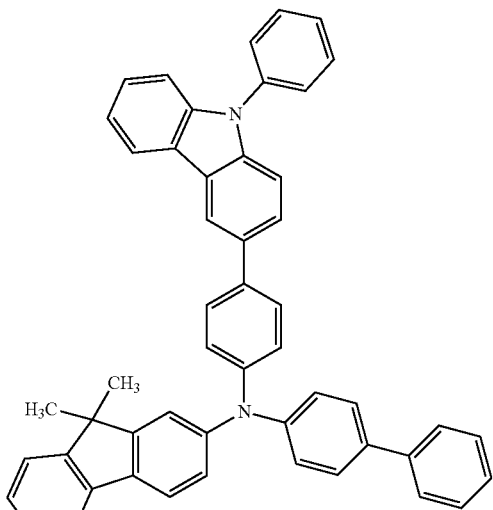

PCBBiF

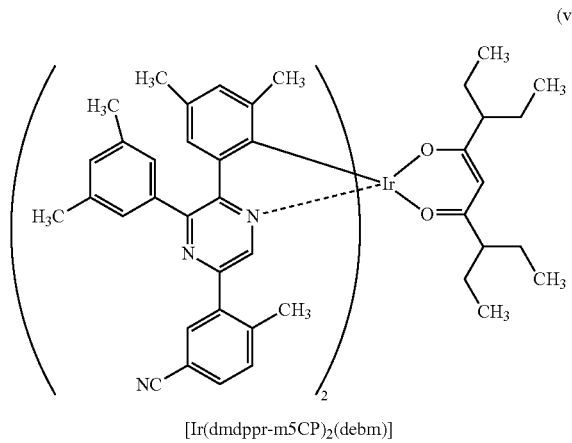

[Ir(dmdppr-m5CP)₂(debm)]

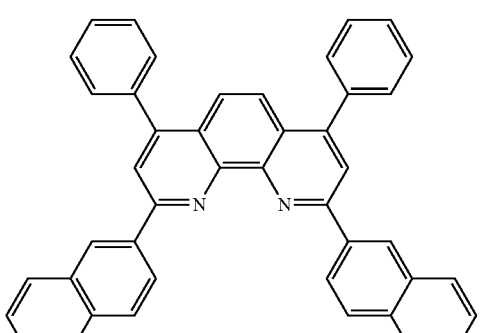

NBPhen

-continued

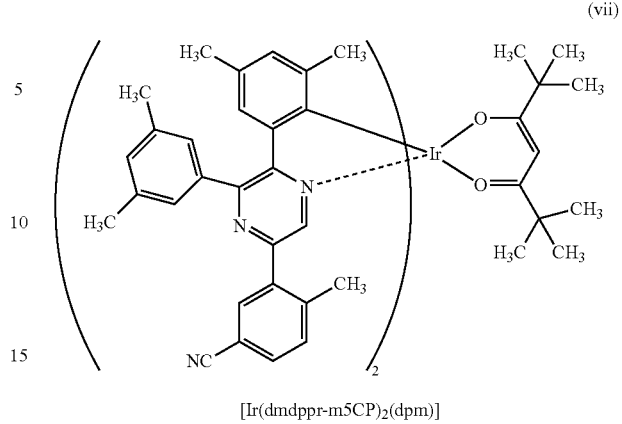

[Ir(dmdppr-m5CP)₂(dpm)]

(Fabrication Method of Light-Emitting Device 1)

First, indium tin oxide containing silicon oxide (ITSO) was deposited over a glass substrate by a sputtering method to form the first electrode 101. The thickness of the first electrode 101 was 70 nm and the electrode area was 2 mm×2 mm.

Next, in pretreatment for forming the light-emitting device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, 4,4′,4″-(benzene-1,3,5-triyl)tri(dibenzothiophene) (abbreviation: DBT3P-II) represented by Structure Formula (i) and molybdenum(VI) oxide were deposited to a thickness of 70 nm by co-evaporation using resistance heating such that the weight ratio of DBT3P-II to $MoO_x$ was 2:1, whereby the hole-injection layer 111 was formed.

Next, 4,4′-diphenyl-4″-(9-phenyl-9H-carbazol-3-yl)triphenylamine (abbreviation: PCBBi1BP) represented by Structure Formula (ii) was deposited by evaporation to a thickness of 20 nm over the hole-injection layer 111, whereby the hole-transport layer 112 was formed.

Then, 9-[3′-(dibenzothiophen-4-yl)bipheny-3-yl]naphtho[1′,2′:4,5]furo[2,3-b]pyrazine (abbreviation: 9mDBtBPNfpr) represented by Structure Formula (iii), N-(1,1′-biphenyl-4-yl)-N-[4-(9-phenyl-9H-carbazol-3-yl)phenyl]-9,9-dimethyl-9H-fluoren-2-amine (abbreviation: PCBBiF) represented by Structure Formula (iv), and bis{4,6-dimethyl-2-[5-(5-cyano-2-methylphenyl)-3-(3,5-dimethylphenyl)-2-pyrazinyl-κN]phenyl-κC}(3,7-diethyl-4,6-nonanedionato-$κ^2$O,O′)iridium(III) (abbreviation: [Ir(dmdppr-m5CP)₂(debm)]) represented by Structure Formula (v) were deposited to a thickness of 40 nm by co-evaporation such that the weight ratio of 9mDBtBPNfpr to PCBBiF and [Ir(dmdppr-m5CP)₂(debm)] was 0.7:0.3:0.1, whereby the light-emitting layer 113 was formed.

After that, over the light-emitting layer 113, a film of 9mDBtBPNfpr was formed to a thickness of 30 nm, and then 2,9-di(2-naphthyl)-4,7-diphenyl-1,10-phenanthroline (abbreviation: NBPhen) represented by Structure Formula (vi) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115. Then, aluminum was deposited by evaporation to a thickness of 200 nm to form the second electrode 102. Thus, the light-emitting device 1 of this example was fabricated.

(Fabrication Method of Comparative Light-Emitting Device 1)

The comparative light-emitting device 1 was fabricated in the same manner as the light-emitting device 1 except that bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-m5CP)$_2$(dpm)]) represented by Structure Formula (vii) was used instead of [Ir(dmdppr-m5CP)$_2$(debm)] in the light-emitting device 1, and the weight ratio of 9mDBtBPNfpr to PCBBiF and [Ir(dmdppr-m5CP)$_2$(dpm)] was set to 0.8:0.2:0.1.

The structures of the light-emitting devices are listed in the following table.

TABLE 3

| | Hole-injection layer 70 nm | Hole-transport layer 20 nm | Light-emitting layer 40 nm | Electron-transport layer 1 30 nm | Electron-transport layer 2 15 nm |
|---|---|---|---|---|---|
| Light-emitting device 1 | DBT3P-II:MoOx (2:1) | PCBBiIBP | 9mDBtBPNfpr:PCBBIF:*1 (0.7:0.3:0.1) | 9mDBtBPNfpr | NBPhen |
| Comparative light-emitting device 1 | | | 9mDBtBPNfpr:PCBBIF:*2 (0.8:0.2:0.1) | | |

*1 [Ir(dmdppr-m5CP)$_2$(debm)]
*2 [Ir(dmdppr-m5CP)$_2$(dpm)]

The light-emitting devices were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the light-emitting devices were measured.

Figure 25:
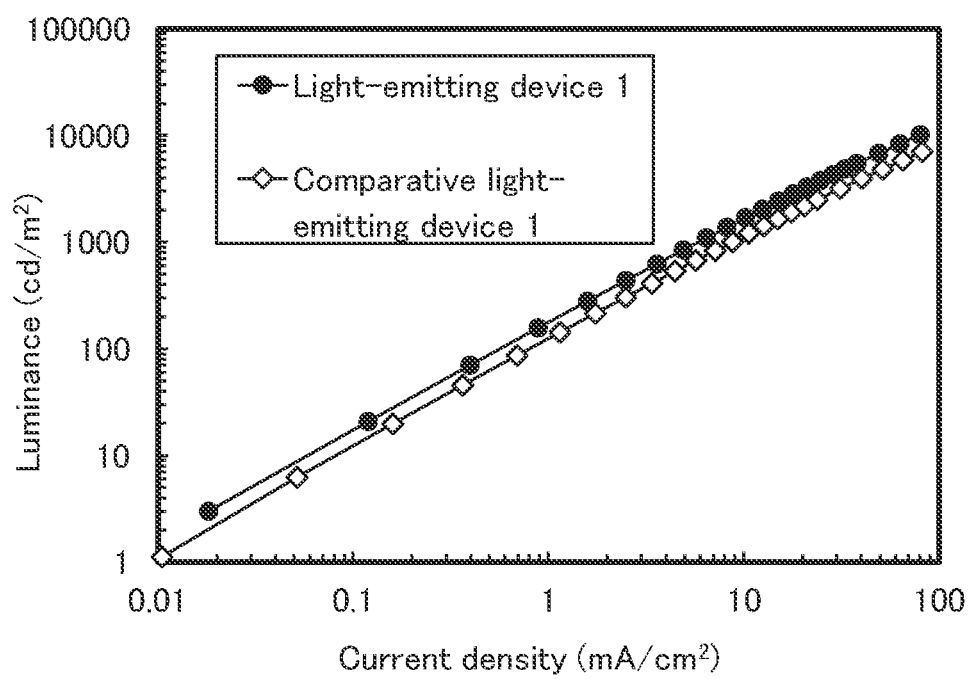
FIG. 25 is a graph showing luminance-current density characteristics of a light-emitting device 1 and a comparative light-emitting device 1.
Figure 26:
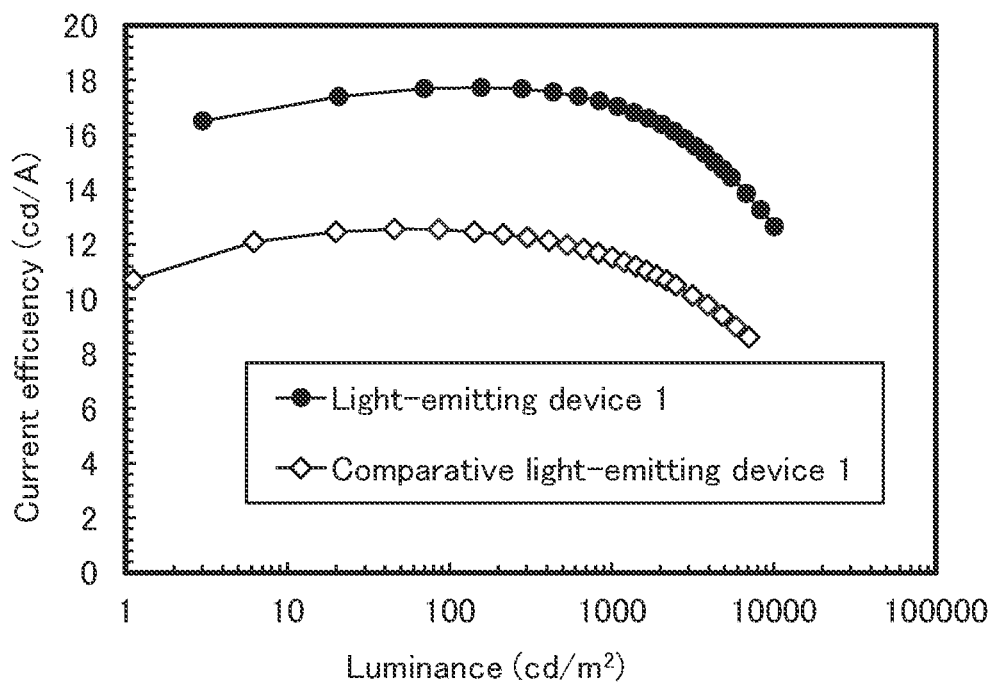
FIG. 26 is a graph showing current efficiency-luminance characteristics of the light-emitting device 1 and the comparative light-emitting device 1.
Figure 27:
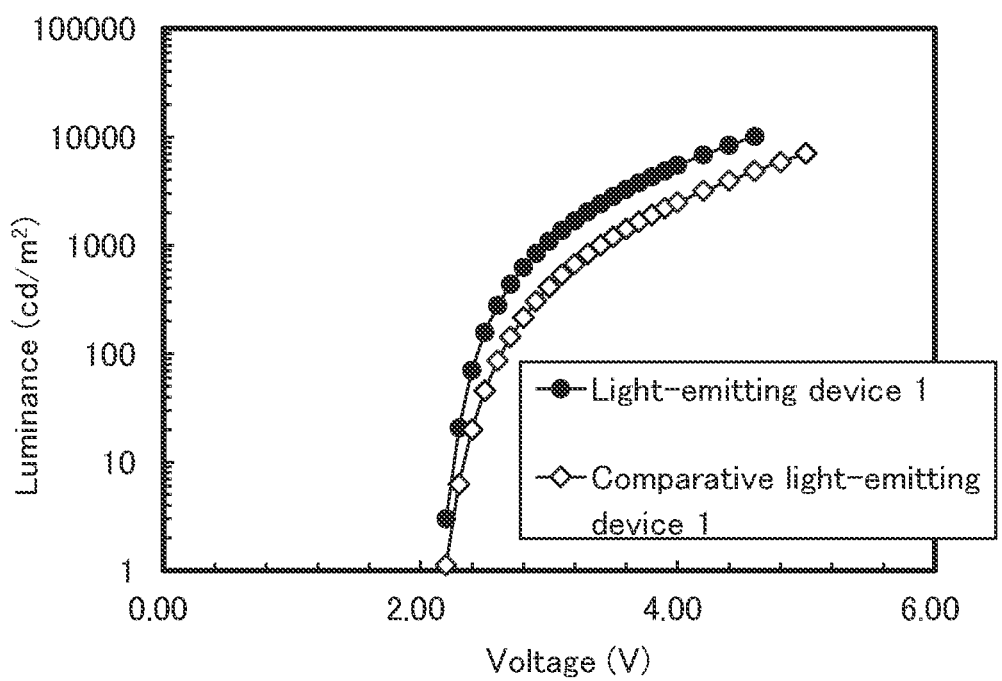
FIG. 27 is a graph showing luminance-voltage characteristics of the light-emitting device 1 and the comparative light-emitting device 1.
Figure 28:
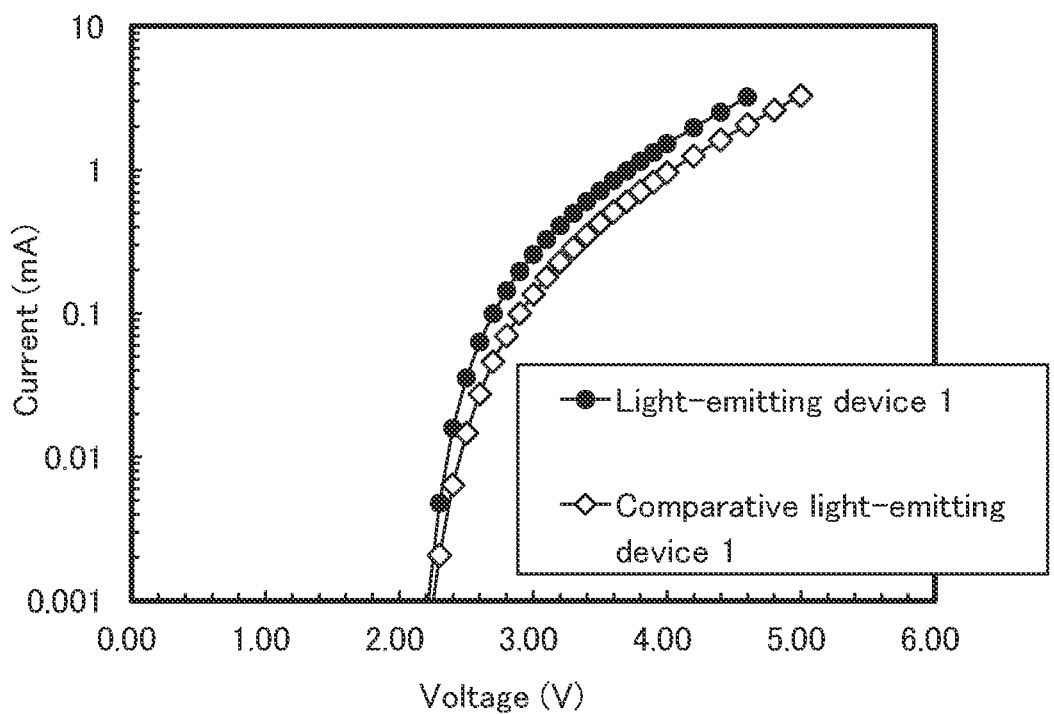
FIG. 28 is a graph showing current-voltage characteristics of the light-emitting device 1 and the comparative light-emitting device 1.
Figure 29:
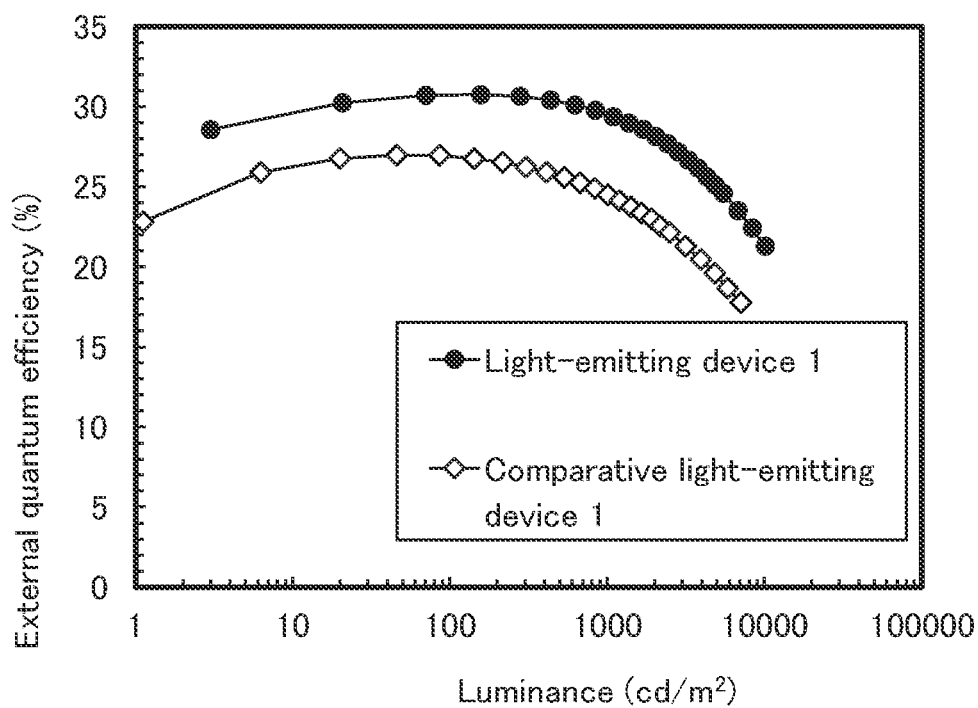
FIG. 29 is a graph showing external quantum efficiency-luminance characteristics of the light-emitting device 1 and the comparative light-emitting device 1.
Figure 30:
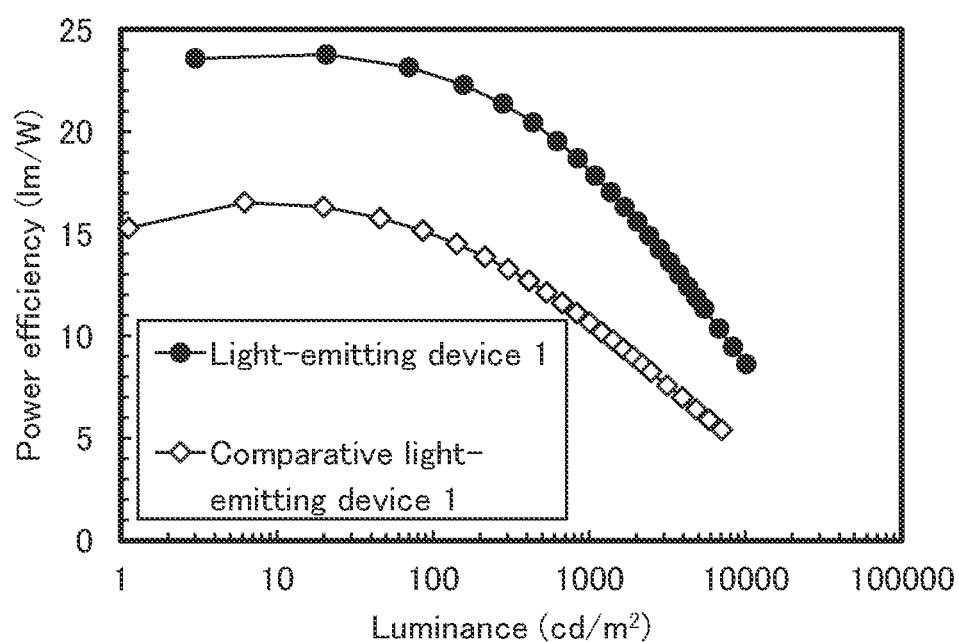
FIG. 30 is a graph showing power efficiency-luminance characteristics of the light-emitting device 1 and the comparative light-emitting device 1.
Figure 31:
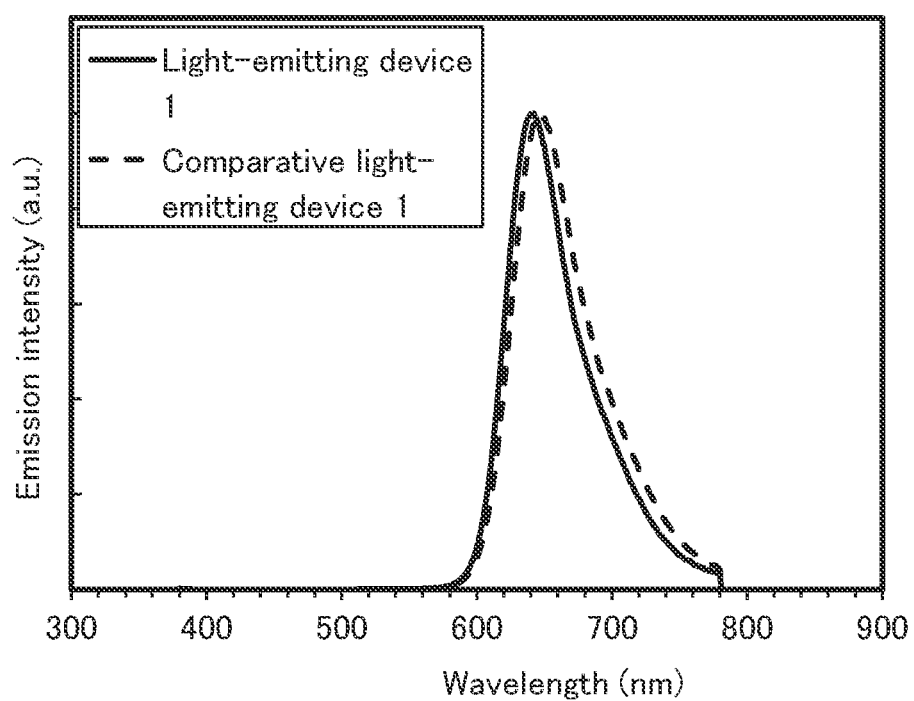
FIG. 31 is a graph showing emission spectra of the light-emitting device 1 and the comparative light-emitting device 1.

FIG. 25 shows luminance-current density characteristics of the light-emitting device 1 and the comparative light-emitting device 1. FIG. 26 shows current efficiency-luminance characteristics thereof. FIG. 27 shows luminance-voltage characteristics thereof. FIG. 28 shows current-voltage characteristics thereof. FIG. 29 shows external quantum efficiency-luminance characteristics thereof. FIG. 30 shows power efficiency-luminance characteristics thereof. FIG. 31 shows emission spectra thereof. The main characteristics of the light-emitting devices at a luminance of about 1000 cd/m$^2$ are shown below.

TABLE 4

| | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| Light-emitting device1 | 3.0 | 0.26 | 6.4 | 0.70 | 0.30 | 17.0 | 17.8 | 29.4 |
| Comparative light-emitting device 1 | 3.4 | 0.35 | 8.8 | 0.70 | 0.30 | 11.5 | 10.6 | 24.5 |

It is found from FIG. 25 to FIG. 30 that the light-emitting device 1 of one embodiment of the present invention has extremely favorable characteristics such as a low drive voltage, a high current efficiency, a high external quantum efficiency, and a high power efficiency, as compared to the comparative light-emitting device 1. In particular, large differences in the current efficiency and the power efficiency between the light-emitting devices stem not only from the drive voltage of the light-emitting device 1 being lower but also from a slight shift of the emission peak wavelength to a short wavelength side. That is, it can be said that an increase of the light in a region with a relatively high luminosity factor owing to the shift of the emission peak wavelength to a short wavelength side has more effect on the current efficiency and the power efficiency than on the external quantum efficiency. In addition, [Ir(dmdppr-m5CP)$_2$(debm)] used in the light-emitting device 1 has an emission spectrum with a narrow half width and thus emits light with high color purity. Owing to the narrow half width, a favorable chromaticity can be maintained even when the emission spectrum is shifted to a short wavelength side. The narrow half width means little light emission in a long wavelength region with a low luminosity factor. Thus, the light-emitting device 1 can be a more highly efficient light-emitting device.

Figure 32:
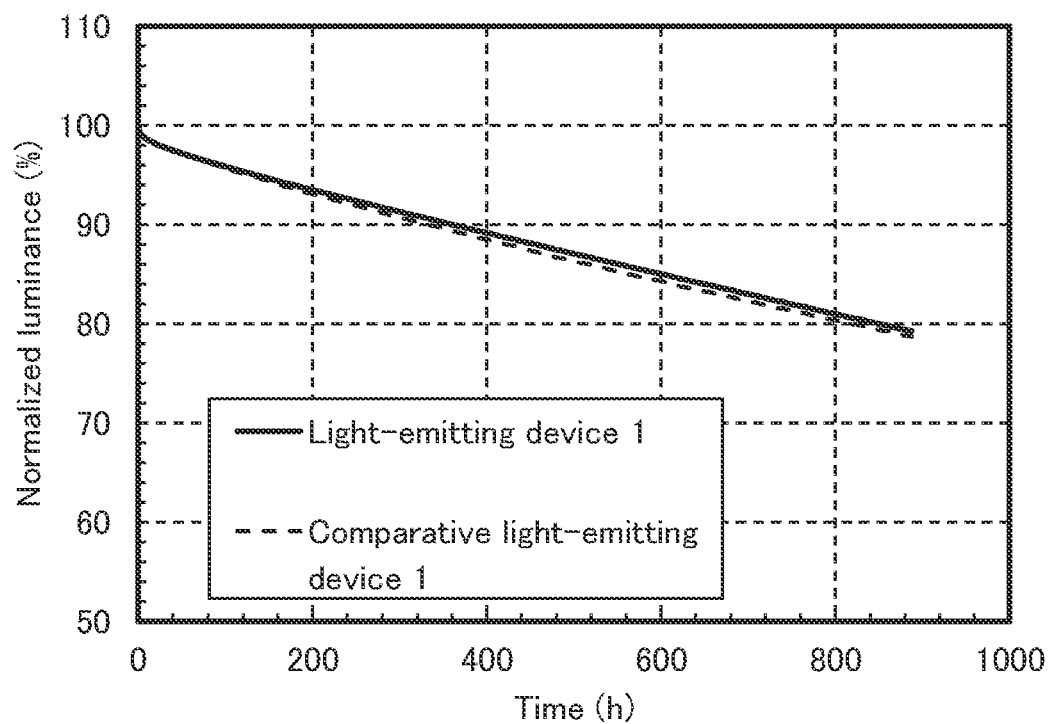
FIG. 32 is a graph showing a change in luminance over driving time of the light-emitting device 1 and the comparative light-emitting device 1.

FIG. 32 is a graph showing a change in luminance over driving time at a current density of 75 mA/cm$^2$. As shown in FIG. 32, the light-emitting device 1 and the comparative light-emitting device 1 both have favorable characteristics.

Although this graph shows the results when the two light-emitting devices were supplied with a current at the same current density, the light-emitting device 1 emits light at a higher emission efficiency than the comparative light-emitting device 1 as shown in FIG. 25 to FIG. 30. Therefore, the light-emitting device 1 emits light with a higher luminance when the two light-emitting devices are supplied with a current at the same current density. In fact, when a current of about 3 mA is supplied, the light-emitting device 1 has a luminance of approximately 10000 cd/m$^2$ while the comparative light-emitting device 1 has a luminance of approximately 7000 cd/m$^2$, which results in a large difference. That is, the amounts of current for light emission with the same luminance are different between the light-emitting devices, and the light-emitting device 1 can emit light with a certain luminance at a much lower current density than the comparative light-emitting device 1. This means that a load on the light-emitting device 1 is smaller than that on the comparative light-emitting 1 when the light-emitting devices emit light with the same luminance, and therefore the light-emitting device 1 substantially has a longer lifetime than the comparative light-emitting device 1 even when almost the same results are obtained when a current with the same current density is supplied to the light-emitting devices.

Example 8

In this example, a light-emitting device using the organometallic complex of one embodiment of the present invention and a comparative light-emitting device not using the organometallic complex are described. Structure formulae of compounds used for a light-emitting device 2 and a comparative light-emitting device 2 are shown below.

[Chemical Formula 36]

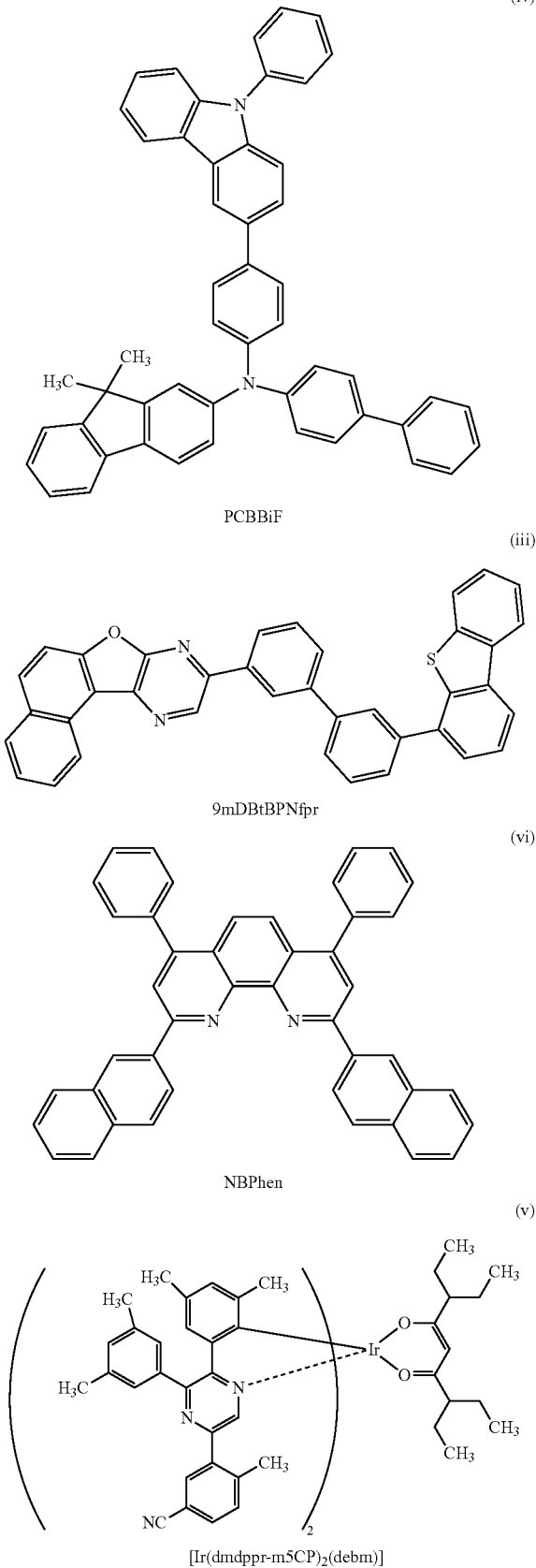

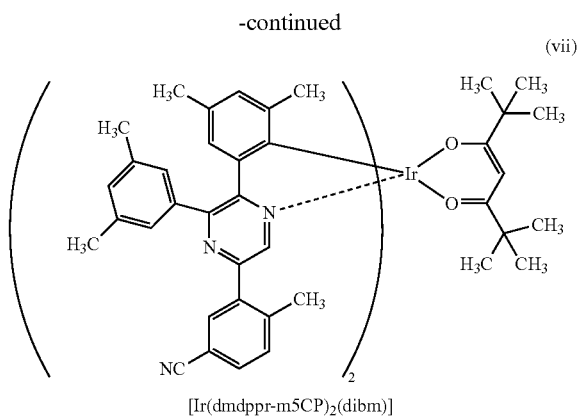

[Ir(dmdppr-m5CP)₂(dibm)] (vii)

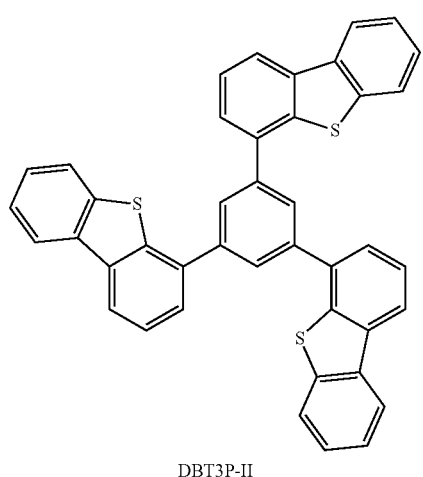

DBT3P-II (i)

(Fabrication Method of Light-Emitting Device 2)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 10 nm by a sputtering method, whereby the first electrode 101 was formed. The electrode area was 4 mm² (2 mm×2 mm).

Next, in pretreatment for forming the light-emitting device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately 10⁻⁴ Pa, vacuum baking was performed at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structure Formula (iv) and an electron acceptor material (OCHD-001) were deposited to a thickness of 10 nm by co-evaporation using resistance heating such that the weight ratio of PCBBiF to OCHD-001 was 1:0.1, whereby the hole-injection layer 111 was formed.

Subsequently, over the hole-injection layer 111, PCBBiF was deposited by evaporation to a thickness of 210 nm, whereby the hole-transport layer 112 was formed.

Then, 9-[3'-(dibenzothiophen-4-yl)bipheny-3-yl]naphtho[1',2':4,5]furo[2,3-b]pyrazine (abbreviation: 9mDBtBPNfpr) represented by Structure Formula (iii), N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structure Formula (iv), and bis{4,6-dimethyl-2-[5-(5-cyano-2-methylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-m5CP)₂(debm)]) represented by Structure Formula (v) were deposited to a thickness of 40 nm by co-evaporation such that the weight ratio of 9mDBtBPNfpr to PCBBiF and [Ir(dmdppr-m5CP)₂(debm)] was 0.7:0.3:0.1, whereby the light-emitting layer 113 was formed.

After that, over the light-emitting layer 113, a film of 9mDBtBPNfpr was formed to a thickness of 30 nm, and then 2,9-di(2-naphthyl)-4,7-diphenyl-1,10-phenanthroline (abbreviation: NBPhen) represented by Structure Formula (vi) was deposited by evaporation to a thickness of 10 nm, whereby the electron-transport layer 114 was formed. Then, lithium fluoride (LiF) was deposited by evaporation to a thickness of 1 nm, whereby the electron-injection layer 115 was formed.

After the formation of the electron-injection layer 115, the second electrode 102 was formed to a thickness of 15 nm by evaporation of an alloy of silver (Ag) and magnesium (Mg) in a volume ratio of Ag:Mg=10:1. Thus, the light-emitting device 2 was fabricated. The second electrode 102 is a transflective electrode having a function of reflecting light and a function of transmitting light; thus, the light-emitting device 2 of this example is a top-emission device in which light is extracted through the second electrode 102. Over the second electrode 102, 4,4,4''-(benzene-1,3,5-triyl)tri(dibenzothiophene) (abbreviation: DBT3P-II) represented by Structure Formula (i) was deposited by evaporation to a thickness of 80 nm so that outcoupling efficiency can be improved.

(Fabrication Method of Comparative Light-Emitting Device 2)

The comparative light-emitting device 2 was fabricated in the same manner as the light-emitting device 2 except that bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ²O,O')iridium(III) (abbreviation: [Ir(dmdppr-m5CP)₂(dpm)]) represented by Structure Formula (vii) was used instead of [Ir(dmdppr-m5CP)₂(debm)] in the light-emitting device 2, and the weight ratio of 9mDBtBPNfpr to PCBBiF and [Ir(dmdppr-m5CP)₂(dpm)] was set to 0.8:0.2:0.1.

The structures of the light-emitting devices are listed in the table below.

TABLE 5

| | Hole-injection layer 10 nm | Hole-transport layer *3 | Light-emitting layer 40 nm | Electron-transport layer 1 30 nm | Electron-transport layer 2 10 nm | Electron-injection layer 1 nm |
|---|---|---|---|---|---|---|
| Light-emitting device 2 | PCBBiF:OCHD-001 (1:0.1) | PCBBiF | 9mDBtBPNfpr:PCBBiF:*4 (0.7:0.3:0.1) | 9mDBtBPNfpr | NBPhen | LiF |
| Comparative light-emitting device 2 | | | 9mDBtBPNfpr:PCBBiF:*5 (0.7:0.3:0.1) | | | |

*3 Light-emitting device 2: 210 nm, Comparative light-emitting device 2: 215 nm
*4 [Ir(dmdppr-m5CP)$_2$(debm)]
*5 [Ir(dmdppr-m5CP)$_2$(dpm)]

The light-emitting devices were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the light-emitting devices were measured.

Figure 33:
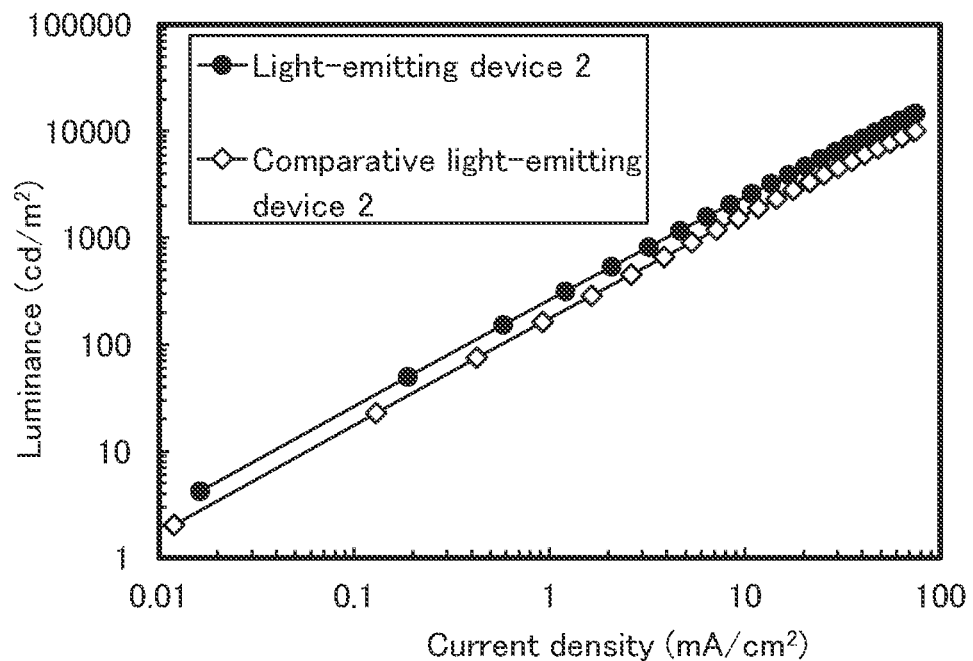
FIG. 33 is a graph showing luminance-current density characteristics of a light-emitting device 2 and a comparative light-emitting device 2.
Figure 34:
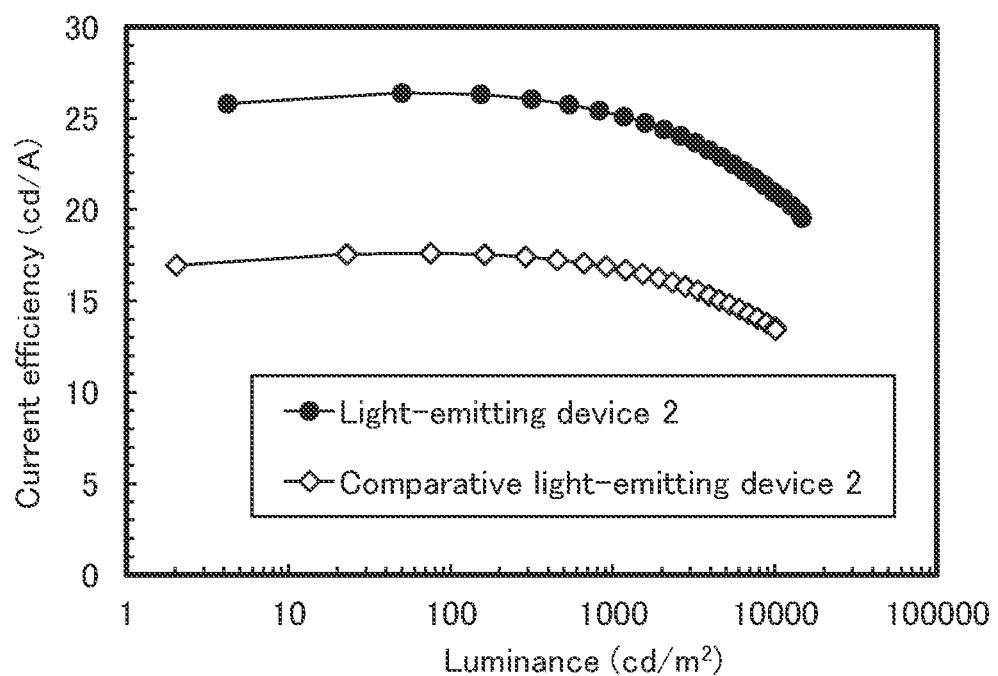
FIG. 34 is a graph showing current efficiency-luminance characteristics of the light-emitting device 2 and the comparative light-emitting device 2.
Figure 35:
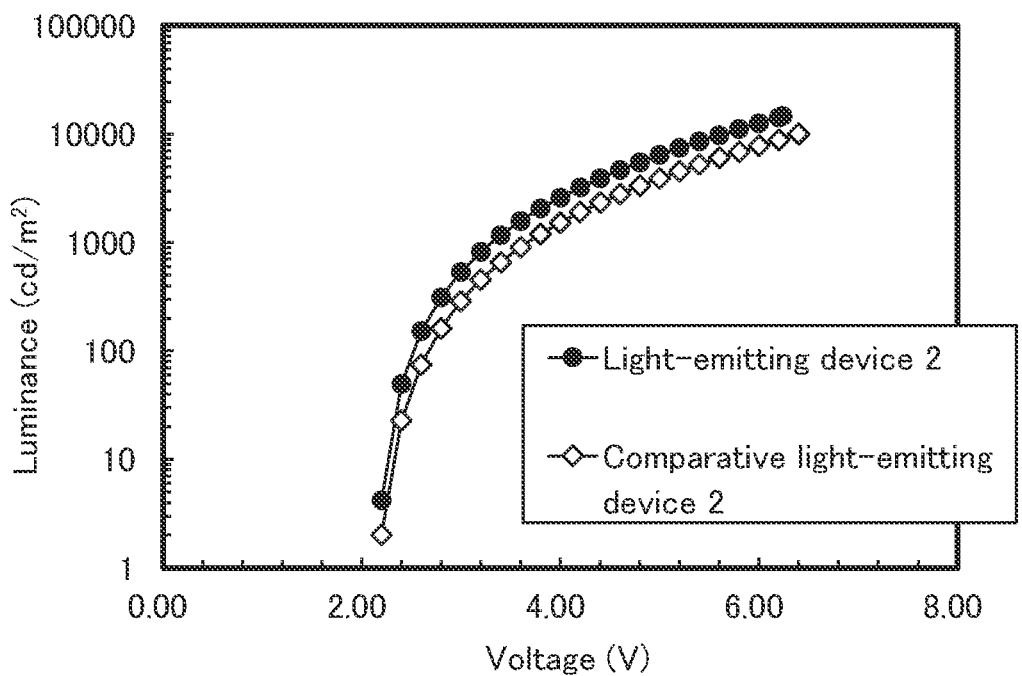
FIG. 35 is a graph showing luminance-voltage characteristics of the light-emitting device 2 and the comparative light-emitting device 2.
Figure 36:
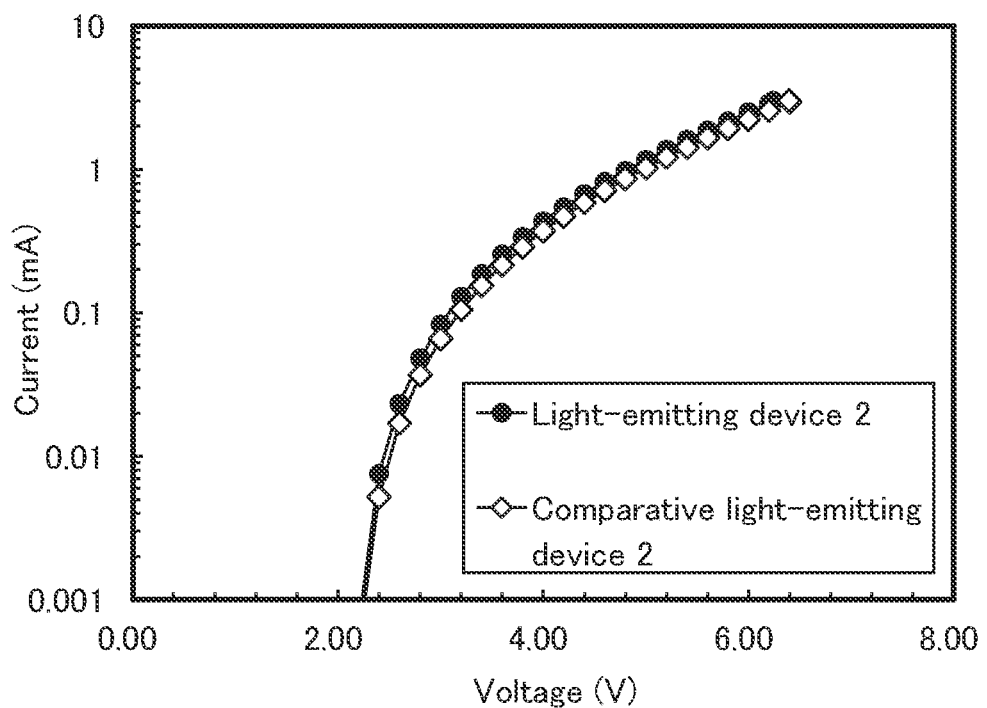
FIG. 36 is a graph showing current-voltage characteristics of the light-emitting device 2 and the comparative light-emitting device 2.
Figure 37:
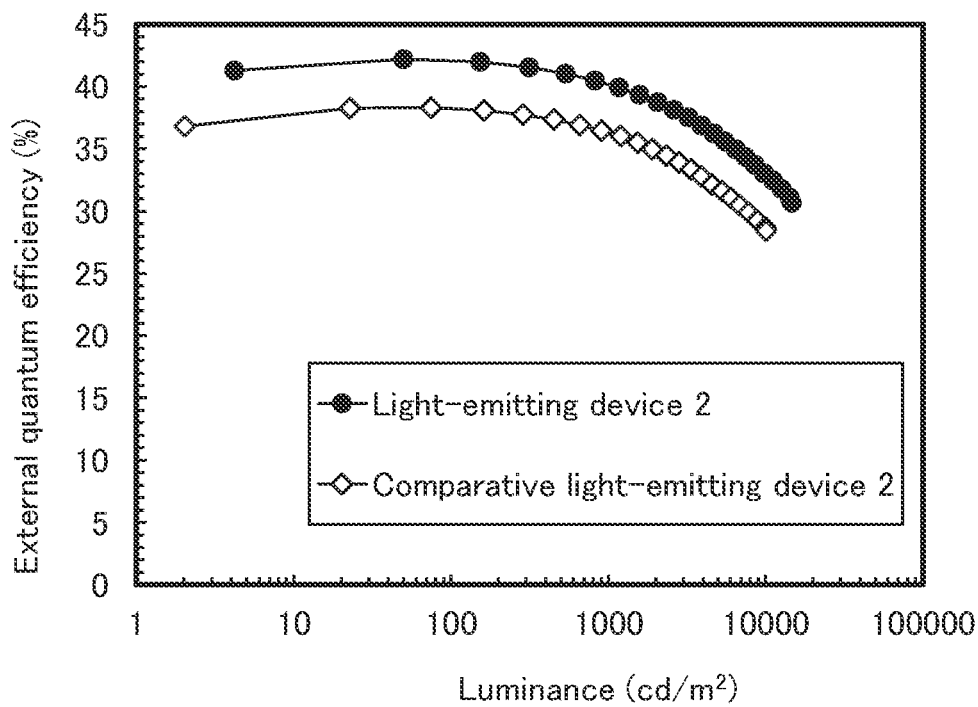
FIG. 37 is a graph showing external quantum efficiency-luminance characteristics of the light-emitting device 2 and the comparative light-emitting device 2.
Figure 38:
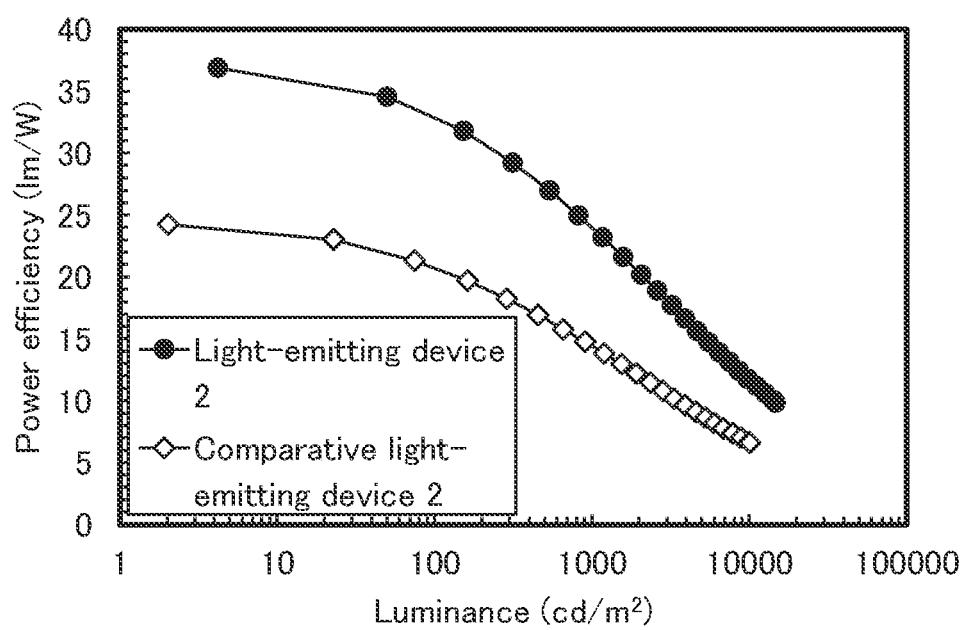
FIG. 38 is a graph showing power efficiency-luminance characteristics of the light-emitting device 2 and the comparative light-emitting device 2.
Figure 39:
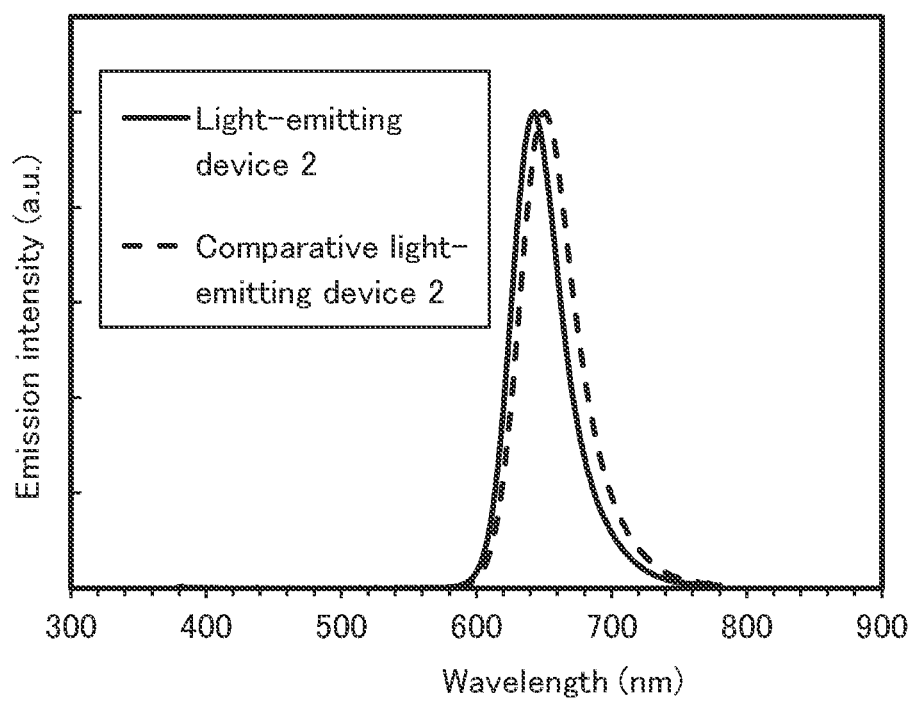
FIG. 39 is a graph showing emission spectra of the light-emitting device 2 and the comparative light-emitting device 2.

FIG. 33 shows luminance-current density characteristics of the light-emitting device 2 and the comparative light-emitting device 2. FIG. 34 shows current efficiency-luminance characteristics thereof. FIG. 35 shows luminance-voltage characteristics thereof. FIG. 36 shows current-voltage characteristics thereof. FIG. 37 shows external quantum efficiency-luminance characteristics thereof. FIG. 38 shows power efficiency-luminance characteristics thereof. FIG. 39 shows emission spectra thereof. The main characteristics of the light-emitting devices at a luminance of about 1000 cd/m$^2$ are shown below.

In addition, [Ir(dmdppr-m5CP)$_2$(debm)] used in the light-emitting device 2 has an emission spectrum with a narrow half width and thus emits light with high color purity. Owing to the narrow half width, a favorable chromaticity can be maintained even when the emission spectrum is shifted to a short wavelength side. The narrow half width means little light emission in a long wavelength region with a low luminosity factor. Thus, the light-emitting device 2 can be a more highly efficient light-emitting device.

Although the emission spectra of the light-emitting device 2 and the comparative light-emitting device 2 on a short wavelength side rise at almost the same wavelength, the emission spectrum of the light-emitting device 2 is slightly steeper and thus the peak of the emission spectrum of the light-emitting device 2 is located on a shorter wavelength side than that of the comparative light-emitting device 2 by approximately 4 nm. A portion of the emission spectrum of the light-emitting device 2 which is located on a longer

TABLE 6

| | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| Light-emitting device 2 | 3.4 | 0.19 | 4.7 | 0.71 | 0.29 | 25.1 | 23.2 | 39.9 |
| Comparative light-emitting device 2 | 3.6 | 0.21 | 5.4 | 0.71 | 0.29 | 16.9 | 14.7 | 36.5 |

It is found from FIG. 33 to FIG. 38 that the light-emitting device 2 of one embodiment of the present invention has extremely favorable characteristics such as a low drive voltage, a high current efficiency, a high external quantum efficiency, and a high power efficiency, as compared to the comparative light-emitting device 2. Differences in the current efficiency and the power efficiency between the light-emitting devices are larger than a difference in the external quantum efficiency not only due to the drive voltage of the light-emitting device 2 being lower but also largely due to the emission peak wavelength being shifted slightly to a short wavelength side. That is, it can be said that an increase of the light in a region with a relatively high luminosity factor owing to the shift in the emission peak wavelength to a short wavelength side has more effect on the current efficiency and the power efficiency than on the external quantum efficiency.

wavelength side than the peak thereof is located on a much shorter wavelength side than that of the comparative light-emitting device 2, which indicates that the light-emitting device 2 emits little light on a long wavelength side with a low luminosity factor.

These results show that differences in the current efficiency and the power efficiency between the light-emitting device 2 and the comparative light-emitting device 2 are larger than a difference in the external quantum efficiency and thus the light-emitting device 2 has extremely favorable characteristics.

Next, light-emitting devices 2-X and comparative light-emitting devices 2-X were fabricated by changing the thickness of the hole-transport layer 112 in the light-emitting device 2 and the comparative light-emitting device 2 as follows.

TABLE 7

| X | 1 | 2 | 3 | 4 | 5 | 6 | 7 | 8 | 9 | 10 | 11 | 12 |
|---|---|---|---|---|---|---|---|---|---|---|---|---|
| Thickness (nm) | 190 | 195 | 200 | 205 | 210 | 215 | 220 | 225 | 230 | 235 | 240 | 245 |

These light-emitting devices have different optical distances of the microcavity structures formed therein because of different thicknesses of the hole-transport layer 112. A difference in the optical distance in the microcavity structure causes a change in a wavelength of amplified light; thus, these light-emitting devices emit light of slightly different colors. Table 8 shows chromaticity x in a CIE chromaticity diagram of the light-emitting devices, which is an index of red light.

TABLE 8

| X | Light-emitting device 2-X | Comparative light-emitting device 2-X |
|---|---|---|
| 1 | 0.6921 | 0.6933 |
| 2 | 0.6962 | 0.6977 |
| 3 | 0.7001 | 0.7019 |
| 4 | 0.7028 | 0.7048 |
| 5 | 0.7057 | 0.708 |
| 6 | 0.7081 | 0.7104 |
| 7 | 0.7102 | 0.7117 |
| 8 | 0.7114 | 0.7132 |
| 9 | 0.712 | 0.714 |
| 10 | 0.7124 | 0.7144 |
| 11 | 0.7126 | 0.7144 |
| 12 | 0.7126 | 0.7144 |

Figure 40:
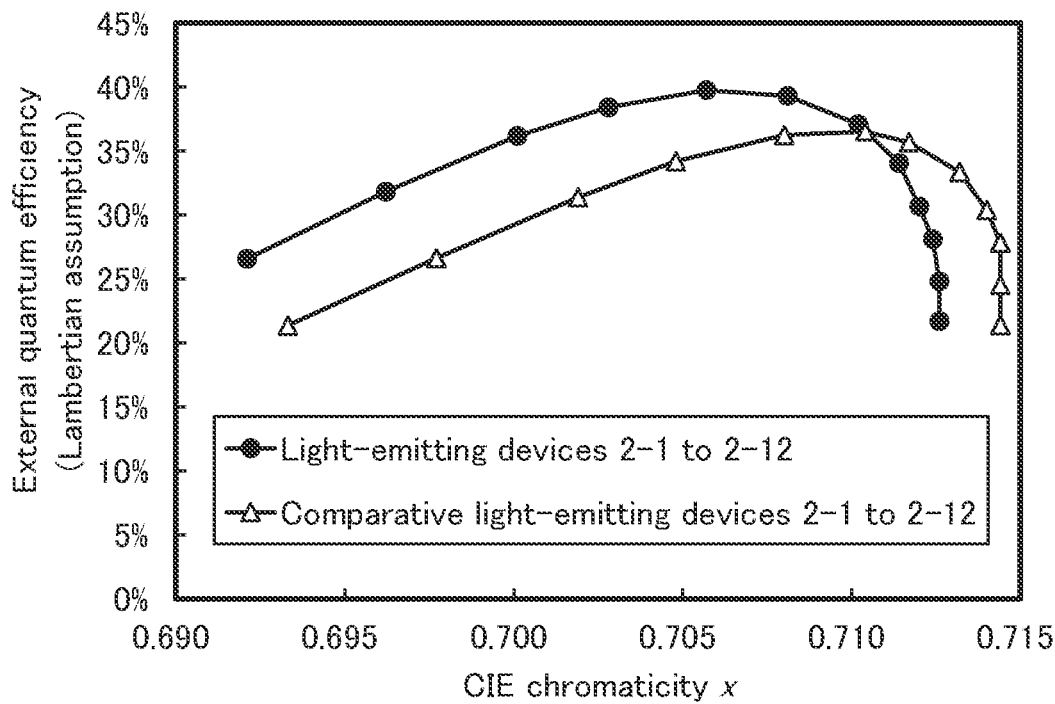
FIG. 40 is a graph showing external quantum efficiency-chromaticity x characteristics of light-emitting devices 2-1 to 2-12 and comparative light-emitting devices 2-1 to 2-12.
Figure 41:
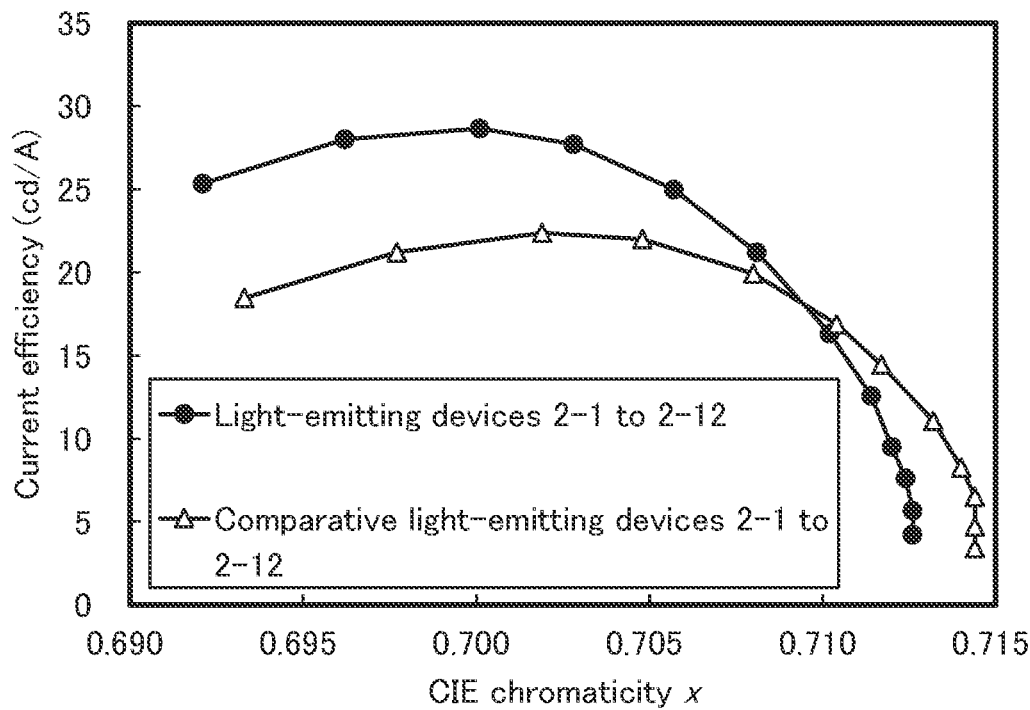
FIG. 41 is a graph showing current efficiency-chromaticity x characteristics of the light-emitting devices 2-1 to 2-12 and the comparative light-emitting devices 2-1 to 2-12.

FIG. 40 is a graph where the horizontal axis represents chromaticity x in the CIE chromaticity diagram of the light-emitting devices and the vertical axis represents the external quantum efficiency. FIG. 41 is a graph where the horizontal axis represents chromaticity x in the CIE chromaticity diagram of the light-emitting devices and the vertical axis represents the current efficiency. As shown in FIG. 40 and FIG. 41, the light-emitting devices 2-1 to 2-12 each have high external quantum efficiency and high current efficiency in the red-light region.

Figure 42:
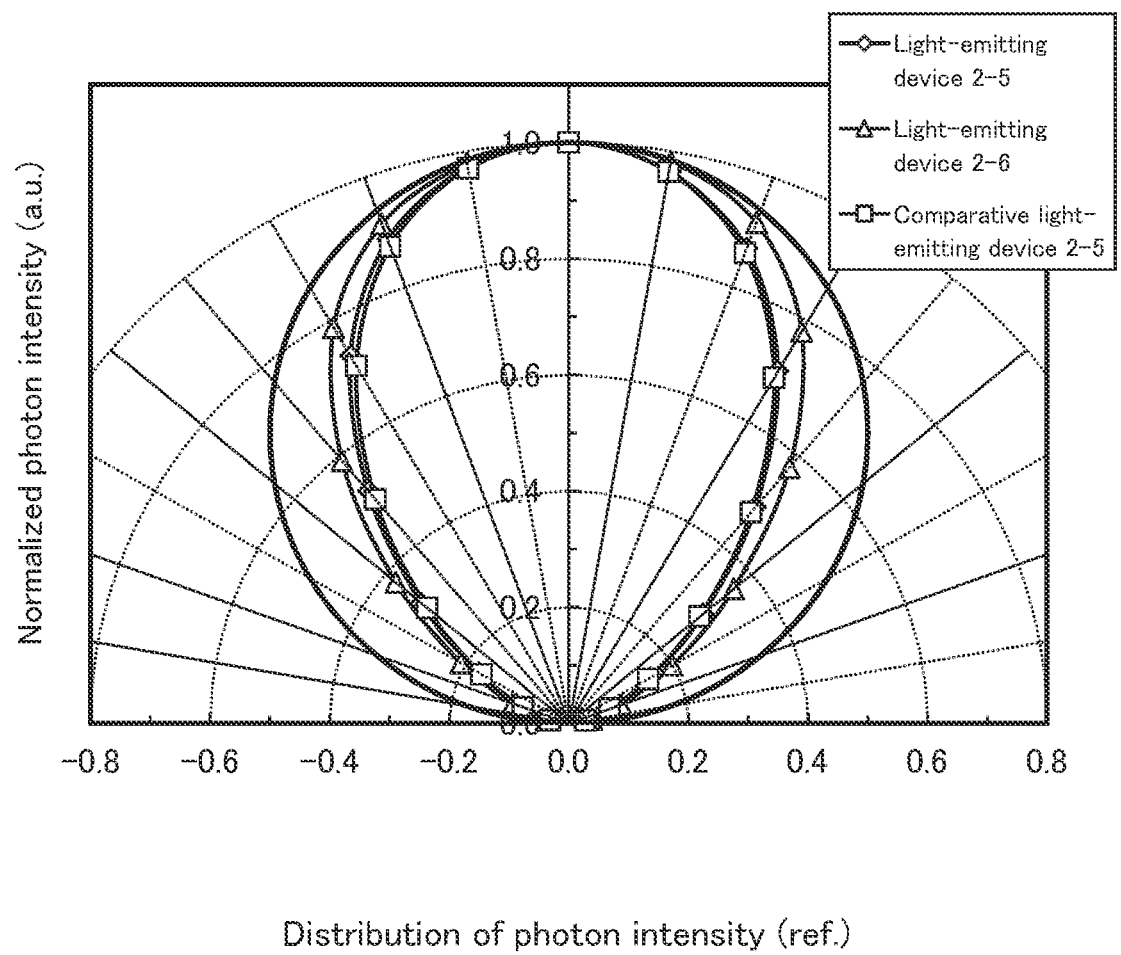
FIG. 42 is a graph showing viewing angle dependence of emission intensity of the light-emitting devices 2-5 and 2-6 and the comparative light-emitting device 2-5.
Figure 43:
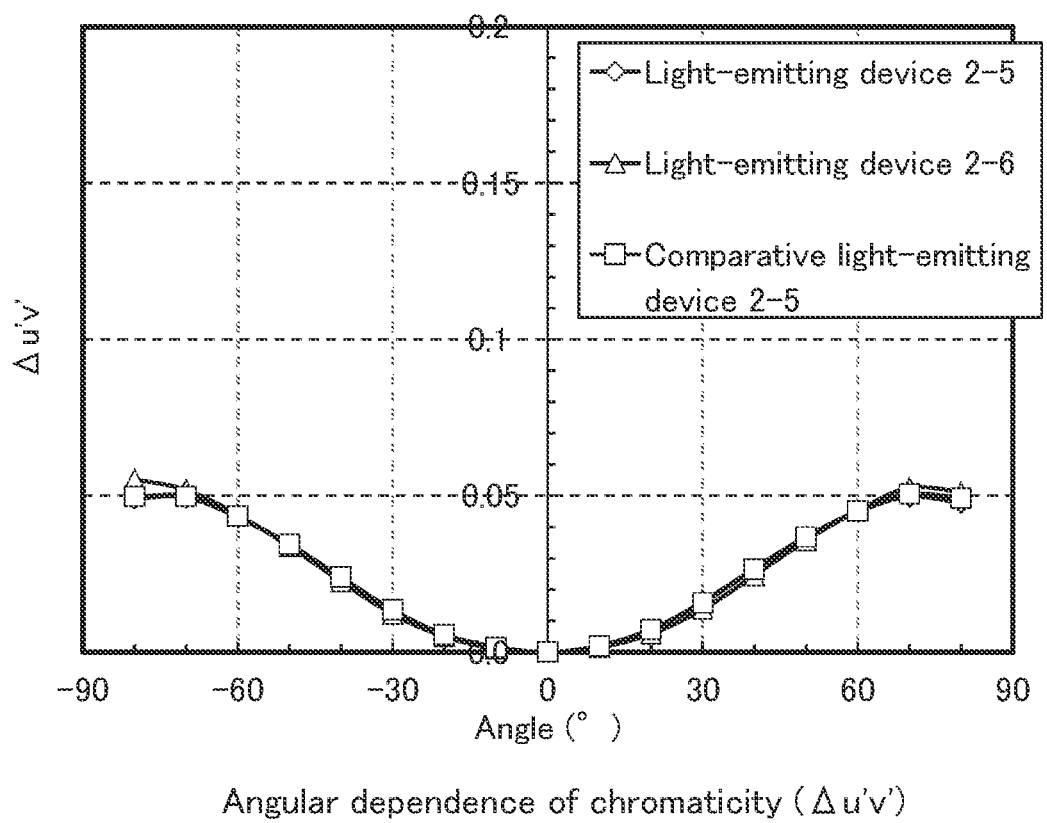
FIG. 43 is a graph showing viewing angle dependence of chromaticity of the light-emitting devices 2-5 and 2-6 and the comparative light-emitting device 2-5.

FIG. 42 is a graph showing viewing angle dependence of emission intensity of the light-emitting devices 2-5 and 2-6 and the comparative light-emitting device 2-5, and FIG. 43 is a graph showing viewing angle dependence of chromaticity of the light-emitting devices 2-5 and 2-6 and the comparative light-emitting device 2-5. As shown in FIG. 42 and FIG. 43, these light-emitting devices are effective for a display module that is oriented in a frontal direction.

Example 9

Synthesis Example 6

In this synthesis example, a synthesis method of bis{4,6-dimethyl-2-[5-(4-cyano-2,6-dimethylphenyl)-3-(3,5-dimethylphenyl)-2-pyrazinyl-κN]phenyl-κC}(3,7-diethyl-4,6-nonanedionato-κ²O,O')iridium(III) (abbreviation: [Ir(dmdppr-dmCP)$_2$(debm)]), which is the organometallic complex of the present invention represented by Structure Formula (104) in Embodiment 1, is specifically described. The structure formula of [Ir(dmdppr-dmCP)$_2$(debm)] is shown below.

[Chemical Formula 37]

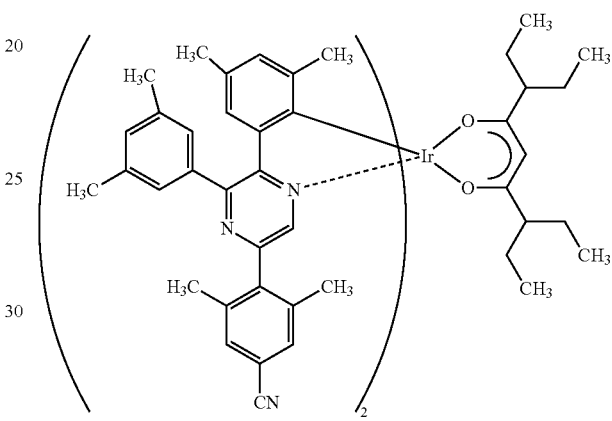

(104)

Step 1; Synthesis of bis{4,6-dimethyl-2-[5-(4-cyano-2,6-dimethylphenyl)-3-(3,5-dimethylphenyl)-2-pyrazinyl-1N]phenyl-κC}(3,7-diethyl-4,6-nonanedionato-κ²O,O')iridium(III) (abbreviation: [Ir(dmdppr-dmCP)$_2$(debm)])

First, 34 mL of 2-ethoxyethanol, 3.58 g of a dinuclear complex di-μ-chloro-tetrakis{4,6-dimethyl-2-[5-(4-cyano-2,6-dimethylphenyl)-3-(3,5-dimethylphenyl)-2-pyrazinyl-κN]phenyl-κC}diiridium(III) (abbreviation: [Ir(dmdppr-dmCP)$_2$Cl]$_2$), 1.10 g of 3,7-diethylnonane-4,6-dione (abbreviation: Hdebm), and 1.81 g of sodium carbonate were put into a recovery flask equipped with a reflux pipe, and the atmosphere in the flask was replaced with argon. After that, the mixture was irradiated with microwaves (2.45 GHz, 100 W) for 75 minutes to cause a reaction. The solvent was distilled off, the obtained residue was purified by silica gel column chromatography using dichloromethane and hexane as a developing solvent in a volume ratio of 6:1, and then recrystallization was performed with a mixed solvent of dichloromethane and methanol to give 1.37 g of the organometallic complex of the present invention, [Ir(dmdppr-dmCP)$_2$(debm)], as a red solid in a yield of 33%. By a train sublimation method, 1.36 g of the obtained red solid was purified. In the purification by sublimation, the solid was heated at 318° C. under a pressure of 2.6 Pa with an argon gas flow rate of 11 mL/min. After the purification by sublimation, 1.13 g of the target red solid was obtained in a yield of 83%. The synthesis scheme of Step 1 is shown below.

[Chemical Formula 38]

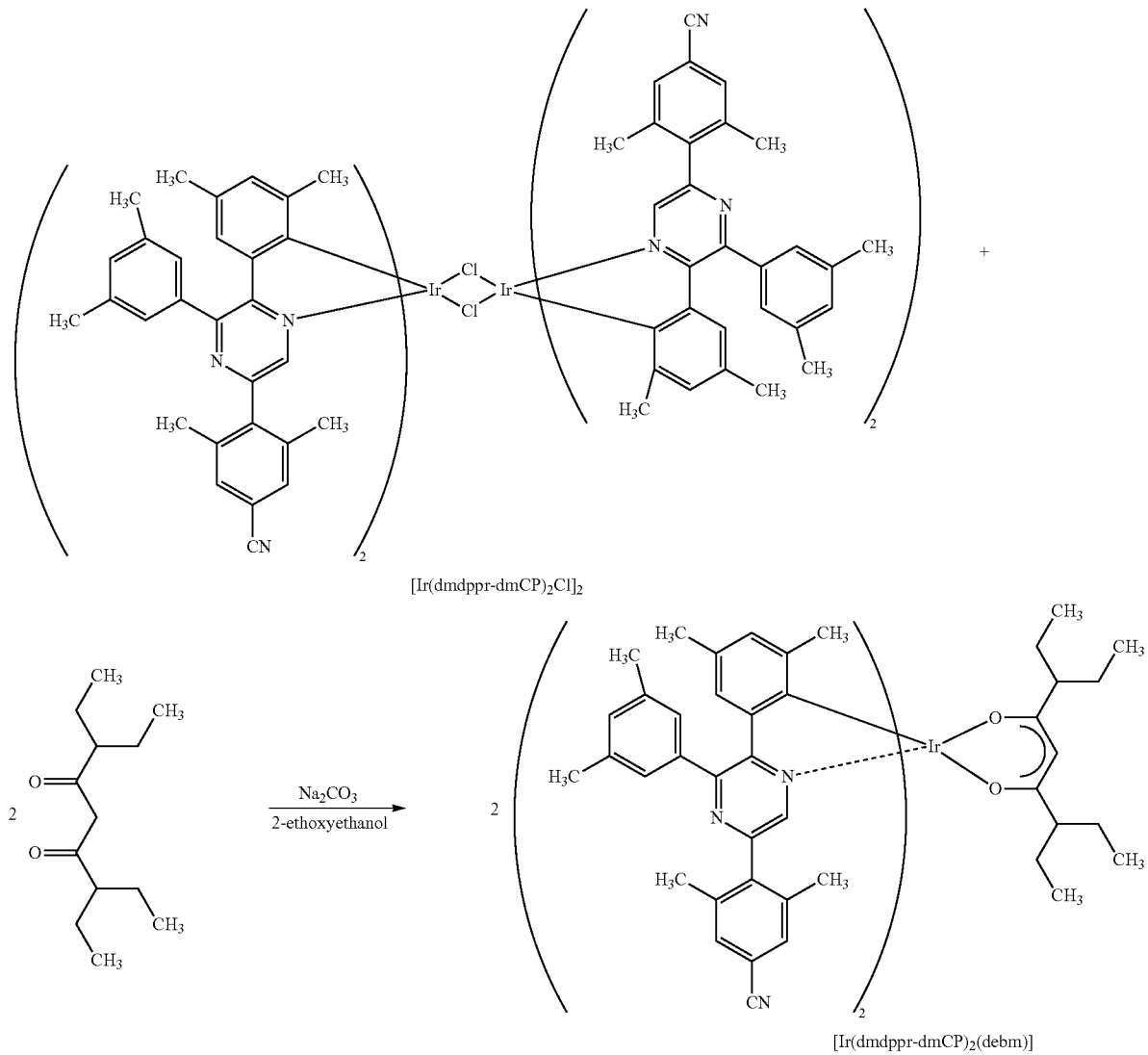

Figure 44:
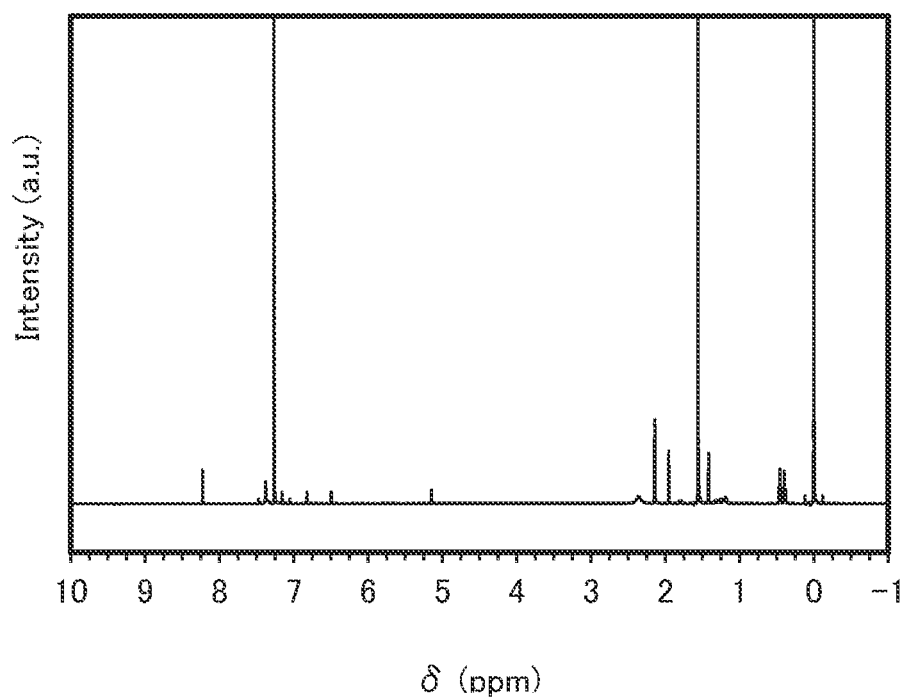
FIG. 44 is a $^1$H-NMR chart of [Ir(dmdppr-dmCP)$_2$(debm)]

Analysis results by nuclear magnetic resonance spectroscopy ($^1$H-NMR) of the red solid obtained in Step 1 are shown below. FIG. 44 is the $^1$H-NMR chart. These results revealed that the organometallic complex of the present invention, [Ir(dmdppr-dmCP)$_2$(debm)], was obtained in this synthesis example.

$^1$H-NMR. δ (CDCl$_3$): 0.40 (t, 6H), 0.46 (t, 6H), 1.15-1.35 (m, 8H), 1.42 (s, 6H), 1.77-1.83 (m, 2H), 1.95 (s, 6H), 2.14 (s, 12H), 2.36 (s, 12H), 5.14 (s, 1H), 6.50 (s, 2H), 6.82 (s, 2H), 7.15 (s, 2H), 7.32-7.40 (s, 8H), 8.22 (s, 2H).

Figure 45:
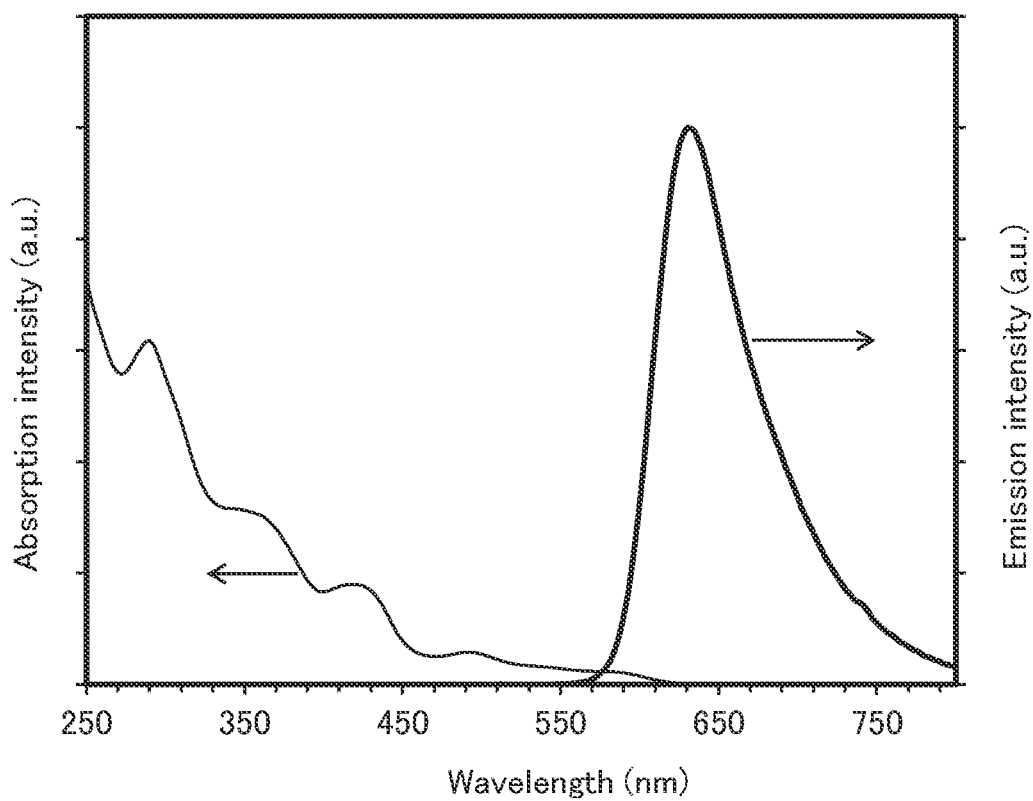
FIG. 45 shows an absorption spectrum and an emission spectrum of [Ir(dmdppr-dmCP)$_2$(debm)] in a solution.

FIG. 45 shows measurement results of an absorption spectrum and an emission spectrum of [Ir(dmdppr-dmCP)$_2$(debm)] in a dichloromethane solution. The absorption spectrum of [Ir(dmdppr-dmCP)$_2$(debm)] in the dichloromethane solution was measured with an ultraviolet-visible light spectrophotometer (V-550DS, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 45 shows that [Ir(dmdppr-dmCP)$_2$(debm)] in the dichloromethane solution has an absorption peak at 590 nm and an emission wavelength peak at 631 nm (excitation wavelength: 495 nm). These results indicate that [Ir(dmdppr-dmCP)$_2$(debm)] emits red light and can be used as a light-emitting substance.

Example 10

Synthesis Example 7

In this synthesis example, a synthesis method of bis{4,6-dimethyl-2-[5-(4-cyano-2-ethylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-eCP)$_2$(debm)]), which is the organometallic complex of the present invention represented by Structure Formula (110) in Embodiment 1, is specifically described. The structure formula of [Ir(dmdppr-eCP)$_2$(debm)] is shown below.

[Chemical Formula 39]

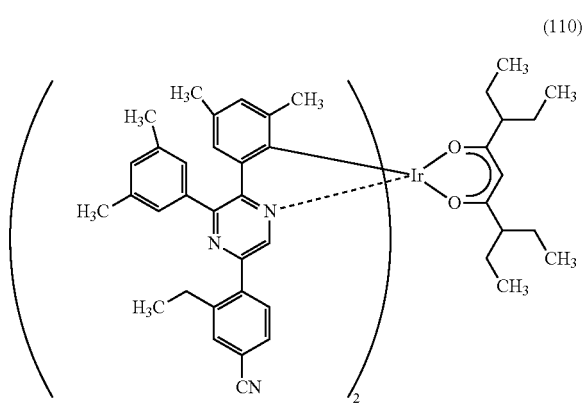

(110)

Step 1; Synthesis of 3-ethyl-4-(4,4,5,5-tetramethyl-1,3,2-dioxaborolan-2-yl)benzonitrile First, 2.01 g of 3-bromo-4-ethylbenzonitrile, 3.62 g of bis(pinacolato)diboron, 4.06 g of potassium acetate, and 48 mL of dimethylsulfoxide (abbreviation: DMSO) were put into a three-neck flask equipped with a reflux pipe, and the atmosphere in the flask was replaced with nitrogen. To this mixture, 0.16 g of [1,1'-bis(diphenylphosphino)ferrocene] palladium(II) dichloride dichloromethane adduct (abbreviation: $Pd(dppf)Cl_2$—$CH_2Cl_2$) and 0.16 g of 2-dicyclohexylphosphino-2',6'-dimethoxybiphenyl (abbreviation: S-Phos) were added, and the mixture was stirred at 100° C. for 14.5 hours. After a predetermined time elapsed, extraction was performed with toluene. Then, purification by silica gel column chromatography using hexane and ethyl acetate as a developing solvent in a ratio of 10:1 was performed, so that 1.34 g of a target white solid was obtained in a yield of 55%. The synthesis scheme of Step 1 is shown below.

[Chemical Formula 40]

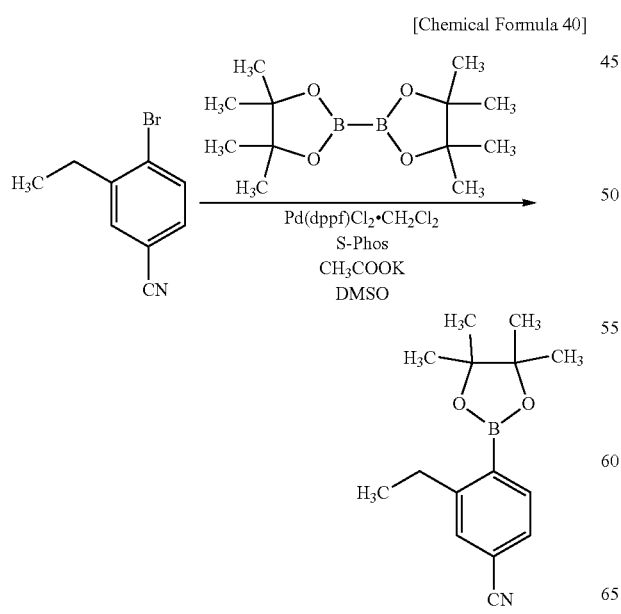

Step 2; Synthesis of 5-(4-cyano-2-ethylphenyl)-2,3-bis(3,5-dimethylphenyl)pyrazine (abbreviation: Hdmdppr-eCP)

Then, 1.91 g of 5,6-bis(3,5-dimethylphenyl)pyrazin-2-yl trifluoromethanesulfonate, 1.34 g of 3-ethyl-4-(4,4,5,5-tetramethyl-1,3,2-dioxaborolan-2-yl)benzonitrile, 3.25 g of tripotassium phosphate, 30 mL of toluene, and 3 mL of water were put into a three-neck flask, and the atmosphere in the flask was replaced with nitrogen. The mixture in the flask was degassed by being stirred under reduced pressure, 0.040 g of tris(dibenzylideneacetone)dipalladium(0) and 0.077 g of tris(2,6-dimethoxyphenyl)phosphine were added thereto, and the mixture was heated at 110° C. for five hours. After a predetermined time elapsed, extraction was performed with toluene. Then, purification by flash column chromatography using hexane and ethyl acetate as a developing solvent in a volume ratio of 10:1 was performed, so that 1.65 g of a target pyrazine derivative Hdmdppr-eCP (abbreviation) (yellowish white solid) was obtained in a yield of 90%. The synthesis scheme of Step 2 is shown below.

[Chemical Formula 41]

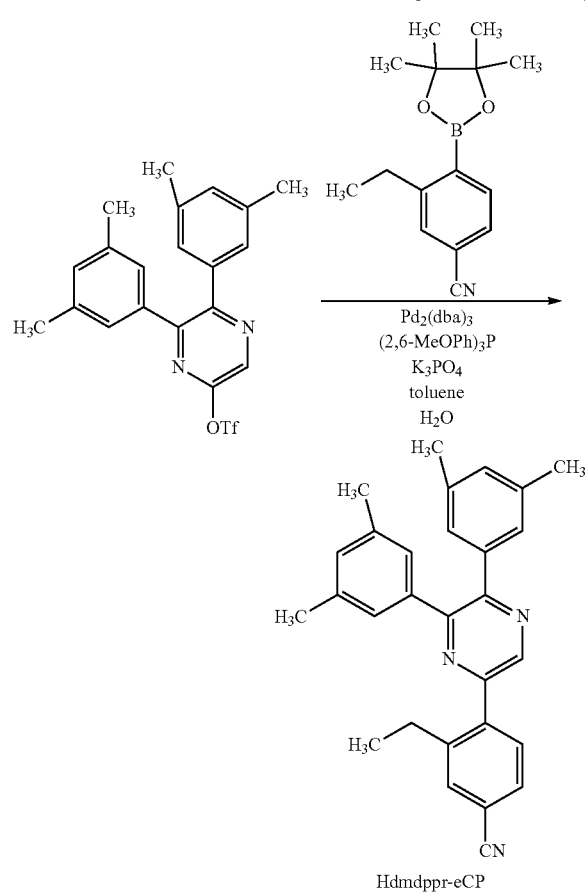

Step 3; Synthesis of di-µ-chloro-tetrakis{4,6-dimethyl-2-[5-(4-cyano-2-ethylphenyl)-3-(3,5-dimethylphenyl)-2-pyrazinyl-κN]phenyl-κC}diiridium(III) (abbreviation: [Ir(dmdppr-eCP)$_2$Cl]$_2$)

Next, 15 mL of 2-ethoxyethanol, 5 mL of water, 1.65 g of Hdmdppr-eCP obtained in Step 2, and 0.57 g of iridium chloride hydrate (IrCl$_3$·H$_2$O) (produced by Furuya Metal Co., Ltd.) were put into a recovery flask equipped with a reflux pipe, and the atmosphere in the flask was replaced with argon. After that, microwave irradiation (2.45 GHz, 100 W) was performed for an hour to cause a reaction. After a predetermined time elapsed, the obtained residue was suction-filtered and washed with methanol to give 1.34 g of a dinuclear complex [Ir(dmdppr-eCP)$_2$Cl]$_2$ (red solid) in a yield of 66%. The synthesis scheme of Step 3 is shown below.

Step 4; Synthesis of bis{4,6-dimethyl-2-[5-(4-cyano-2-ethylphenyl)-3-(3,5-dimethylphenyl)-2-pyrazinyl-κN]phenyl-κC}(3,7-diethyl-4,6-nonane-dionato-κ$^2$O,O')iridium(III) (abbreviation: [Ir(dmdppr-eCP)$_2$(debm)])

Into a recovery flask equipped with a reflux pipe were put 20 mL of 2-ethoxyethanol, 1.34 g of [Ir(dmdppr-eCP)$_2$Cl]$_2$ that is the dinuclear complex obtained in Step 3, 0.40 g of 3,7-diethylnonane-4,6-dione (abbreviation: Hdebm), and

[Chemical Formula 42]

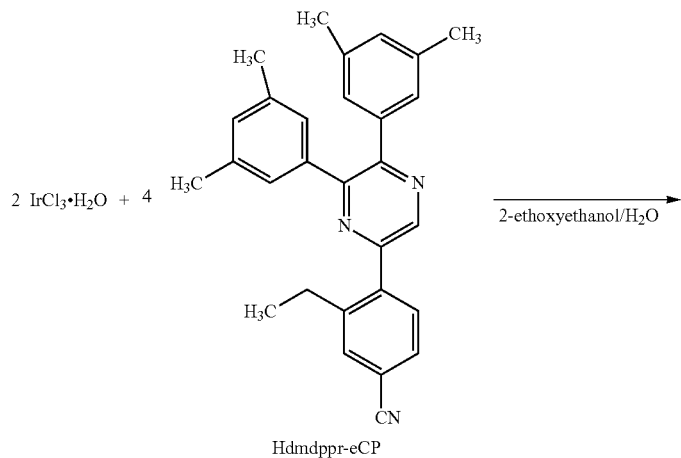

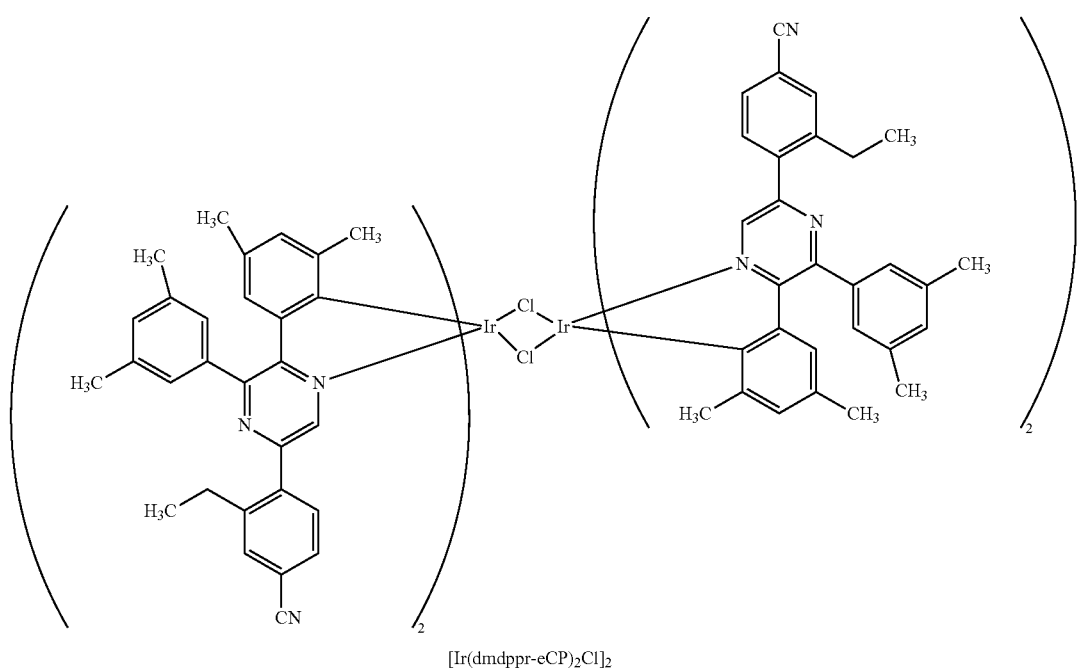

0.67 g of sodium carbonate. The atmosphere in the flask was replaced with argon. After that, microwave irradiation (2.45 GHz, 100 W) was performed for 1.5 hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.61 g of the organometallic complex of the present invention, [Ir(dmdppr-eCP)$_2$(debm)], as a deep red solid in a yield of 39%. Then, 0.60 g of the obtained deep red solid was purified by a train sublimation method. In the purification by sublimation, the solid was heated at 300° C. under a pressure of 2.5 Pa with an argon gas flow rate of 10.5 mL/min. After the purification by sublimation, 0.34 g of the target deep red solid was obtained in a yield of 57%. The synthesis scheme of Step 4 is shown below.

[Chemical Formula 43]

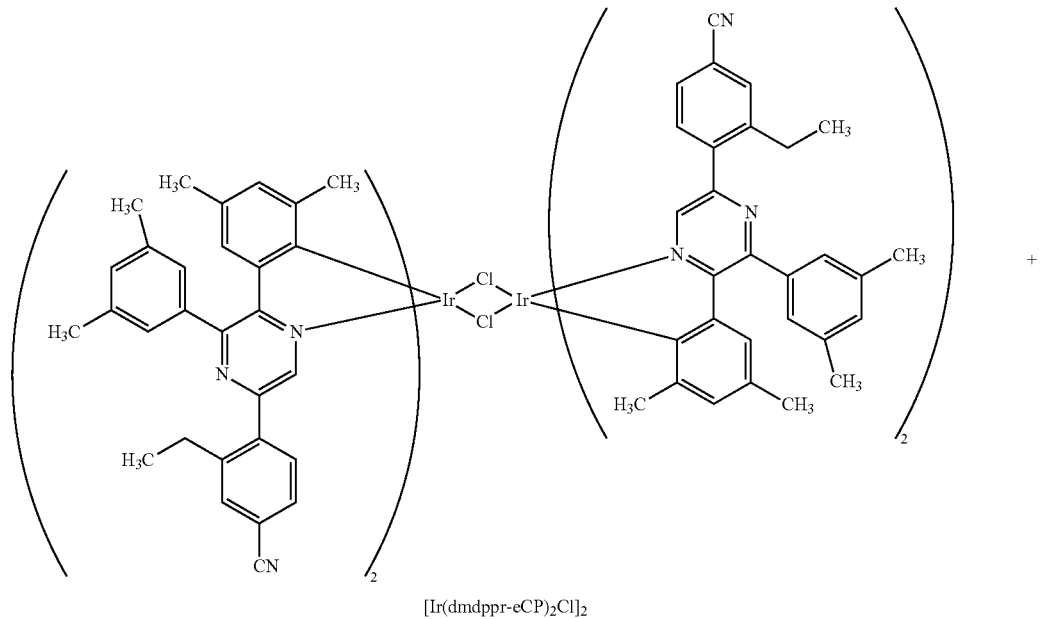

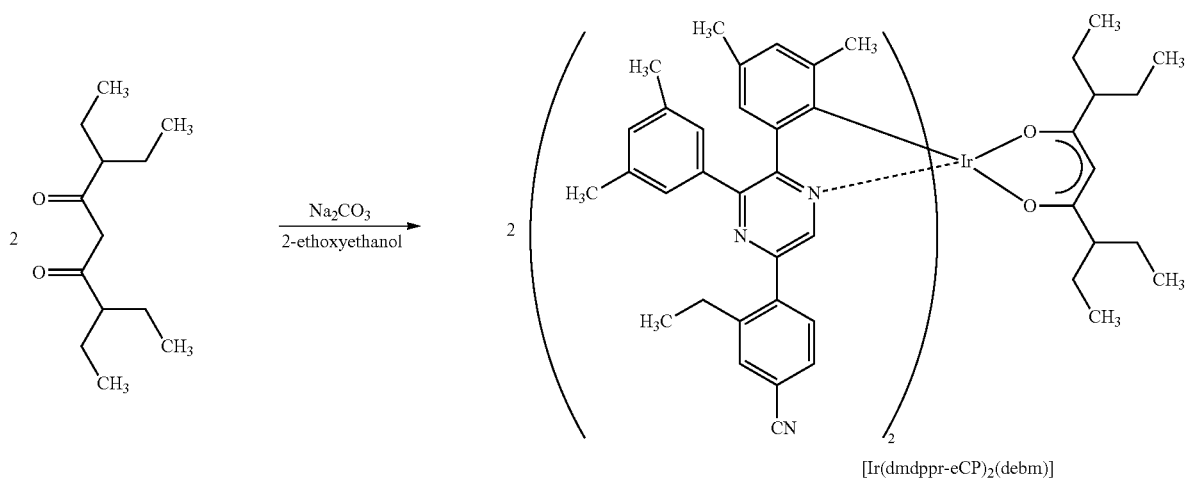

Figure 46:
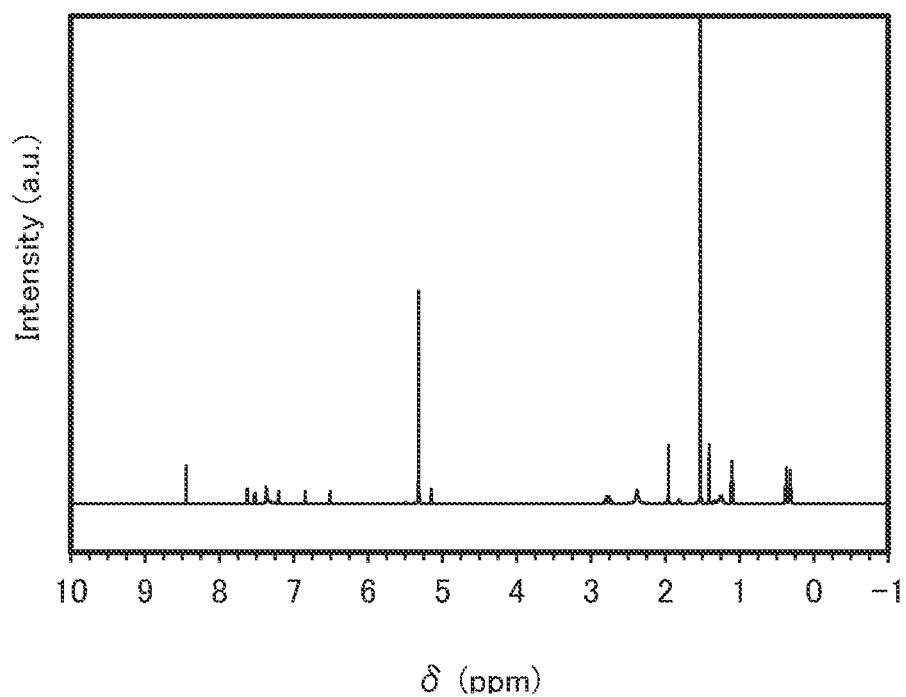
FIG. 46 is a $^1$H-NMR chart of [Ir(dmdppr-eCP)$_2$(debm)]

Analysis results by nuclear magnetic resonance spectroscopy ($^1$H-NMR) of the deep red solid obtained in Step 4 are shown below. FIG. 46 is the $^1$H-NMR chart. These results revealed that the organometallic complex of the present invention, [Ir(dmdppr-eCP)$_2$(debm)], was obtained in Synthesis example 7.

$^1$H-NMR. δ (CD$_2$Cl$_2$): 0.32 (t, 6H), 0.37 (t, 6H), 1.10 (t, 6H), 1.20-1.36 (m, 8H), 1.41 (s, 6H), 1.78-1.83 (m, 2H), 1.96 (s, 6H), 2.38 (s, 12H), 2.71-2.82 (m, 4H), 5.15 (s, 1H), 6.51 (s, 2H), 6.84 (s, 2H), 7.20 (s, 2H), 7.30-7.38 (m, 6H), 7.52 (d, 2H), 7.62 (s, 2H), 8.45 (s, 2H).

Figure 47:
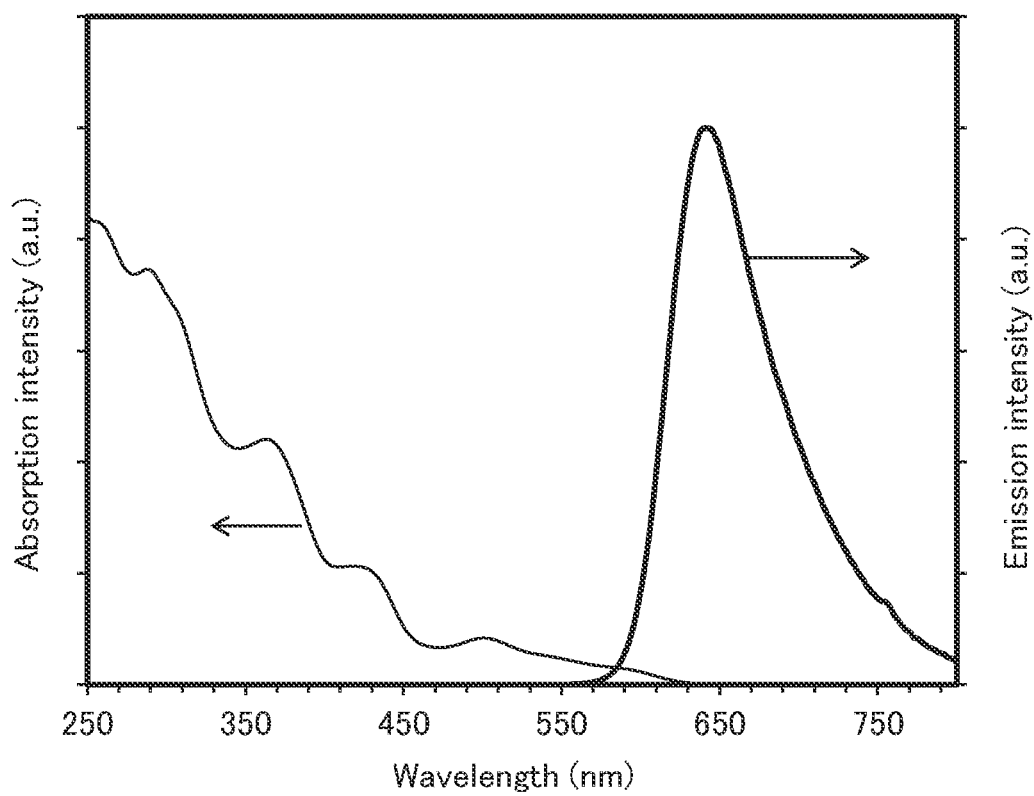
FIG. 47 shows an absorption spectrum and an emission spectrum of [Ir(dmdppr-eCP)$_2$(debm)] in a solution.

FIG. 47 shows measurement results of an absorption spectrum and an emission spectrum of [Ir(dmdpp-eCP)$_2$(debm)] in a dichloromethane solution. The absorption spectrum of [Ir(dmdppr-eCP)$_2$(debm)] in the dichloromethane solution was measured with an ultraviolet-visible light spectrophotometer (V-550DS, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 47 shows that [Ir(dmdppr-eCP)$_2$(debm)] in the dichloromethane solution has an absorption peak at 592 nm and an emission wavelength peak at 641 nm (excitation wavelength: 505 nm). These results indicate that [Ir (dmdppr-eCP)$_2$(debm)] emits red light and can be used as a light-emitting substance.

Example 11

Synthesis Example 8

In this synthesis example, a synthesis method of bis{4,6-dimethyl-2-[5-(3-cyano-2,4-dimethylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-24dm3CP)$_2$(debm)]), which is the organometallic complex of the present invention represented by Structure Formula (112) in Embodiment 1, is specifically described. The structure formula of [Ir(dmdppr-24dm3CP)$_2$(debm)] is shown below.

[Chemical Formula 44]

(112)

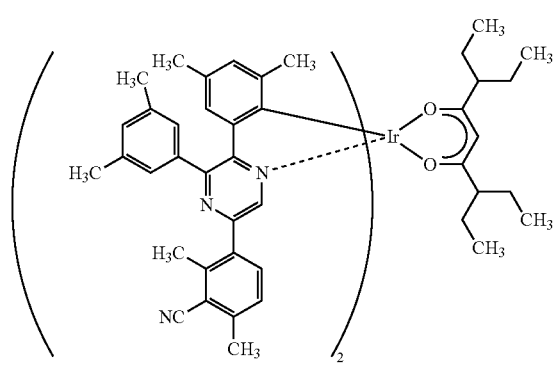

Step 1; Synthesis of 2,6-dimethyl-3-(4,4,5,5-tetramethyl-1,3,2-dioxaborolan-2-yl)benzonitrile First, 2.00 g of 3-bromo-2,6-dimethylbenzonitrile, 3.59 g of bis(pinacolato)diboron, 4.09 g of potassium acetate, and 48 mL of dimethylsulfoxide (abbreviation: DMSO) were put into a three-neck flask equipped with a reflux pipe, and the atmosphere in the flask was replaced with nitrogen. Then, 0.078 g of [1,1'-bis(diphenylphosphino)ferrocene]palladium (II) dichloride dichloromethane adduct (abbreviation: Pd(dppf)Cl$_2$—CH$_2$Cl$_2$) and 0.078 g of 2-dicyclohexylphosphino-2',6'-dimethoxybiphenyl (abbreviation: S-Phos) were added, and the mixture was stirred at 100° C. for 14.5 hours. After a predetermined time elapsed, extraction was performed with toluene. Then, purification by silica gel column chromatography using hexane and ethyl acetate as a developing solvent in a ratio of 10:1 was performed, so that 2.35 g of a target white solid was obtained in a yield of 99%. The synthesis scheme of Step 1 is shown below.

[Chemical Formula 45]

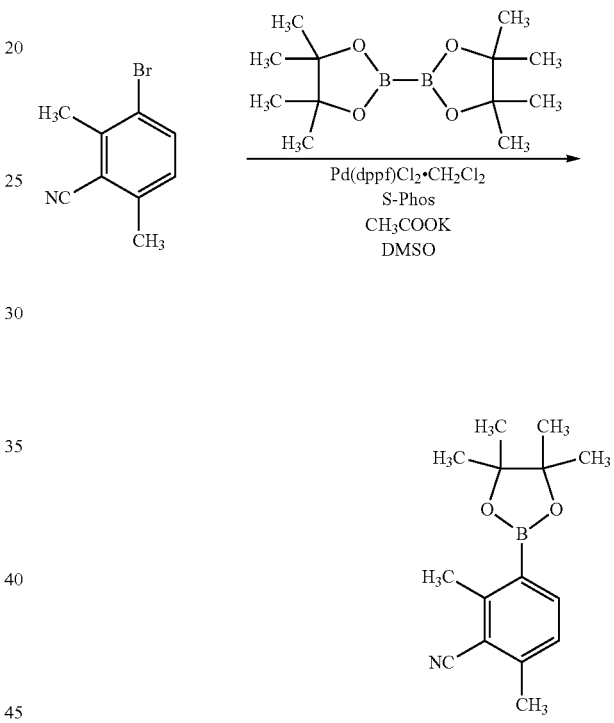

Step 2; Synthesis of 5-(3-cyano-2,4-dimethylphenyl)-2,3-bis(3,5-dimethylphenyl)pyrazine (abbreviation: Hdmdppr-24dm3CP)

Then, 2.58 g of 5,6-bis(3,5-dimethylphenyl)pyrazin-2-yl trifluoromethanesulfonate, 2.35 g of 2,6-dimethyl-3-(4,4,5,5-tetramethyl-1,3,2-dioxaborolan-2-yl)benzonitrile, 5.81 g of tripotassium phosphate, 50 mL of toluene, and 5 mL of water were put into a three-neck flask, and the atmosphere in the flask was replaced with nitrogen. The mixture in the flask was degassed by being stirred under reduced pressure, 0.054 g of tris(dibenzylideneacetone)dipalladium(0) and 0.11 g of tris(2,6-dimethoxyphenyl)phosphine were added thereto, and the mixture was heated at 110° C. for six hours. After a predetermined time elapsed, extraction was performed with toluene. Then, purification by flash column chromatography using hexane and ethyl acetate as a developing solvent in a volume ratio of 5:1 was performed, so that 1.28 g of a target pyrazine derivative Hdmdppr-24dm3CP (white solid) was obtained in a yield of 52%. The synthesis scheme of Step 2 is shown below.

[Chemical Formula 46]

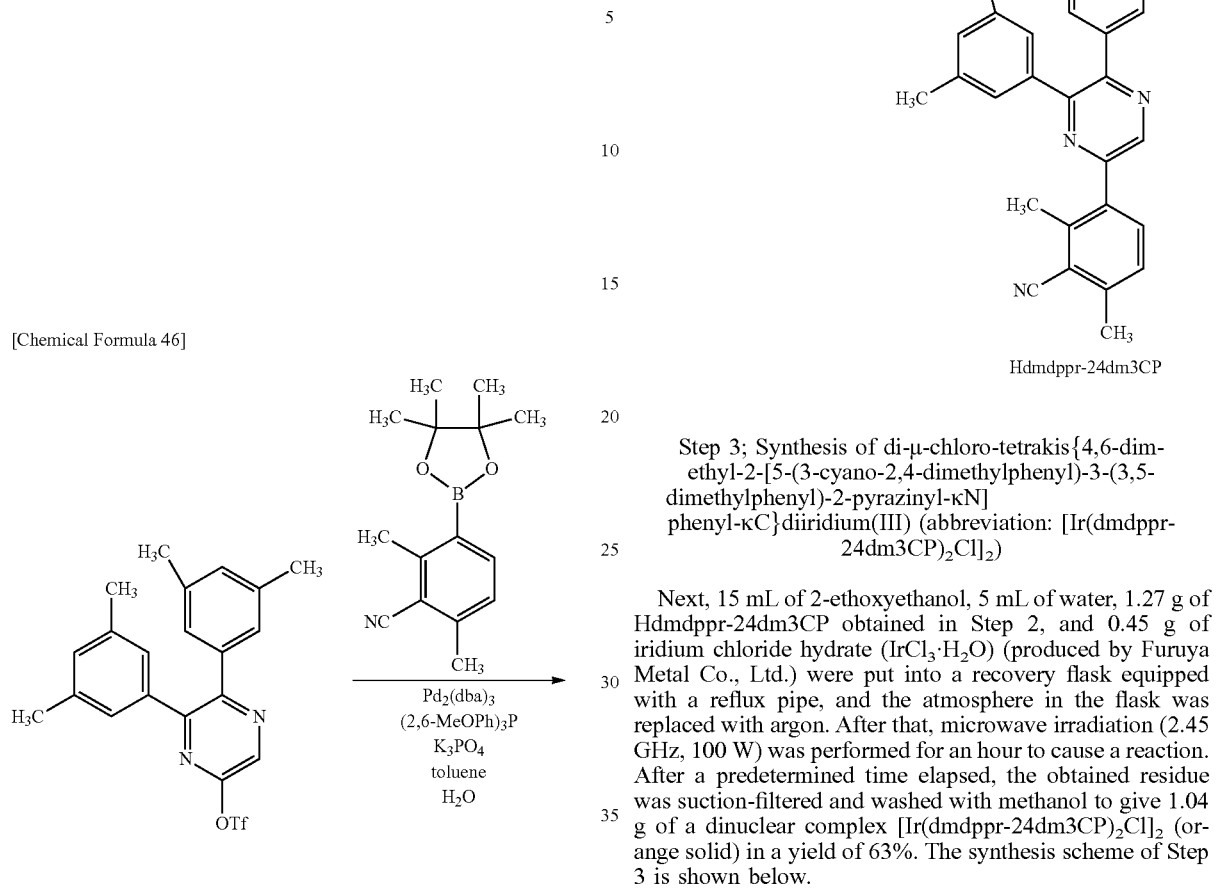

Step 3; Synthesis of di-μ-chloro-tetrakis{4,6-dimethyl-2-[5-(3-cyano-2,4-dimethylphenyl)-3-(3,5-dimethylphenyl)-2-pyrazinyl-κN]phenyl-κC}diiridium(III) (abbreviation: [Ir(dmdppr-24dm3CP)$_2$Cl]$_2$)

Next, 15 mL of 2-ethoxyethanol, 5 mL of water, 1.27 g of Hdmdppr-24dm3CP obtained in Step 2, and 0.45 g of iridium chloride hydrate (IrCl$_3$·H$_2$O) (produced by Furuya Metal Co., Ltd.) were put into a recovery flask equipped with a reflux pipe, and the atmosphere in the flask was replaced with argon. After that, microwave irradiation (2.45 GHz, 100 W) was performed for an hour to cause a reaction. After a predetermined time elapsed, the obtained residue was suction-filtered and washed with methanol to give 1.04 g of a dinuclear complex [Ir(dmdppr-24dm3CP)$_2$Cl]$_2$ (orange solid) in a yield of 63%. The synthesis scheme of Step 3 is shown below.

[Chemical Formula 47]

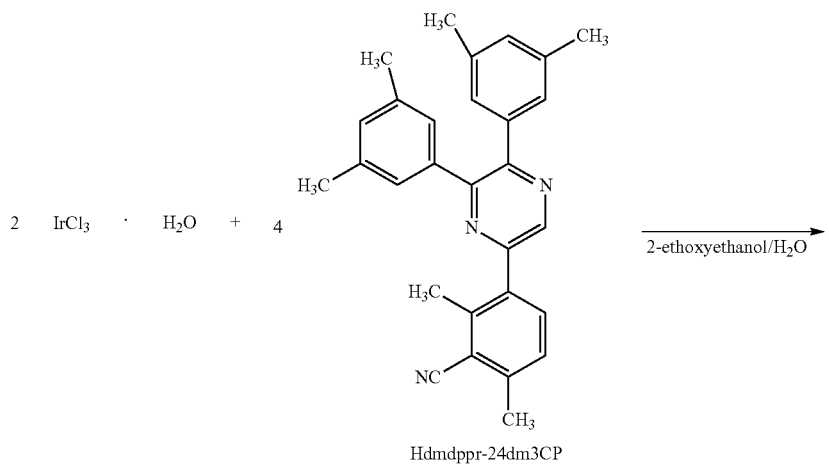

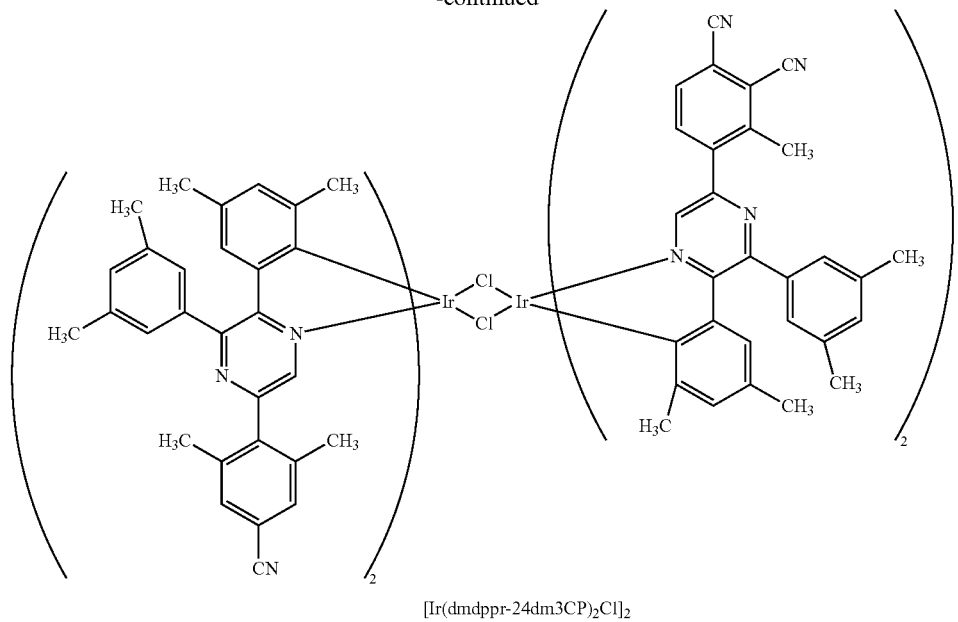

[Ir(dmdppr-24dm3CP)$_2$Cl]$_2$

Step 4; Synthesis of bis{4,6-dimethyl-2-[5-(3-cyano-2,4-dimethylphenyl)-3-(3,5-dimethylphenyl)-2-pyrazinyl-κN]phenyl-κC}(3,7-diethyl-4,6-nonane-dionato-κ$^2$O,O')iridium(III) (abbreviation: [Ir(dmdppr-24dm3CP)$_2$(debm)])

Into a recovery flask equipped with a reflux pipe were put 20 mL of 2-ethoxyethanol, 1.04 g of [Ir(dmdppr-24dm3CP)$_2$Cl]$_2$ that is the dinuclear complex synthesized in Step 3, 0.30 g of 3,7-diethylnonane-4,6-dione (abbreviation: Hdebm), and 0.50 g of sodium carbonate. The atmosphere in the flask was replaced with argon. After that, microwave irradiation (2.45 GHz, 100 W) was performed for two hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.45 g of the organometallic complex of the present invention, [Ir(dmdppr-24dm3CP)$_2$(debm)], as a red solid in a yield of 39%. Then, 0.43 g of the obtained red solid was purified by a train sublimation method. In the purification by sublimation, the solid was heated at 313° C. under a pressure of 2.7 Pa with an argon gas flow rate of 10.5 mL/min. After the purification by sublimation, 0.33 g of the target deep red solid was obtained in a yield of 77%. The synthesis scheme of Step 4 is shown below.

[Chemical Formula 48]

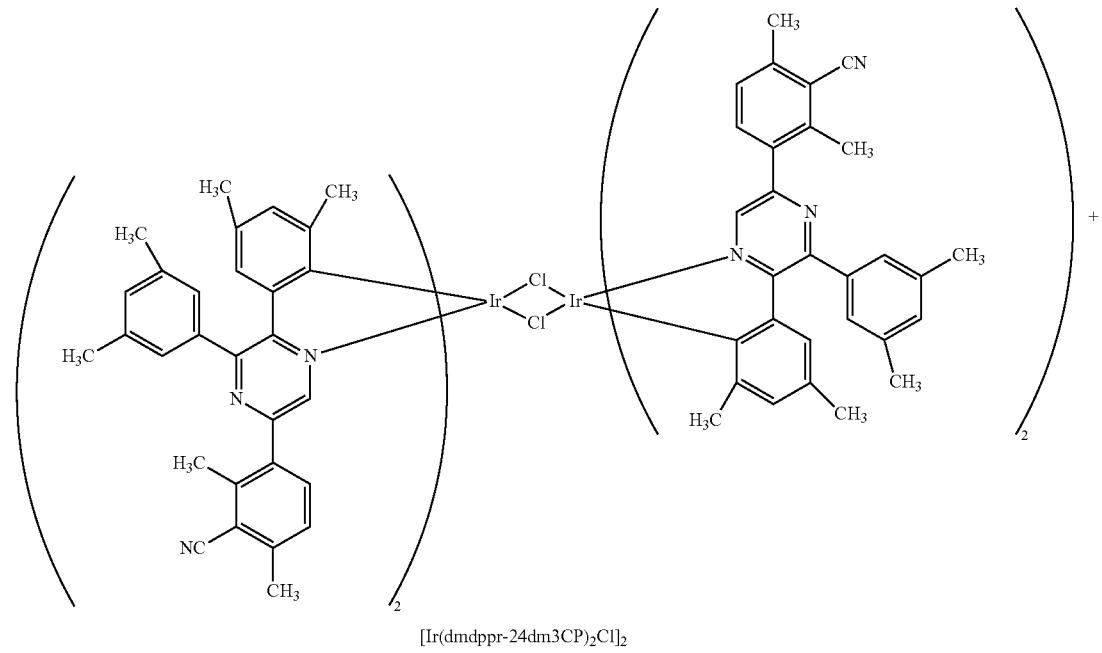

[Ir(dmdppr-24dm3CP)$_2$Cl]$_2$

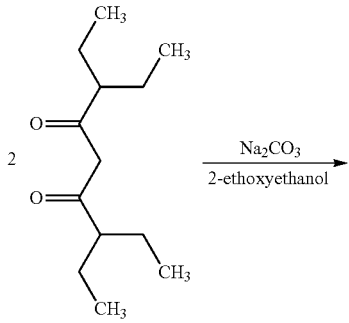 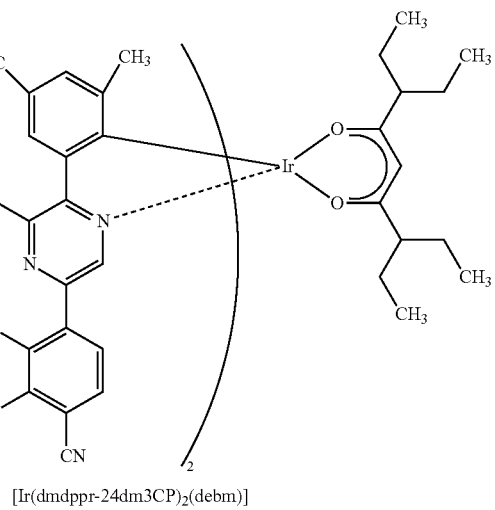

[Ir(dmdppr-24dm3CP)₂(debm)]

Figure 48:
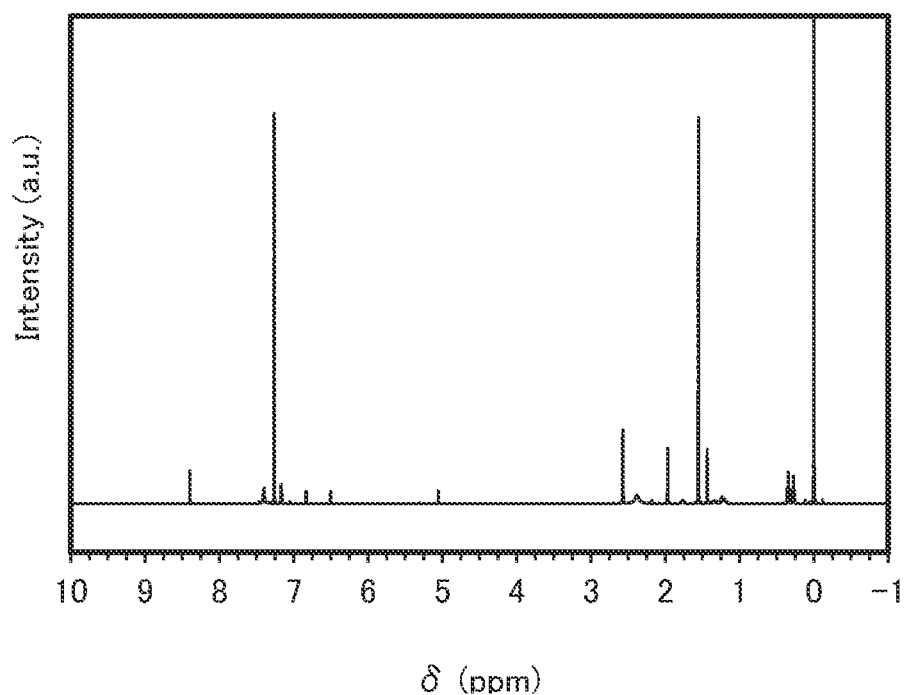
FIG. 48 is a $^1$H-NMR chart of [Ir(dmdppr-24dm3CP)$_2$(debm)]

Analysis results by nuclear magnetic resonance spectroscopy (¹H-NMR) of the red solid obtained in Step 4 are shown below. FIG. 48 is the ¹H-NMR chart. These results revealed that the organometallic complex of the present invention, [Ir(dmdppr-24dm3CP)₂(debm)], was obtained in this synthesis example.

¹H-NMR. δ (CDCl₃): 0.27 (t, 6H), 0.35 (t, 6H), 1.16-1.25 (m, 6H), 1.31-1.37 (m, 2H), 1.43 (s, 6H), 1.74-1.79 (s, 2H), 1.97 (s, 6H), 2.38 (s, 12H), 2.57 (s, 12H), 5.05 (s, 1H), 6.50 (s, 2H), 6.83 (s, 2H), 7.15-7.17 (m, 4H), 7.36-7.44 (m, 6H), 8.39 (s, 2H).

Figure 49:
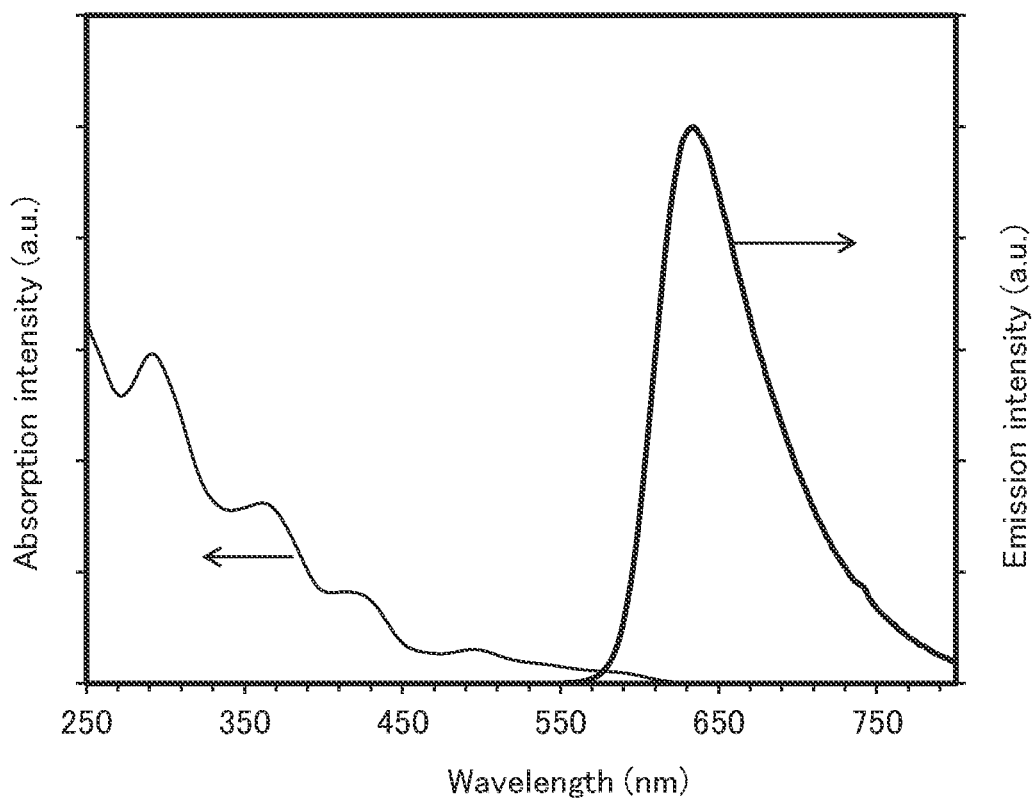
FIG. 49 shows an absorption spectrum and an emission spectrum of [Ir(dmdppr-24dm3CP)$_2$(debm)] in a solution.

FIG. 49 shows measurement results of an absorption spectrum and an emission spectrum of [Ir(dmdppr-24dm3CP)₂(debm)] in a dichloromethane solution. The absorption spectrum of [Ir(dmdppr-24dm3CP)₂(debm)] in the dichloromethane solution was measured with an ultraviolet-visible light spectrophotometer (V-550DS, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 49 shows that [Ir(dmdppr-24dm3CP)₂(debm)] in the dichloromethane solution has an absorption peak at 587 nm and an emission wavelength peak at 634 nm (excitation wavelength: 495 nm). These results indicate that [Ir(dmdppr-24dm3CP)₂(debm)] emits red light and can be used as a light-emitting substance.

Example 12

Synthesis Example 9

In this synthesis example, a synthesis method of bis{4,6-dimethyl-2-[5-(4-cyano-2-methylphenyl)-3-(3,5-dimethylphenyl)-2-pyrazinyl-κN]phenyl-κC}(1,3-dicyclohexyl-1,3-propanedionato-κ²O,O')iridium(III) (abbreviation: [Ir(dmdppr-mCP)₂(dchm)]), which is the organometallic complex of the present invention represented by Structure Formula (119) in Embodiment 1, is specifically described. The structure formula of [Ir(dmdppr-mCP)₂(dchm)] is shown below.

[Chemical Formula 49]

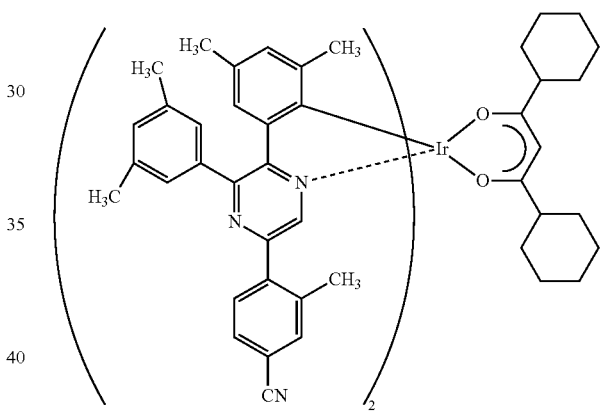

(119)

Step 1; Synthesis of bis{4,6-dimethyl-2-[5-(4-cyano-2-methylphenyl)-3-(3,5-dimethylphenyl)-2-pyrazinyl-κN]phenyl-κC}(1,3-dicyclohexyl-1,3-propanedionato-κ²O,O')iridium(III) (abbreviation: [Ir(dmdppr-mCP)₂(dchm)])

First, 25 mL of 2-ethoxyethanol, 2.19 g of a dinuclear complex di-μ-chloro-tetrakis{4,6-dimethyl-2-[5-(4-cyano-2,5-dimethylphenyl)-3-(3,5-dimethylphenyl)-2-pyrazinyl-κN]phenyl-κC}diiridium(III) (abbreviation: [Ir(dmdppr-mCP)₂Cl]₂), 0.78 g of 1,3-dicyclohexyl-1,3-propanedione (abbreviation: Hdchm), and 1.17 g of sodium carbonate were put into a recovery flask equipped with a reflux pipe, and the atmosphere in the flask was replaced with argon. After that, the mixture was irradiated with microwaves (2.45 GHz, 100 W) for 2.5 hours to cause a reaction. The solvent was distilled off, the obtained residue was purified by silica gel column chromatography using dichloromethane and hexane as a developing solvent in a volume ratio of 4:1, and then recrystallization was performed with a mixed solvent of dichloromethane and methanol to give 0.28 g of the organometallic complex of the present invention, [Ir(dmdppr-mCP)$_2$(dchm)], as a deep red solid in a yield of 11%. By a train sublimation method, 0.28 g of the obtained deep red solid was purified. In the purification by sublimation, the solid was heated at 320° C. under a pressure of 2.6 Pa with an argon gas flow rate of 10.5 mL/min. After the purification by sublimation, 0.10 g of the target deep red solid was obtained in a yield of 36%. The synthesis scheme of Step 1 is shown below.

[Chemical Formula 50]

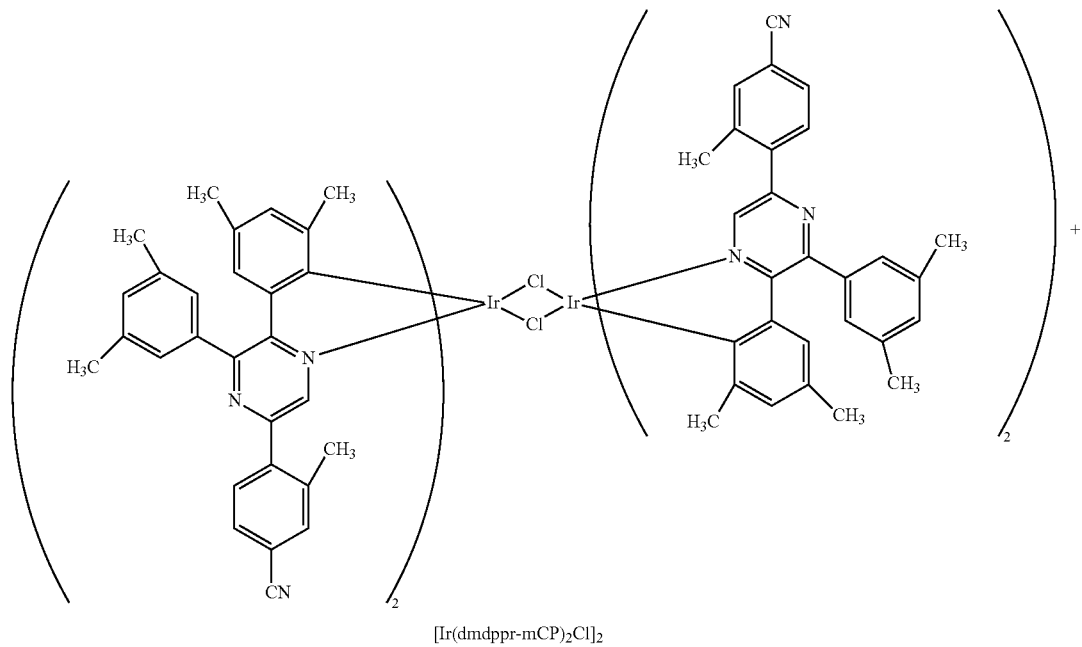

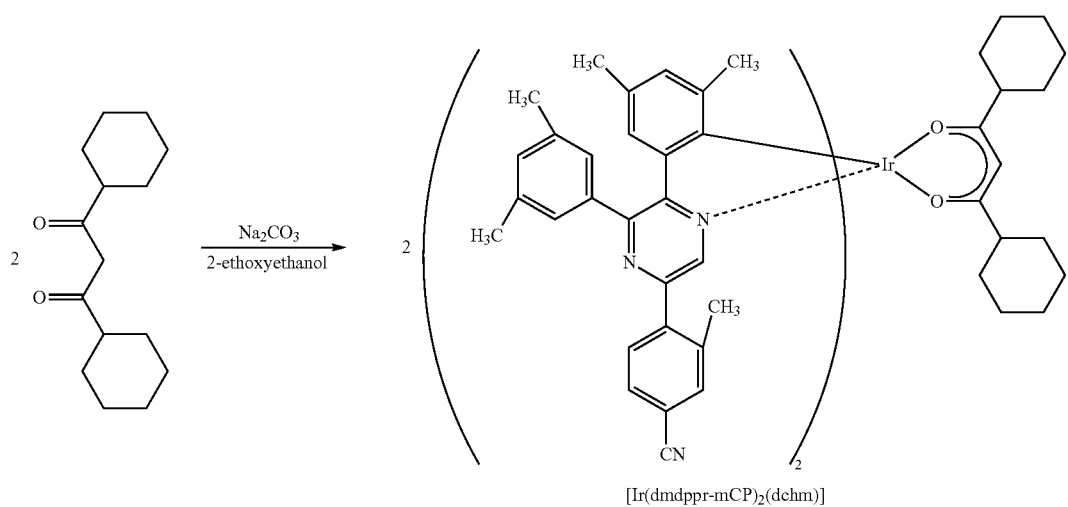

Figure 50:
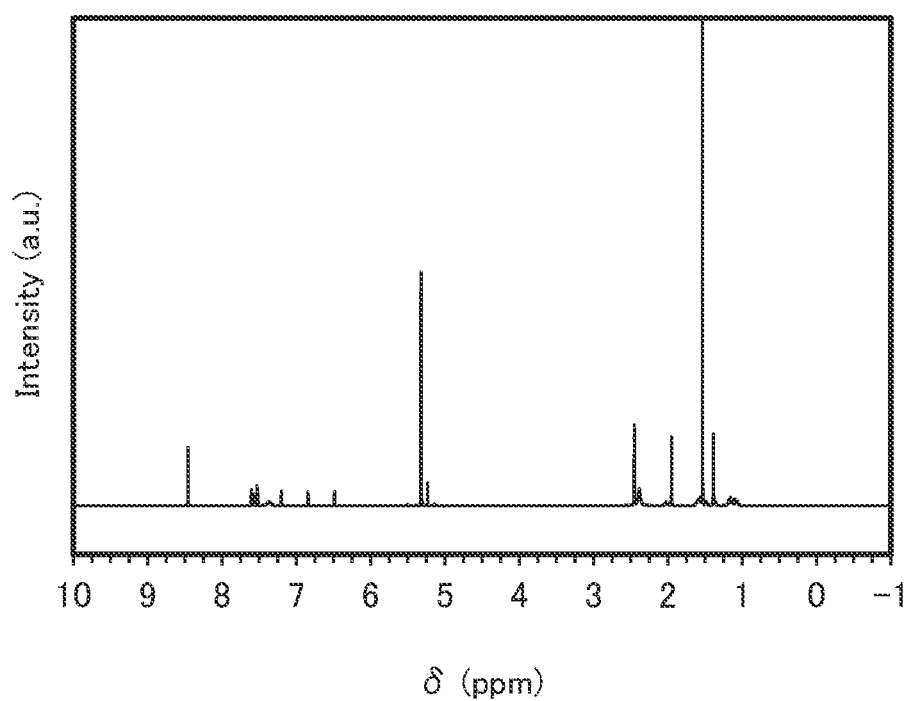
FIG. 50 is a $^1$H-NMR chart of [Ir(dmdppr-mCP)$_2$(dchm)]

Analysis results by nuclear magnetic resonance spectroscopy ($^1$H-NMR) of the deep red solid obtained in Step 1 are shown below. FIG. 50 is the $^1$H-NMR chart. These results revealed that the organometallic complex of the present invention, [Ir(dmdppr-mCP)$_2$(dchm)], was obtained in this synthesis example.

$^1$H-NMR. δ (CD$_2$Cl$_2$): 1.13-1.19 (m, 12H), 1.39 (s, 6H), 1.46-1.49 (m, 2H), 1.55-1.62 (m, 6H), 1.95 (s, 6H), 2.00-2.04 (m, 2H), 2.38 (s, 12H), 2.45 (s, 6H), 5.23 (s, 1H), 6.48 (s, 2H), 6.84 (s, 2H), 7.20 (s, 2H), 7.37 (s, 4H), 7.52 (d, 2H), 7.58 (d, 2H), 7.61 (s, 2H), 8.46 (s, 2H).

Figure 51:
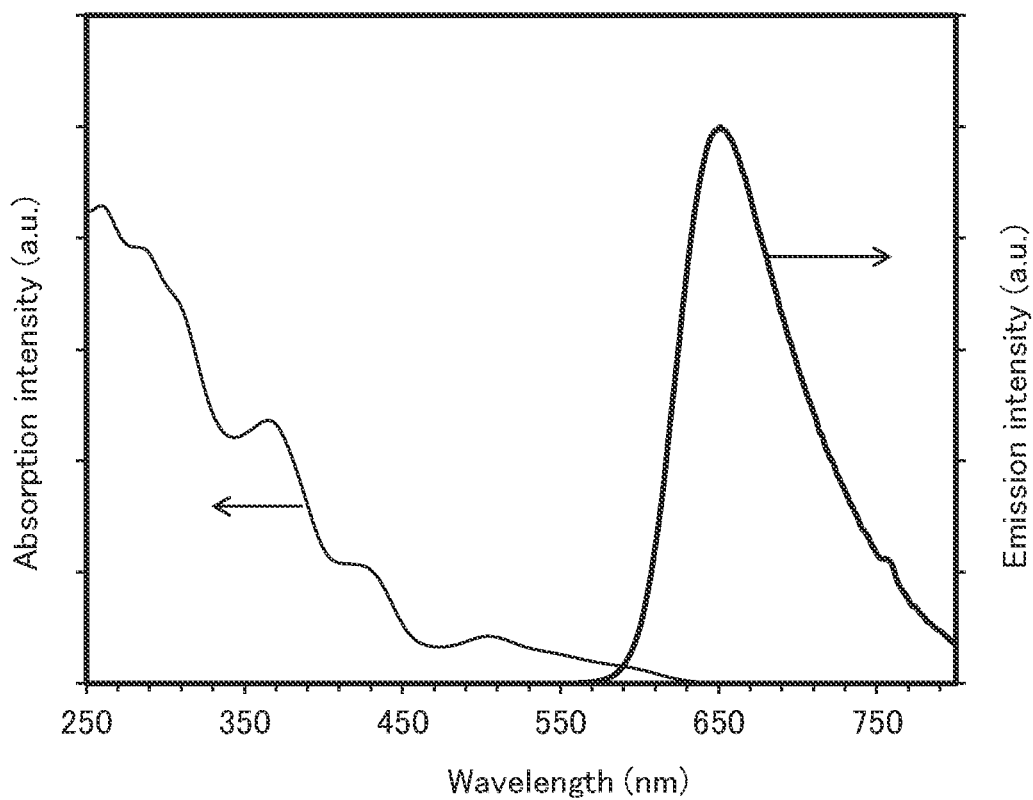
FIG. 51 shows an absorption spectrum and an emission spectrum of [Ir(dmdppr-mCP)$_2$(dchm)] in a solution.

FIG. 51 shows measurement results of an absorption spectrum and an emission spectrum of [Ir(dmdppr-mCP)$_2$(dchm)] in a dichloromethane solution. The absorption spectrum of [Ir(dmdppr-mCP)$_2$(dchm)] in the dichloromethane solution was measured with an ultraviolet-visible light spectrophotometer (V-550DS, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 51 shows that [Ir(dmdppr-mCP)$_2$(dchm)] in the dichloromethane solution has an absorption peak at 599 nm and an emission wavelength peak at 651 nm (excitation wavelength: 506 nm). These results indicate that [Ir(dmdppr-mCP)$_2$(dchm)] emits red light and can be used as a light-emitting substance.

Example 13

Synthesis Example 10

In this synthesis example, a synthesis method of bis{4,6-dimethyl-2-[5-(4-cyano-2-methylphenyl)-3-(3,5-dimethylphenyl)-2-pyrazinyl-κN]phenyl-κC}(4,8-dipropyl-5,7-undecanedionato-κ$^2$O,O')iridium(III) (abbreviation: [Ir(dmdppr-mCP)$_2$(dppem)]), which is the organometallic complex of the present invention, is specifically described. The structure formula of [Ir(dmdppr-mCP)$_2$(dppem)] is shown below.

[Chemical Formula 51]

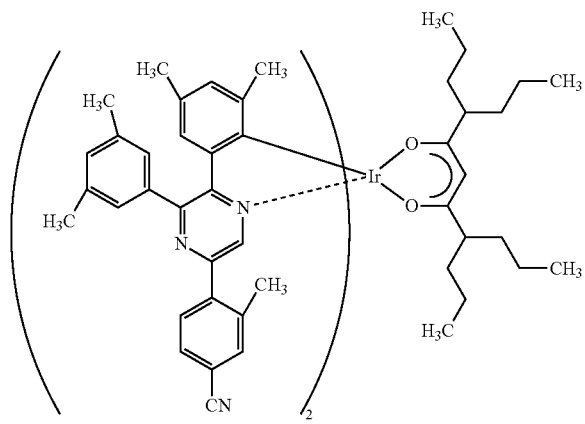

Step 1; Synthesis of 4,8-dipropyl-5,7-undecanedione (abbreviation: Hdppem)

First, 18 mL of N,N-dimethylformamide (abbreviation: DMF) and 3.91 g of potassium tert-butoxide (abbreviation: t-BuOK) were put into a three-neck flask. The atmosphere in the flask was replaced with nitrogen and the mixture was heated to 50° C. To this solution were added 3.02 g of 2-propylvaleric acid methyl ester and 2.01 g of 3-propyl-2-one dissolved in 1.8 mL of DMF, and the mixture was stirred at 50° C. for ten hours. The obtained solution was cooled down to room temperature, 8.5 mL of 20% sulfuric acid and 18 mL of water were added, and extraction was performed with toluene. The obtained residue was purified by flash column chromatography using hexane as a developing solvent, so that 0.72 g of Hdppem, which is a target yellow oil, was obtained in a yield of 19%. The synthesis scheme of Step 1 is shown below.

[Chemical Formula 52]

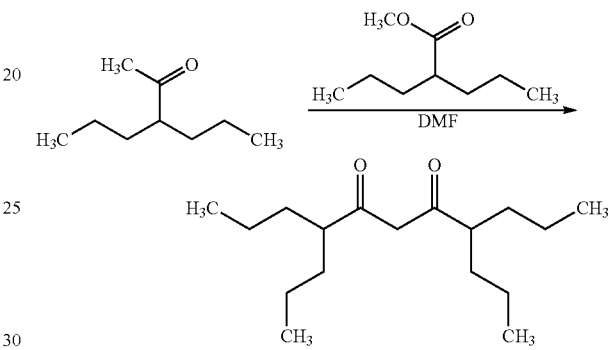

Step 2; Synthesis of bis{4,6-dimethyl-2-[5-(4-cyano-2-methylphenyl)-3-(3,5-dimethylphenyl)-2-pyrazinyl-κN]phenyl-κC}(4,8-dipropyl-5,7-undecanedionato-κ$^2$O,O')iridium(III) (abbreviation: [Ir(dmdppr-mCP)$_2$(dppem)])

Furthermore, 0.65 g of a dinuclear complex di-μ-chloro-tetrakis{4,6-dimethyl-2-[5-(4-cyano-2,5-dimethylphenyl)-3-(3,5-dimethylphenyl)-2-pyrazinyl-κN]phenyl-κC}diiridium(III) (abbreviation: [Ir(dmdppr-mCP)$_2$Cl]$_2$), 0.25 g of Hdppem obtained in Step 1, and 0.33 g of sodium carbonate were put into a three-neck flask equipped with a reflux pipe, and the atmosphere in the flask was replaced with nitrogen. To this mixture was added 8 mL of dehydrated DMF, and the mixture was heated at 153° C. for two hours. After a predetermined time elapsed, the mixture was subjected to suction filtration with toluene and the filtrate was concentrated. The obtained residue was purified by silica gel column chromatography using dichloromethane and hexane as a developing solvent in a volume ratio of 4:1, and then recrystallization was performed with a mixed solvent of dichloromethane and methanol to give 0.43 g of the organometallic complex of the present invention, [Ir(dmdppr-mCP)$_2$(dppem)], as a deep red solid in a yield of 54%. By a train sublimation method, 0.42 g of the obtained deep red solid was purified. In the purification by sublimation, the solid was heated at 303° C. under a pressure of 2.6 Pa with an argon gas flow rate of 10.5 mL/min. After the purification by sublimation, 0.27 g of the target deep red solid was obtained in a yield of 64%. The synthesis scheme of Step 2 is shown below.

[Chemical Formula 53]

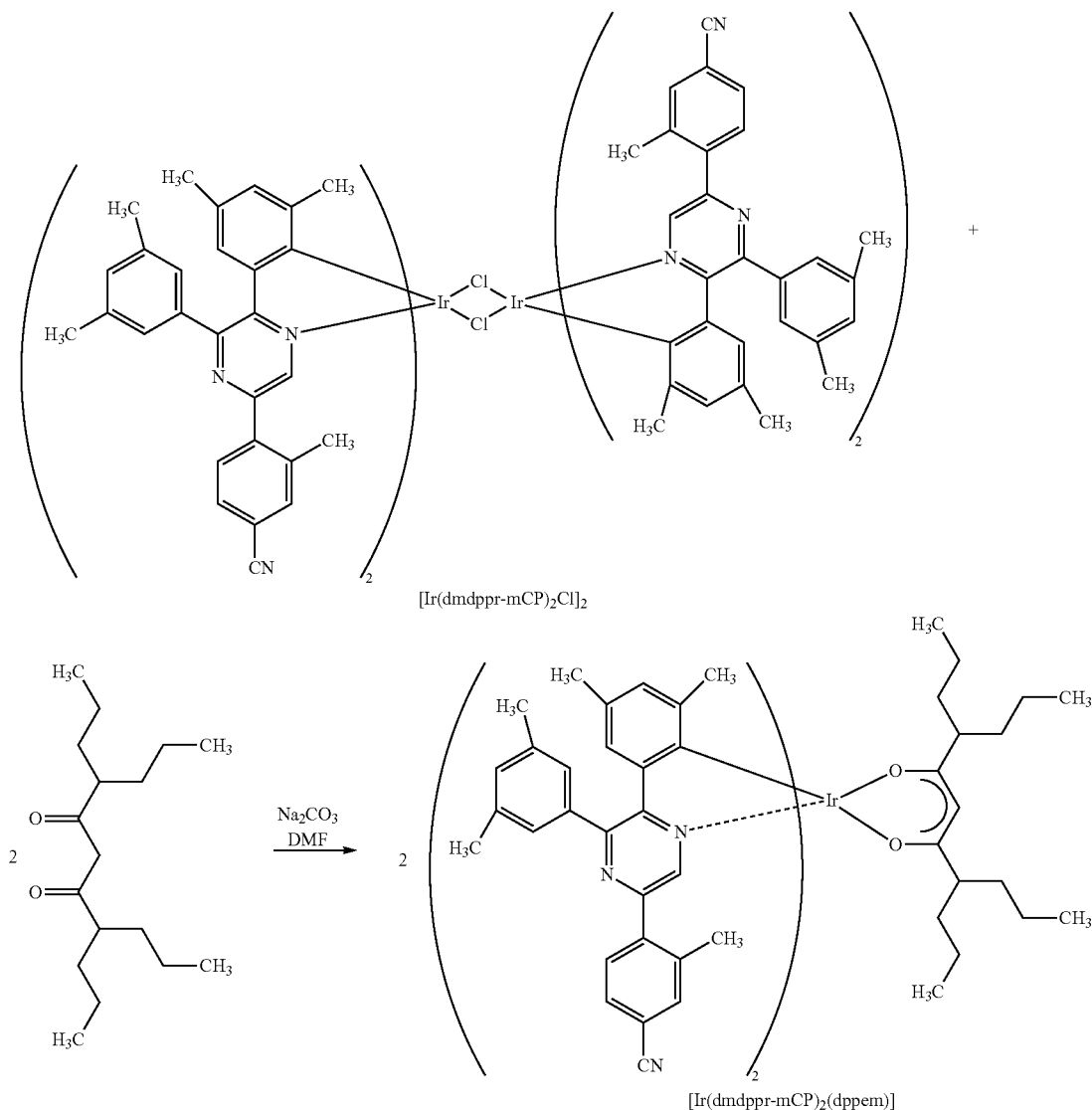

Figure 52:
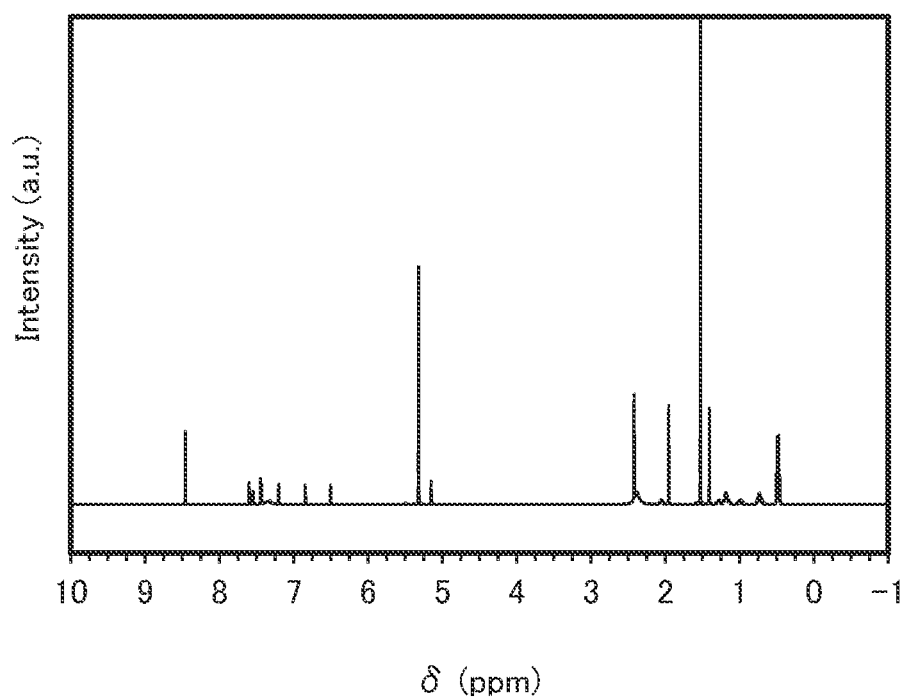
FIG. 52 is a $^1$H-NMR chart of [Ir(dmdppr-mCP)$_2$(dppem)]

Analysis results by nuclear magnetic resonance spectroscopy ($^1$H-NMR) of the deep red solid obtained in Step 2 are shown below. FIG. 52 is the $^1$H-NMR chart. These results revealed that the organometallic complex of the present invention, [Ir(dmdppr-mCP)$_2$(dppem)], was obtained in Synthesis example 10.

$^1$H-NMR. δ (CD$_2$Cl$_2$): 0.47 (t, 6H), 0.49 (t, 6H), 0.67-0.78 (m, 6H), 0.96-1.02 (m, 2H), 1.12-1.22 (m, 6H), 1.24-1.32 (m, 2H), 1.41 (s, 6H), 1.95 (s, 6H), 2.02-2.08 (m, 2H), 2.30-2.50 (m, 18H), 5.15 (s, 1H), 6.50 (s, 2H), 6.84 (s, 2H), 7.20 (s, 2H), 7.35 (s, 4H), 7.44 (d, 2H), 7.55 (d, 2H), 7.60 (s, 2H), 8.46 (s, 2H).

Figure 53:
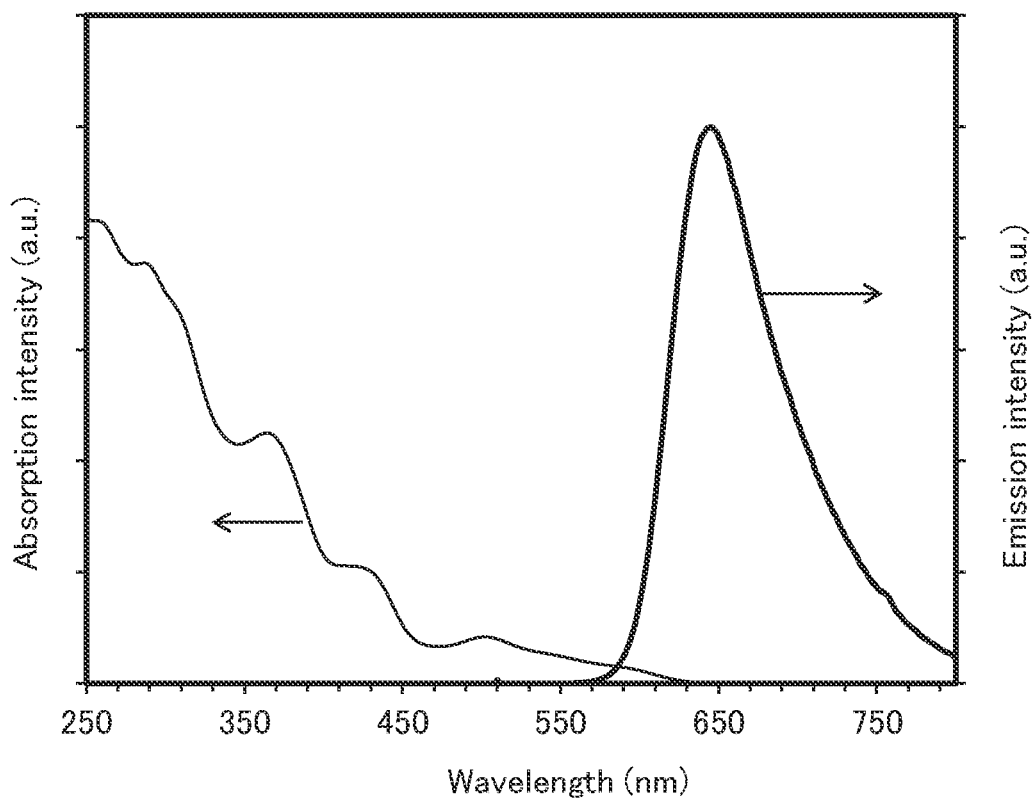
FIG. 53 shows an absorption spectrum and an emission spectrum of [Ir(dmdppr-mCP)$_2$(dppem)] in a solution.

FIG. 53 shows measurement results of an absorption spectrum and an emission spectrum of [Ir(dmdppr-mCP)$_2$(dppem)] in a dichloromethane solution. The absorption spectrum of [Ir(dmdppr-mCP)$_2$(dppem)] in the dichloromethane solution was measured with an ultraviolet-visible light spectrophotometer (V-550DS, manufactured by JASCO Corporation), and the spectrum of dichloromethane alone in a quartz cell was subtracted. The emission spectrum was measured with a fluorescence spectrophotometer (FP-8600, manufactured by JASCO Corporation).

FIG. 53 shows that [Ir(dmdppr-mCP)$_2$(dppem)] in the dichloromethane solution has an absorption peak at 595 nm and an emission wavelength peak at 645 nm (excitation wavelength: 505 nm). These results indicate that [Ir(dmdppr-mCP)$_2$(dppem)] emits red light and can be used as a light-emitting substance.

Example 14

In this example, a light-emitting device 3 and a light-emitting device 4 each using the organometallic complex of one embodiment of the present invention and a comparative light-emitting device 3 not using the organometallic complex of one embodiment of the present invention are described. Structure formulae of compounds used for the light-emitting device 3, the light-emitting device 4, and the comparative light-emitting device 3 are shown below.

[Chemical Formula 54]
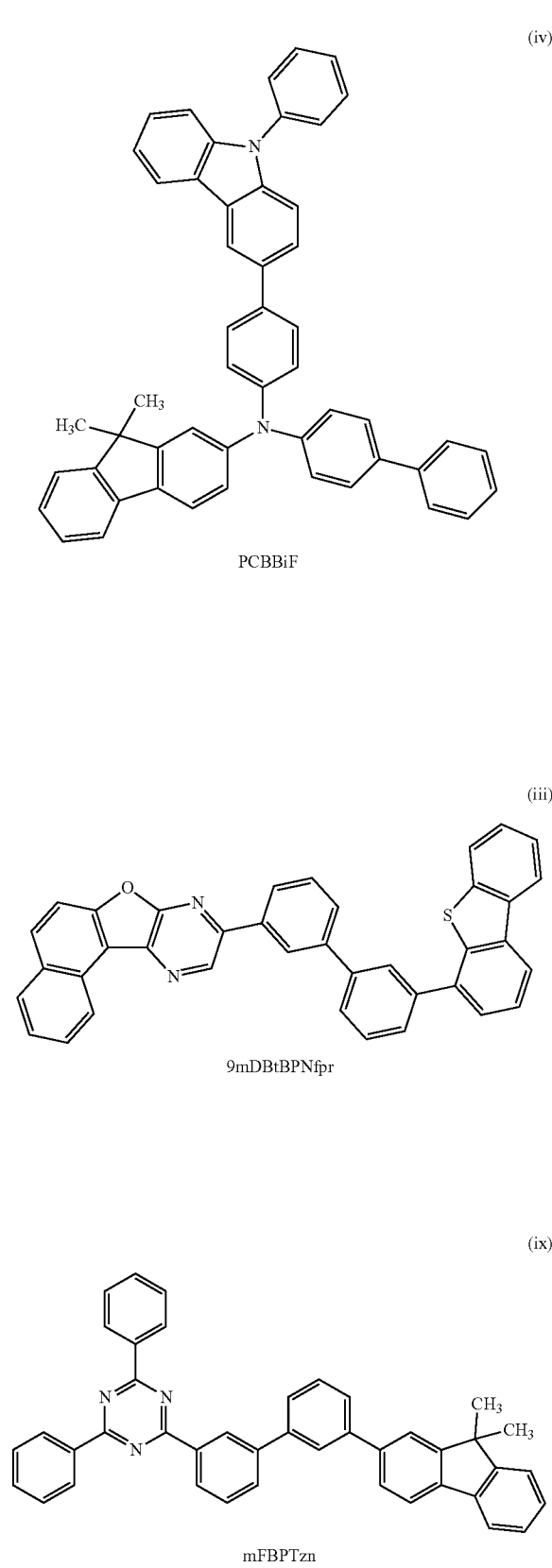
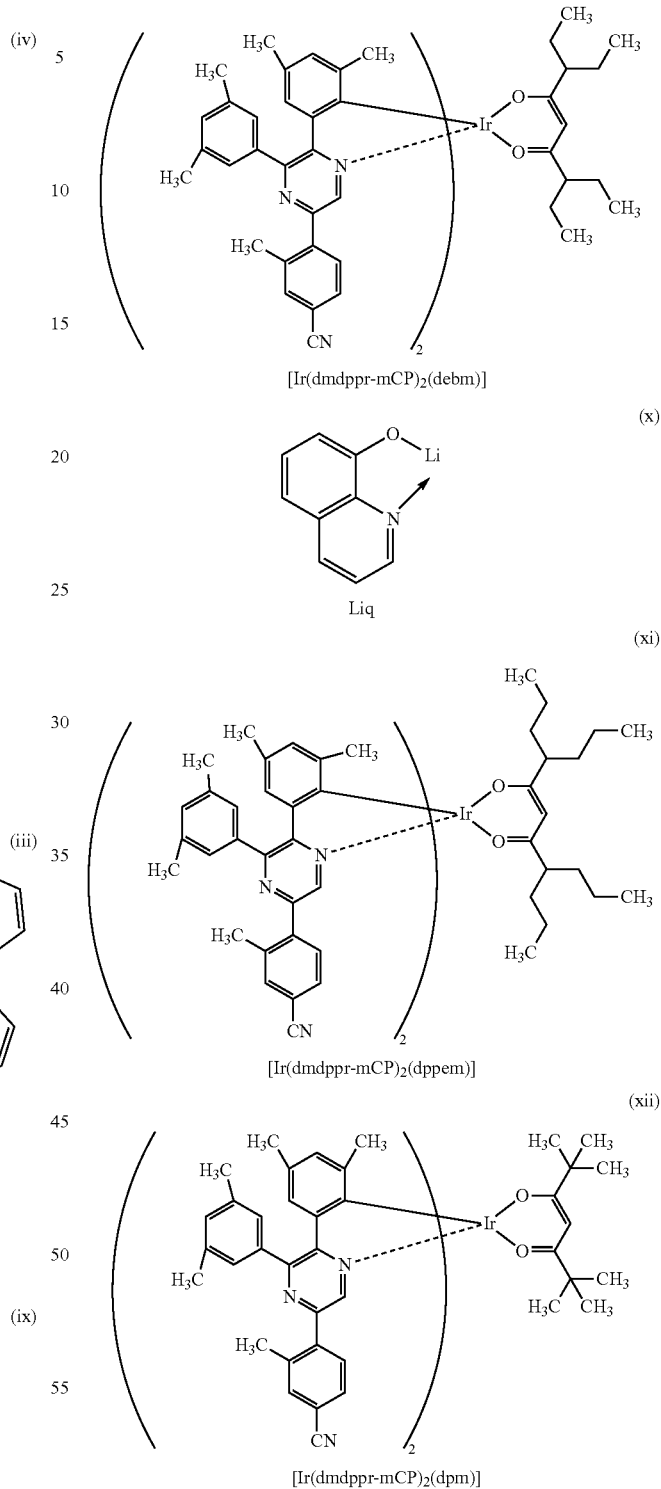
(Fabrication Method of Light-Emitting Device 3)
First, indium tin oxide containing silicon oxide (ITSO) was deposited over a glass substrate by a sputtering method to form the first electrode 101. The thickness of the first electrode 101 was 70 nm and the electrode area was 2 mm×2 mm.

Next, in pretreatment for forming the light-emitting device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately 10-4 Pa, vacuum baking was performed at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structure Formula (iv) and an electron acceptor material (OCHD-001) were deposited to a thickness of 10 nm by co-evaporation using resistance heating such that the weight ratio of PCBBiF to OCHD-001 was 1:0.05, whereby the hole-injection layer 111 was formed.

Subsequently, PCBBiF was deposited by evaporation to a thickness of 90 nm over the hole-injection layer 111 to form the hole-transport layer 112.

Then, 9-[3'-(dibenzothiophen-4-yl)biphenyl-3-yl]naphtho[1',2 ':4,5]furo[2,3-b]pyrazine (abbreviation: 9mDBtBPNfpr) represented by Structure Formula (iii), PCBBiF, and bis{4,6-dimethyl-2-[5-(4-cyano-2-methylphenyl)-3-(3,5-dimethylphenyl)-2-pyrazinyl-κN]phenyl-κC}(3,7-diethyl-4,6-nonanedionato-κ$^2$O,O')iridium(III) (abbreviation: [Ir(dmdppr-mCP)$_2$(debm)]) represented by Structure Formula (viii) were deposited to a thickness of 40 nm by co-evaporation such that the weight ratio of 9mDBtBPNfpr to PCBBiF and [Ir(dmdppr-mCP)$_2$(debm)] was 0.7:0.3:0.1, whereby the light-emitting layer 113 was formed.

After that, over the light-emitting layer 113, 2-[3'-(9,9-dimethyl-9H-fluoren-2-yl)-1,1'-biphenyl-3-yl]-4,6-diphenyl-1,3,5-triazine (abbreviation: mFBPTzn) represented by Structure Formula (ix) was deposited by evaporation to a thickness of 10 nm, and 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structure Formula (xiii) and 8-hydroxyquinolinato-lithium (abbreviation: Liq) represented by Structure Formula (x) were deposited by co-evaporation to a thickness of 35 nm at a weight ratio of 1:1, whereby the electron-transport layer 114 was formed.

After the formation of the electron-transport layer 114, lithium fluoride (LiF) was deposited by evaporation to a thickness of 1 nm to form the electron-injection layer 115. Then, aluminum was deposited by evaporation to a thickness of 200 nm to form the second electrode 102. Thus, the light-emitting device 3 of this example was fabricated.

(Fabrication Method of Light-Emitting Device 4)

The light-emitting device 4 was fabricated in the same manner as the light-emitting device 3 except that bis{4,6-dimethyl-2-[5-(4-cyano-2-methylphenyl)-3-(3,5-dimethylphenyl)-2-pyrazinyl-κN]phenyl-κC}(4,8-dipropyl-5,7-undecanedionato-κ$^2$O,O')iridium(III) (abbreviation: [Ir(dmdppr-mCP)$_2$(dppem)]) represented by Structure Formula (xi) was used instead of [Ir(dmdppr-mCP)$_2$(debm)] in the light-emitting device 3.

(Fabrication Method of Comparative Light-Emitting Device 3)

The comparative light-emitting device 3 was fabricated in the same manner as the light-emitting device 3 except that bis{4,6-dimethyl-2-[5-(4-cyano-2-methylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-mCP)$_2$(dpm)]) represented by Structure Formula (xii) was used instead of [Ir(dmdppr-mCP)$_2$(debm)] in the light-emitting device 3.

The structures of the light-emitting devices are listed in the following table. [Table 9]

TABLE 9

| | Hole-injection layer 10 nm | Hole-transport layer 90 nm | Light-emitting layer 40 nm | Electron-transport layer | | Electron-injection layer 1 nm |
|---|---|---|---|---|---|---|
| | | | | 1 10 nm | 2 35 nm | |
| Light-emitting device 3 Light-emitting device 4 Comparative light-emitting device 3 | PCBBiF: OCHD-001 (1:0.05) | PCBBiF | 9mDBtBPNfpr: PCBBiF: *6 (0.7:0.3:0.1) | mFBPTzn | mPn-mDMePyPTzn: Liq (1:1) | LiF |

*6 Light-emitting device 3: [Ir(dmdppr-mCP)$_2$ (debm)]

Light-emitting device 4: [Ir(dmdppr-mCP)$_2$ (dppem)]

Comparative light-emitting device 3: [Ir(dmdppr-mCP)$_2$ (dpm)]

The light-emitting devices were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the light-emitting devices were measured.

Figure 54:
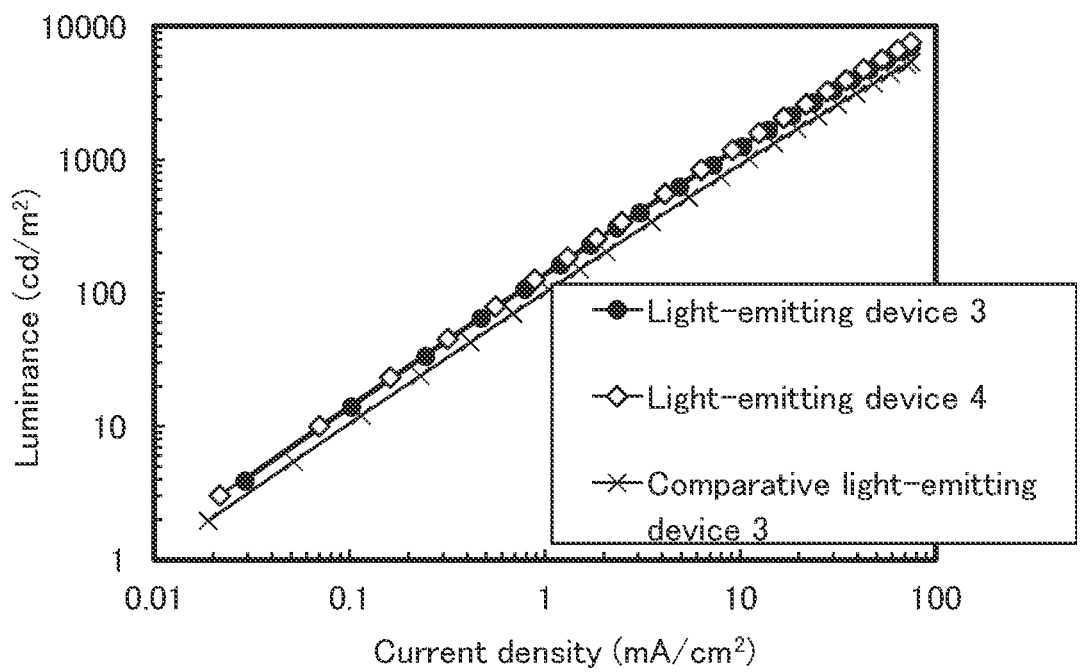
FIG. 54 is a graph showing luminance-current density characteristics of a light-emitting device 3, a light-emitting device 4, and a comparative light-emitting device 3.
Figure 55:
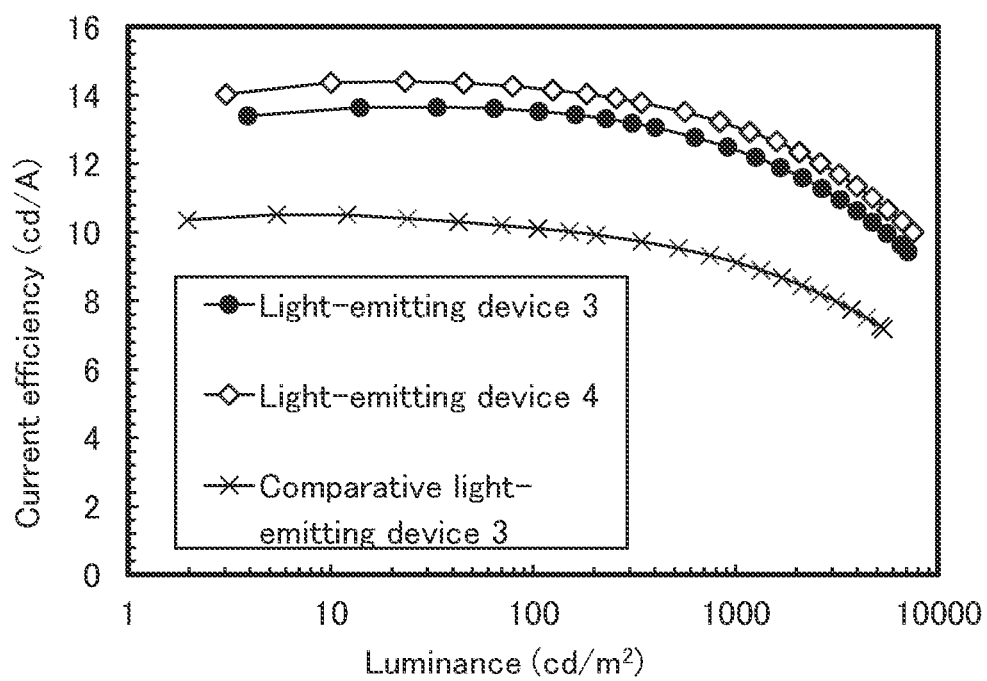
FIG. 55 is a graph showing current efficiency-luminance characteristics of the light-emitting device 3, the light-emitting device 4, and the comparative light-emitting device 3.
Figure 56:
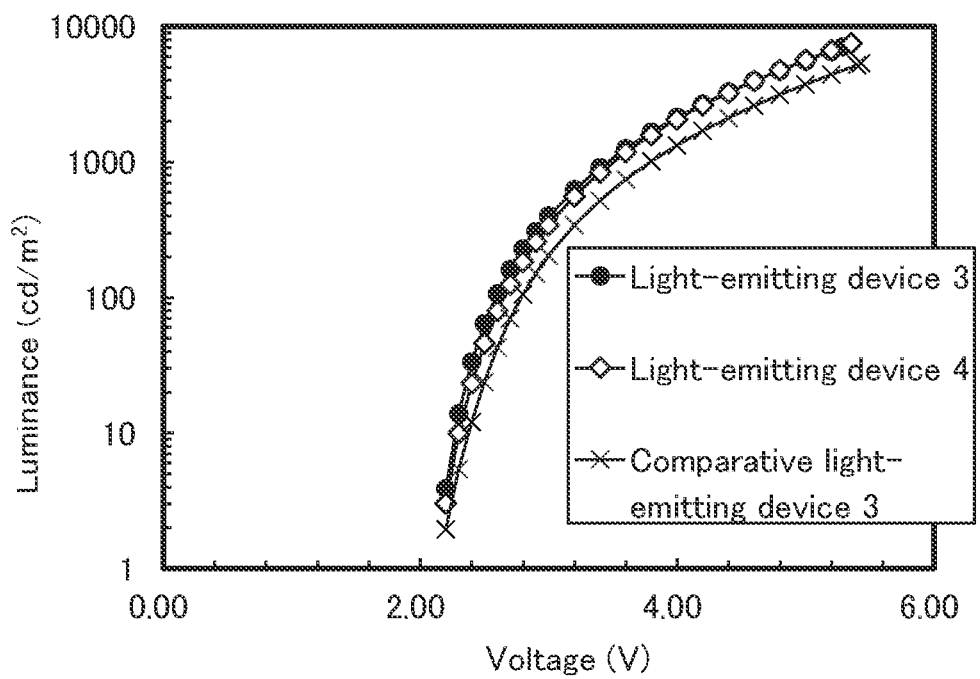
FIG. 56 is a graph showing luminance-voltage characteristics of the light-emitting device 3, the light-emitting device 4, and the comparative light-emitting device 3.
Figure 57:
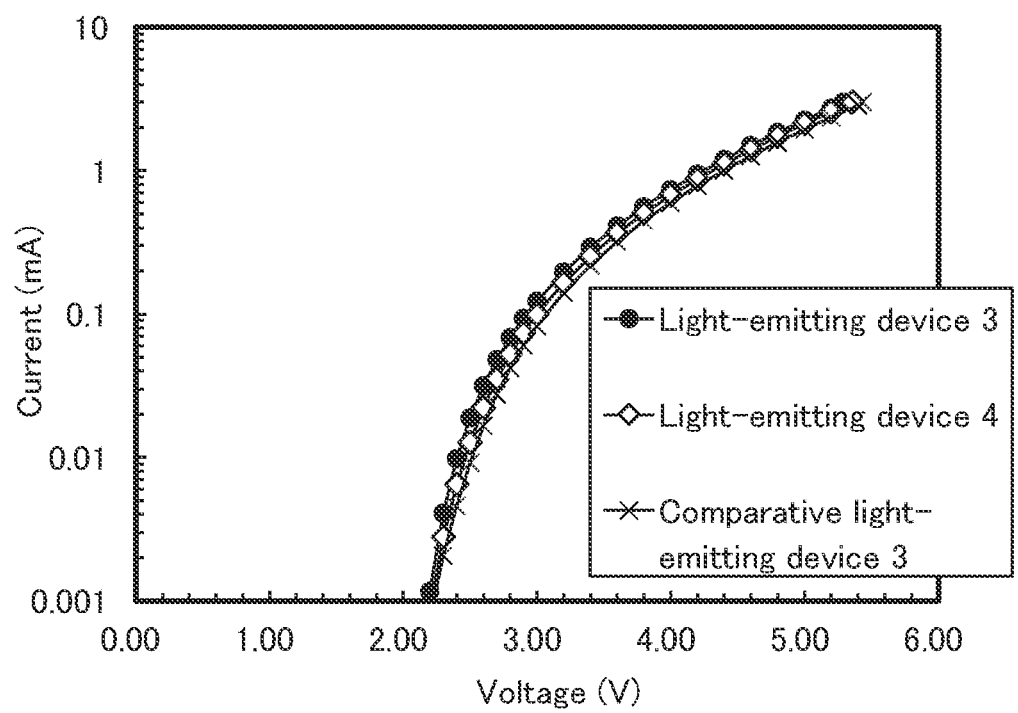
FIG. 57 is a graph showing current-voltage characteristics of the light-emitting device 3, the light-emitting device 4, and the comparative light-emitting device 3.
Figure 58:
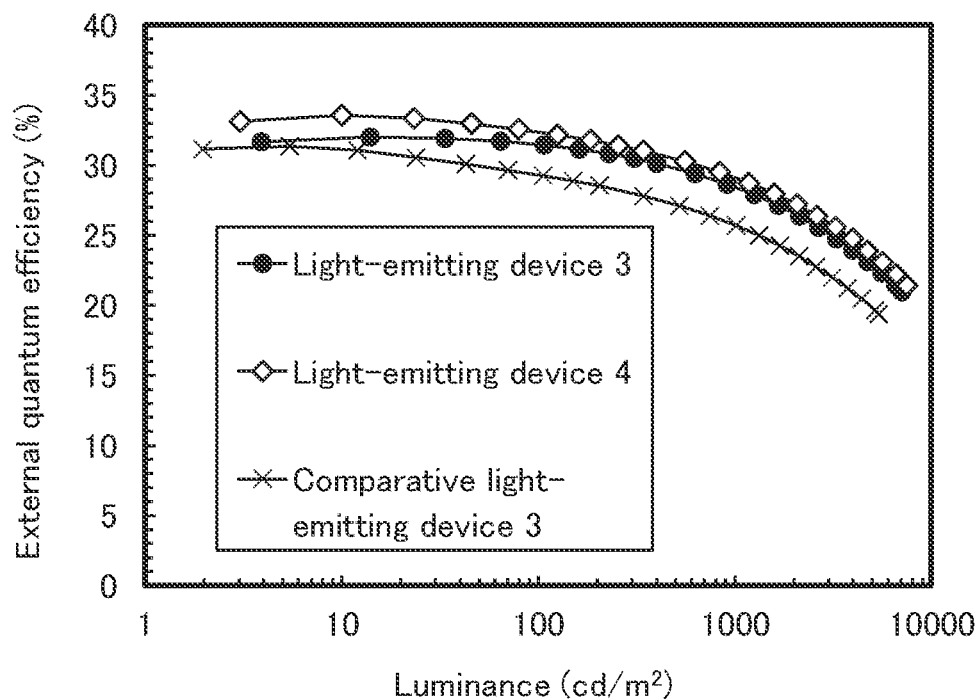
FIG. 58 is a graph showing external quantum efficiency-luminance characteristics of the light-emitting device 3, the light-emitting device 4, and the comparative light-emitting device 3.
Figure 59:
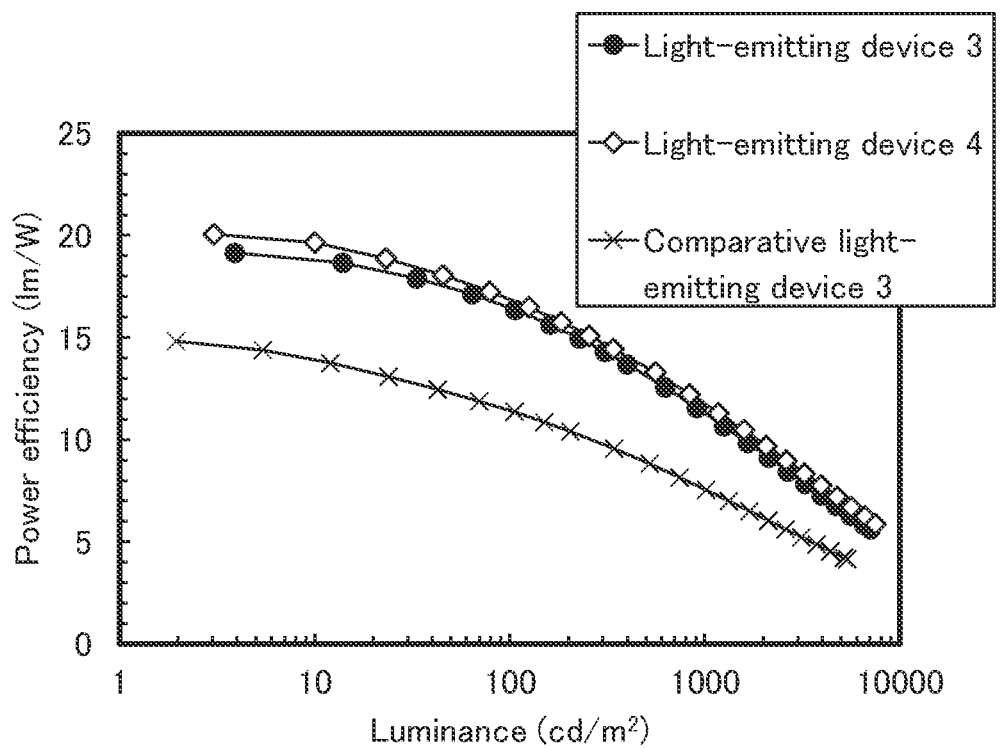
FIG. 59 is a graph showing power efficiency-luminance characteristics of the light-emitting device 3, the light-emitting device 4, and the comparative light-emitting device 3.
Figure 60:
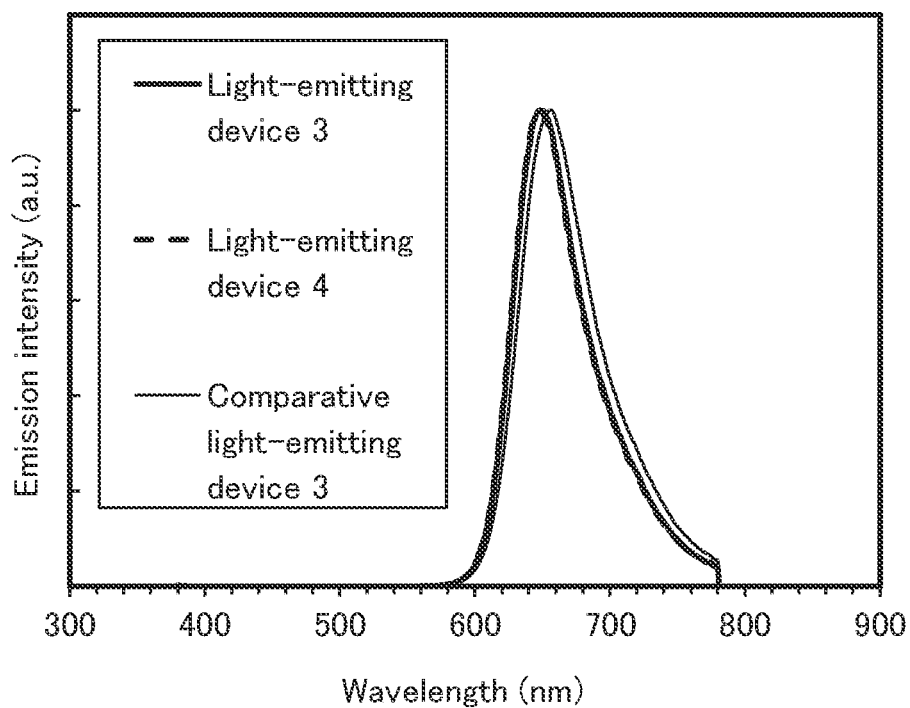
FIG. 60 is a graph showing emission spectra of the light-emitting device 3, the light-emitting device 4, and the comparative light-emitting device 3.

FIG. 54 shows luminance-current density characteristics of the light-emitting device 3, the light-emitting device 4, and the comparative light-emitting device 3. FIG. 55 shows current efficiency-luminance characteristics thereof. FIG. 56 shows luminance-voltage characteristics thereof. FIG. 57 shows current-voltage characteristics thereof. FIG. 58 shows external quantum efficiency-luminance characteristics thereof. FIG. 59 shows power efficiency-luminance characteristics thereof. FIG. 60 shows emission spectra thereof. The main characteristics of the light-emitting devices at a luminance of about 1000 cd/m² are shown below.

TABLE 10

|  | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| Light-emitting device 3 | 3.4 | 0.29 | 7.3 | 0.71 | 0.29 | 12.5 | 11.5 | 28.6 |
| Light-emitting device 4 | 3.4 | 0.25 | 6.3 | 0.70 | 0.30 | 13.2 | 12.2 | 29.5 |
| Comparative light-emitting device 3 | 3.8 | 0.44 | 11.1 | 0.71 | 0.29 | 9.1 | 7.5 | 25.7 |

It is found from FIG. 54 to FIG. 60 that the light-emitting device 3 and the light-emitting device 4 of embodiments of the present invention have extremely favorable characteristics such as a low drive voltage and significantly higher current efficiency, external quantum efficiency, and power efficiency, as compared to the comparative light-emitting device 3. In particular, large differences in the current efficiency and the power efficiency between the light-emitting devices stem not only from the drive voltages of the light-emitting devices 3 and 4 being lower but also from a slight shift of the emission peak wavelengths to a short wavelength side. That is, it can be said that an increase in the light in a region with a relatively high luminosity factor owing to the shift in the emission peak wavelength to a short wavelength side has more effect on the current efficiency and the power efficiency than on the external quantum efficiency. In addition, [Ir(dmdppr-mCP)₂(debm)] used in the light-emitting device 3 and [Ir(dmdppr-mCP)₂(dppem)] used in the light-emitting device 4 each have an emission spectrum with a narrow half width and thus emit light with high color purity. Owing to the narrow half width, a favorable chromaticity can be maintained even when the emission spectrum is shifted to a short wavelength side. The narrow half width means little light emission in a long wavelength region with a low luminosity factor. Thus, the light-emitting device 3 and the light-emitting device 4 can be more highly efficient light-emitting devices.

This application is based on Japanese Patent Application Serial No. 2020-003063 filed with Japan Patent Office on Jan. 10, 2020, Japanese Patent Application Serial No. 2020-014352 filed with Japan Patent Office on Jan. 31, 2020, and Japanese Patent Application Serial No. 2020-078045 filed with Japan Patent Office on Apr. 27, 2020, the entire contents of which are hereby incorporated by reference.

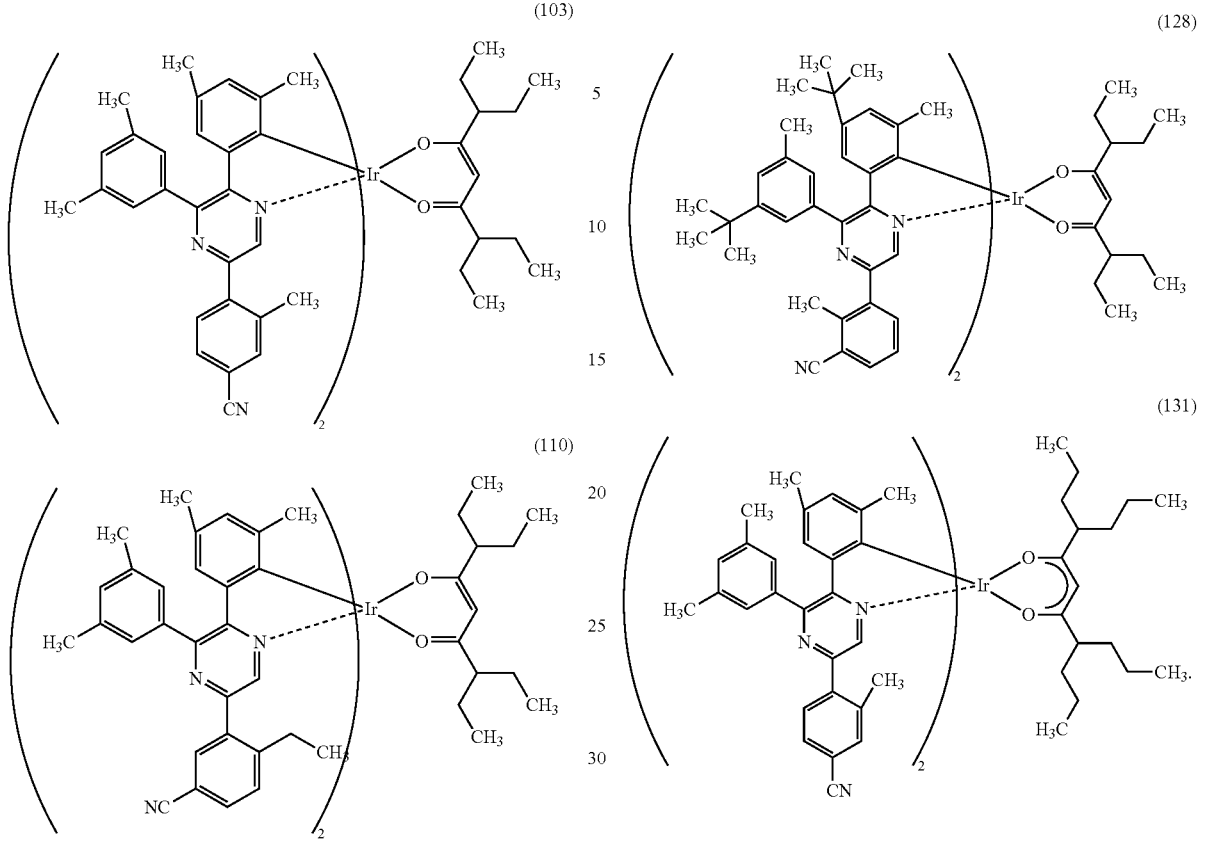

What is claimed is:

1. An organometallic complex represented by General Formula (G2):

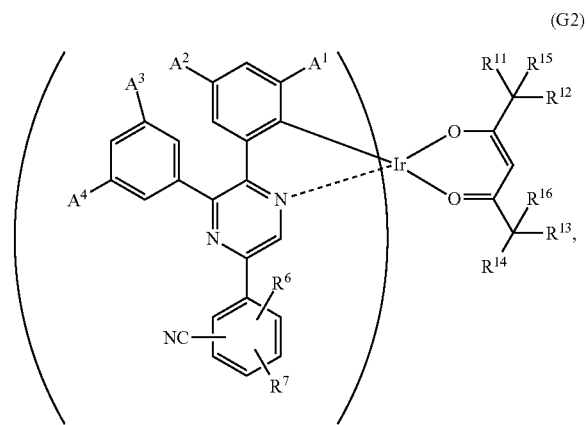

(G2)

wherein each of $A^1$ to $A^4$ independently represents an alkyl group having 1 to 6 carbon atoms, wherein $R^6$ represents an alkyl group having 1 to 6 carbon atoms, wherein each of $R^{11}$ to $R^{14}$ independently represents an alkyl group having 2 to 6 carbon atoms, and wherein each of $R^7$, $R^{15}$ and $R^{16}$ represents hydrogen.

2. The organometallic complex according to claim 1, wherein $R^{11}$ and $R^{12}$ are the same group.

3. The organometallic complex according to claim 1,
wherein $R^{11}$ and $R^{12}$ are the same group, and
wherein $R^{13}$ and $R^{14}$ are the same group.

4. The organometallic complex according to claim 1,
wherein $R^{11}$ to $R^{14}$ are the same group.

5. An organometallic complex represented by General Formula (G2-1):

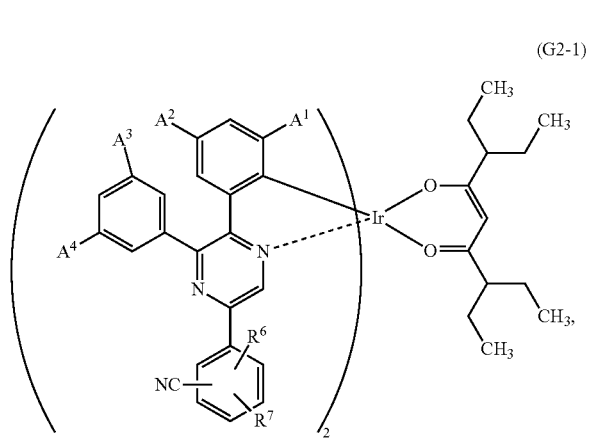

(G2-1)

wherein each of $A^1$ to $A^4$ independently represents an alkyl group having 1 to 6 carbon atoms, wherein $R^6$ represents an alkyl group having 1 to 6 carbon atoms, and wherein $R^7$ represents hydrogen.

6. The organometallic complex according to claim 1,
wherein each of $A^1$ to $A^4$ independently represents a methyl group or a t-butyl group.

7. An organometallic complex represented by General Formula (G3):

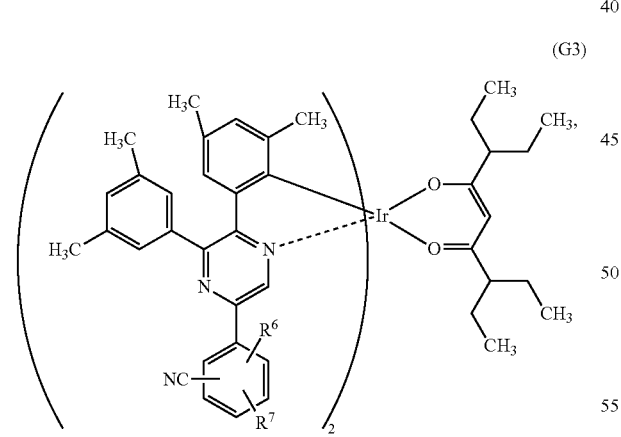

(G3)

wherein $R^6$ represents an alkyl group having 1 to 6 carbon atoms, and wherein $R^7$ represents hydrogen.

8. The organometallic complex according to claim 1,
wherein $R^6$ represents a methyl group.

9. The organometallic complex according to claim 1,
wherein a peak wavelength of an emission spectrum is 600 nm or longer.

10. A light-emitting material for top emission structures comprising the organometallic complex according to claim 1.

11. A light-emitting device comprising the organometallic complex according to claim 1.

12. An optical device comprising the organometallic complex according to claim 1.

13. An electronic device comprising:
the light-emitting device according to claim 11; and
at least one of a sensor, an operation button, a speaker, and a microphone.

14. A light-emitting apparatus comprising:
the light-emitting device according to claim 11; and
at least one of a transistor and a substrate.

15. A lighting device comprising:
the light-emitting device according to claim 11; and
a housing.

16. The organometallic complex according to claim 1,
wherein the organometallic complex is represented by any one of compounds (100), (101), (103), (110), (128), and (131):

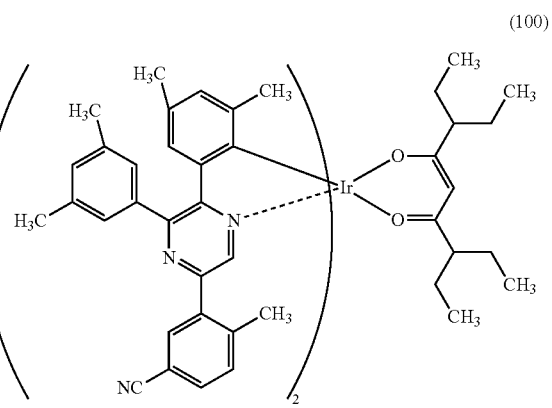

(100)

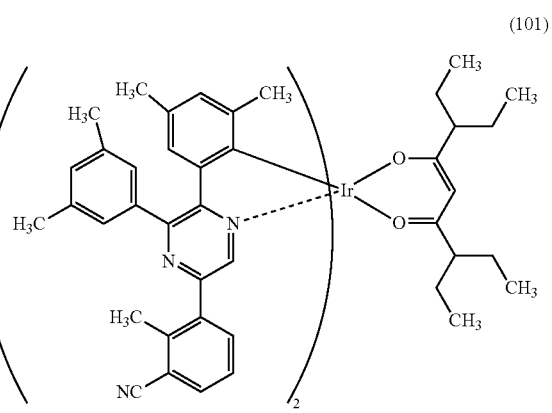

(101)